US012763127B2

(12) United States Patent
Matsuzaki et al.

(10) Patent No.: US 12,763,127 B2
(45) Date of Patent: Oct. 13, 2026

(54) SEMICONDUCTOR DEVICE

(71) Applicant: Semiconductor Energy Laboratory Co., Ltd., Atsugi (JP)

(72) Inventors: Takanori Matsuzaki, Atsugi (JP); Toshihiko Saito, Atsugi (JP); Yuki Okamoto, Ebina (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 16 days.

(21) Appl. No.: 18/871,534

(22) PCT Filed: Jun. 2, 2023

(86) PCT No.: PCT/IB2023/055669

§ 371 (c)(1),
(2) Date: Dec. 4, 2024

(87) PCT Pub. No.: WO2023/242665

PCT Pub. Date: Dec. 21, 2023

(65) Prior Publication Data

US 2025/0322866 A1 Oct. 16, 2025

(30) Foreign Application Priority Data

Jun. 16, 2022 (JP) ................................ 2022-097094
Jul. 8, 2022 (JP) ................................ 2022-110147

(51) Int. Cl.
*G11C 7/00* (2006.01)
*G11C 5/04* (2006.01)
(Continued)

(52) U.S. Cl.
CPC ............ *G11C 11/4074* (2013.01); *G11C 5/04* (2013.01); *G11C 7/04* (2013.01); *G11C 11/4076* (2013.01);
(Continued)

(58) Field of Classification Search
CPC ......... G11C 11/4074; G11C 5/04; G11C 7/04; G11C 11/4076; G11C 11/413;
(Continued)

(56) References Cited

U.S. PATENT DOCUMENTS 8,018,780 B2 * 9/2011 Houston ............... G11C 11/413
365/185.27
8,709,889 B2 * 4/2014 Saito .................. H10D 30/6755
257/296
(Continued)

FOREIGN PATENT DOCUMENTS

CN 112041825 A 12/2020
CN 119452415 A * 2/2025 ............ H10W 90/00
(Continued)

OTHER PUBLICATIONS

International Search Report (Application No. PCT/IB2023/055669) Dated Aug. 15, 2023.
(Continued)

*Primary Examiner* — Viet Q Nguyen
(74) *Attorney, Agent, or Firm* — Eric J. Robinson; Robinson Intellectual Property Law Office, P.C.

(57) ABSTRACT

A semiconductor device with a novel structure is provided. A first element layer and a plurality of second element layers each including a temperature sensing circuit, a voltage generation circuit, and memory cells are provided. The plurality of second element layers are stacked over the first element layer. The memory cell includes a transistor in which a semiconductor layer including a channel formation region includes an oxide semiconductor. The transistor includes a back gate. The voltage generation circuit provided in each layer has a function of generating a back gate voltage supplied to the back gate of the transistor included in the memory cell provided in the same layer. The temperature sensing circuit has a function of controlling the back gate
(Continued)

voltage in accordance with a sensed temperature. In the second element layers, the back gate voltage supplied to the transistor included in the second element layer provided in an upper layer is higher than the back gate voltage supplied to the transistor included in the second element layer provided in a lower layer.

13 Claims, 39 Drawing Sheets

(51) Int. Cl.

| | |
|---|---|
| ***G11C 7/04*** | (2006.01) |
| ***G11C 11/4074*** | (2006.01) |
| ***G11C 11/4076*** | (2006.01) |
| ***G11C 11/413*** | (2006.01) |
| ***H10B 10/00*** | (2023.01) |
| ***H10B 12/00*** | (2023.01) |
| ***H10B 80/00*** | (2023.01) |
| ***H10W 90/00*** | (2026.01) |
| *H10W 90/20* | (2026.01) |

(52) U.S. Cl.
CPC ............ *G11C 11/413* (2013.01); *H10B 10/12* (2023.02); *H10B 10/18* (2023.02); *H10B 12/50* (2023.02); *H10B 80/00* (2023.02); *H10W 90/00* (2026.01); *H10W 90/297* (2026.01)

(58) Field of Classification Search
CPC ........ H10B 10/12; H10B 12/50; H10B 80/00; H10B 10/18; H10W 90/00; H10W 90/297
See application file for complete search history.

(56) References Cited

U.S. PATENT DOCUMENTS

| | | | | |
|---|---|---|---|---|
| 8,797,785 | B2 * | 8/2014 | Saito | G11C 5/02 365/174 |
| 9,747,986 | B2 * | 8/2017 | Tran | G11C 13/004 |
| 9,905,667 | B2 * | 2/2018 | Carta | H10D 10/061 |
| 10,090,022 | B2 * | 10/2018 | Shionoiri | H10D 30/6734 |
| 10,236,875 | B2 * | 3/2019 | Kato | G11C 11/4091 |
| 10,944,396 | B2 * | 3/2021 | Matsuzaki | G11C 5/147 |
| 11,195,561 | B2 * | 12/2021 | Atsumi | G11C 5/147 |
| 11,355,176 | B2 * | 6/2022 | Yamazaki | G11C 11/405 |
| 11,462,538 | B2 * | 10/2022 | Onuki | H10D 87/00 |
| 11,742,014 | B2 | 8/2023 | Yamazaki et al. | |
| 11,961,979 | B2 * | 4/2024 | Ikeda | H01M 10/443 |
| 12,040,653 | B2 * | 7/2024 | Kozuma | H01M 10/613 |
| 12,165,685 | B2 | 12/2024 | Yamazaki et al. | |
| 2018/0090498 | A1 | 3/2018 | Onuki et al. | |
| 2020/0343245 | A1 | 10/2020 | Yamazaki et al. | |
| 2020/0373302 | A1 | 11/2020 | Onuki et al. | |
| 2021/0012816 | A1 | 1/2021 | Atsumi et al. | |
| 2021/0174857 | A1 | 6/2021 | Yamazaki et al. | |
| 2021/0183860 | A1 * | 6/2021 | Yamazaki | H10D 86/60 |
| 2022/0085073 | A1 | 3/2022 | Onuki et al. | |

FOREIGN PATENT DOCUMENTS

| | | | | | |
|---|---|---|---|---|---|
| KR | 20250023998 | A | * | 2/2025 | H10W 90/00 |
| TW | 202401582 | A | * | 1/2024 | H10W 90/00 |
| WO | WO-2019/211697 | | | 11/2019 | |
| WO | WO-2020/152522 | | | 7/2020 | |

OTHER PUBLICATIONS

Written Opinion (Application No. PCT/IB2023/055669) Dated Aug. 15, 2023.

Park.M et al., “A 192-GB 12-High 896-GB/s HBM3 DRAM with a TSV Auto-Calibration Scheme and Machine-Learning-Based Layout Optimization”, ISSCC 2022 (Digest of Technical Papers. IEEE International Solid-State Circuits Conference), Feb. 20, 2022, pp. 444-445.

Gomes.W et al., “Ponte Vecchio: A Multi-Tile 3D Stacked Processor for Exascale Computing”, ISSCC 2022 (Digest of Technical Papers. IEEE International Solid-State Circuits Conference), Feb. 20, 2022, pp. 42-43.

Yee.K et al., “High-Performance 5LPE Implementation Next-Generation Arm ”Hercules“ CPU”, Arm TechCon 2019, Oct. 9, 2019, pp. 1-38.

10nm lithography process, https://en.wikichip.org/wiki/10_nm_lithography_process.

* cited by examiner

SEMICONDUCTOR DEVICE

TECHNICAL FIELD

One embodiment of the present invention relates to a semiconductor device and the like.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Thus, more specific examples of the technical field of one embodiment of the present invention disclosed in this specification include a semiconductor device, a display device, a light-emitting device, a power storage device, a memory device, a driving method thereof, and a manufacturing method thereof.

BACKGROUND ART

In recent years, research and development have been actively conducted on a structure in which a plurality of dies (e.g., silicon dies) provided with circuits having different functions, such as SRAM cells or DRAM cells, are stacked three-dimensionally (e.g., Non-Patent Document 1 and Non-Patent Document 2).

Moreover, in recent years, technical development of a semiconductor device capable of retaining electric charge corresponding to data with the use of a transistor using an oxide semiconductor in its channel formation region (hereinafter an OS transistor) has progressed. A layer including OS transistors can be stacked over a die including transistors using silicon in their channel formation regions (hereinafter Si transistors). Patent Document 1 discloses a structure in which a plurality of layers including OS transistors are stacked three-dimensionally over a die including Si transistors.

REFERENCES

Patent Document

[Patent Document 1] PCT International Publication No. 2020/152522

Non-Patent Documents

[Non-Patent Document 1] W. Gomes et al., ISSCC Dig. Tech. Papers, pp. 42-43, 2022.
[Non-Patent Document 2] M. Park et al., ISSCC Dig. Tech. Papers, pp. 444-445, 2022.

SUMMARY OF THE INVENTION

Problems to be Solved by the Invention

In the case where a die (element layer) including Si transistors generates heat by circuit operation, the electrical characteristics of transistors included in an element layer thereover are changed by the heat. In a structure in which a plurality of element layers including OS transistors are stacked three-dimensionally over an element layer including Si transistors, the temperature varies among the plurality of layers including OS transistors, e.g., between an upper layer and a lower layer. Thus, the amount of change in electrical characteristics of the transistors might vary among the plurality of layers including OS transistors. That is, in a structure in which the transistor density is increased by stacking a plurality of layers including OS transistors, the electrical characteristics of the OS transistors, such as the threshold voltage, might vary among the layers. As a result, power consumption might be increased or the reliability of a semiconductor device might be impaired owing to variations in electrical characteristics of the transistors.

An object of one embodiment of the present invention is to provide a semiconductor device with a reduced influence of variations in electrical characteristics of transistors. Another object of one embodiment of the present invention is to provide a semiconductor device that is excellent in reducing power consumption. Another object of one embodiment of the present invention is to provide a semiconductor device that is excellent in increasing the memory density. Another object of one embodiment of the present invention is to provide a semiconductor device with a novel structure.

Note that the objects of one embodiment of the present invention are not limited to the objects listed above. The objects listed above do not preclude the presence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to achieve at least one of the objects listed above and/or the other objects.

Means for Solving the Problems

One embodiment of the present invention is a semiconductor device including a first element layer including a temperature sensing circuit and a voltage generation circuit, and a plurality of second element layers each including a memory cell. The plurality of second element layers are stacked over the first element layer. The memory cell includes a transistor in which a semiconductor layer including a channel formation region includes an oxide semiconductor. The transistor includes a back gate. The voltage generation circuit has a function of generating a back gate voltage supplied to the back gate. The temperature sensing circuit has a function of controlling the back gate voltage in accordance with a sensed temperature. The voltage generation circuit has a function of supplying the back gate voltage different between the plurality of second element layers.

In the semiconductor device of one embodiment of the present invention, the back gate voltage supplied to the transistor included in the second element layer provided in an upper layer is preferably higher than the back gate voltage supplied to the transistor included in the second element layer provided in a lower layer.

In the semiconductor device of one embodiment of the present invention, it is preferable that the first element layer include an arithmetic circuit and that the stacked second element layers be provided to overlap with a region where the arithmetic circuit is provided.

In the semiconductor device of one embodiment of the present invention, the oxide semiconductor preferably includes In, Ga, and Zn.

One embodiment of the present invention is a semiconductor device including a first element layer and a plurality of second element layers each including a temperature sensing circuit, a voltage generation circuit, and a memory cell. The plurality of second element layers are stacked over the first element layer. The memory cell includes a transistor in which a semiconductor layer including a channel formation region includes an oxide semiconductor. The transistor includes a back gate. The voltage generation circuit provided in each layer has a function of generating a back gate voltage supplied to the back gate of the transistor included in the memory cell provided in the same layer. The temperature sensing circuit has a function of controlling the back gate voltage in accordance with a sensed temperature.

In the semiconductor device of one embodiment of the present invention, the back gate voltage supplied to the transistor included in the second element layer provided in an upper layer is preferably higher than the back gate voltage supplied to the transistor included in the second element layer provided in a lower layer.

In the semiconductor device of one embodiment of the present invention, it is preferable that the first element layer include an arithmetic circuit and that the stacked second element layers be provided to overlap with a region where the arithmetic circuit is provided.

In the semiconductor device of one embodiment of the present invention, the oxide semiconductor preferably includes In, Ga, and Zn.

In the semiconductor device of one embodiment of the present invention, the temperature sensing circuit includes a transistor in which a semiconductor layer including a channel formation region includes an oxide semiconductor.

One embodiment of the present invention is a semiconductor device including a first element layer including a temperature sensing circuit and a voltage generation circuit, a second element layer including an amplifier circuit, and a plurality of third element layers each including a memory cell. A plurality of the second element layers are stacked over the first element layer. The plurality of third element layers are stacked over the second element layer. The amplifier circuit has a function of amplifying a signal of the memory cell. The amplifier circuit and the memory cell each include a transistor in which a semiconductor layer including a channel formation region includes an oxide semiconductor. The transistor includes a back gate. The voltage generation circuit has a function of generating a back gate voltage supplied to the back gate. The temperature sensing circuit has a function of controlling the back gate voltage in accordance with a sensed temperature. The voltage generation circuit has a function of supplying the back gate voltage different between the second element layer and the plurality of third element layers.

In the semiconductor device of one embodiment of the present invention, in the plurality of second element layers, the back gate voltage supplied to the transistor included in the second element layer provided in an upper layer is preferably higher than the back gate voltage supplied to the transistor included in the second element layer provided in a lower layer.

In the semiconductor device of one embodiment of the present invention, the oxide semiconductor preferably includes In, Ga, and Zn.

In the semiconductor device of one embodiment of the present invention, it is preferable that the first element layer include an arithmetic circuit including a scan flip-flop, that the scan flip-flop be electrically connected to a backup circuit having a function of retaining data of the scan flip-flop, and that the backup circuit is provided in the second element layer in a region overlapping with the region where the scan flip-flop is provided.

Note that other embodiments of the present invention are illustrated in the description of the following embodiments and the drawings.

Effect of the Invention

One embodiment of the present invention can provide a semiconductor device with a reduced influence of variations in electrical characteristics of transistors. Another embodiment of the present invention can provide a semiconductor device that is excellent in reducing power consumption. Another embodiment of the present invention can provide a semiconductor device that is excellent in increasing the memory density. Another embodiment of the present invention can provide a semiconductor device with a novel structure.

Note that the description of these effects does not preclude the existence of other effects. Note that one embodiment of the present invention does not need to have all of these effects. Note that other effects will be apparent from the description of the specification, the drawings, the claims, and the like, and other effects can be derived from the description of the specification, the drawings, the claims, and the like.

MODE FOR CARRYING OUT THE INVENTION

Figure 1B:
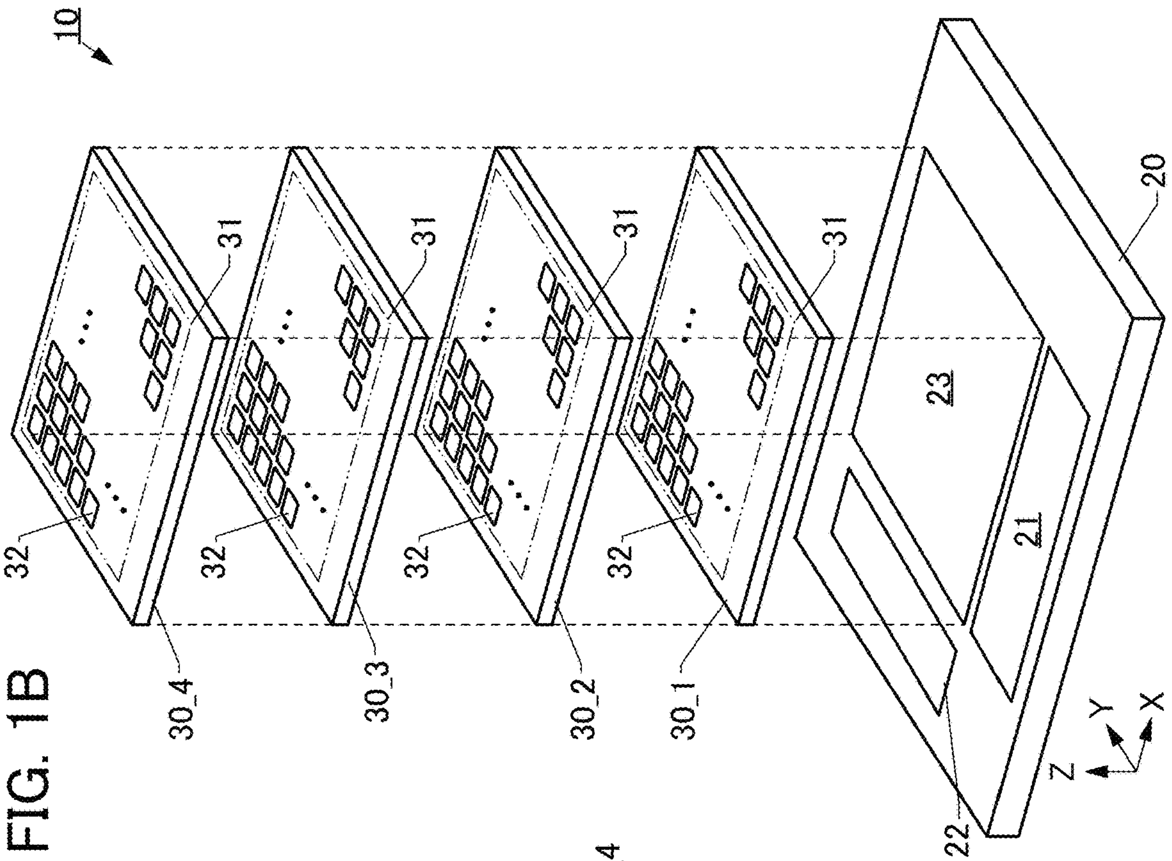
FIG. 1A and FIG. 1B are diagrams illustrating a structure example of a semiconductor device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like illustrated in the drawings.

Unless otherwise specified, off-state current in this specification and the like refers to drain current of a transistor in an off state (also referred to as a non-conducting state or a cutoff state). Unless otherwise specified, an off state in an n-channel transistor refers to a state where voltage $V_{gs}$ between its gate and source is lower than threshold voltage $V_{th}$ (in a p-channel transistor, higher than $V_{th}$).

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used for an active layer of a transistor, the metal oxide is referred to as an oxide semiconductor in some cases. That is, an OS transistor can also be referred to as a transistor including a metal oxide or an oxide semiconductor.

Embodiment 1

In this embodiment, structure examples of a semiconductor device will be described. A semiconductor device described in one embodiment of the present invention functions as an SoC (System on a chip) including a plurality of synchronous circuits such as a memory and a peripheral circuit, in addition to a CPU and a cache memory.

Figure 1A:
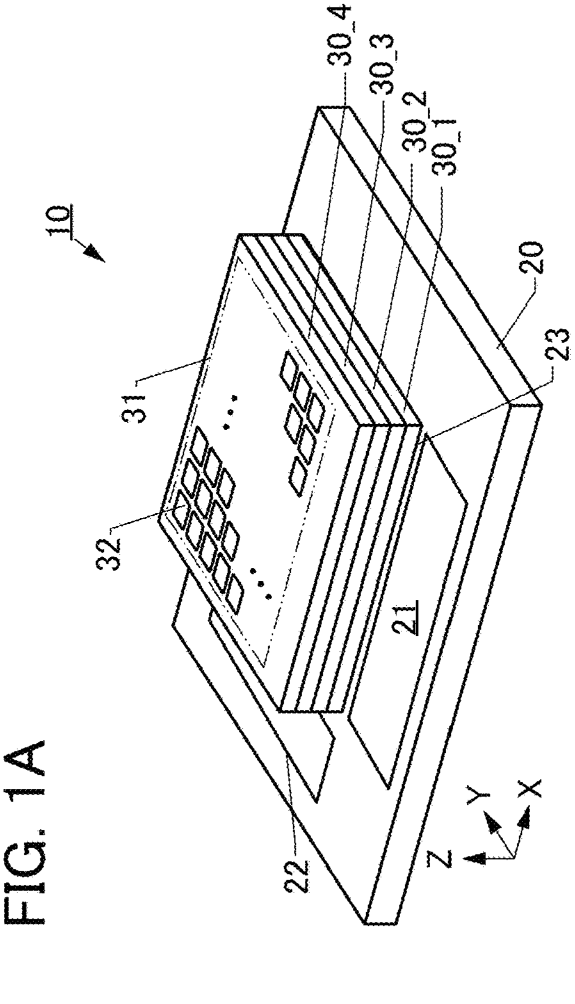
Figure 2:
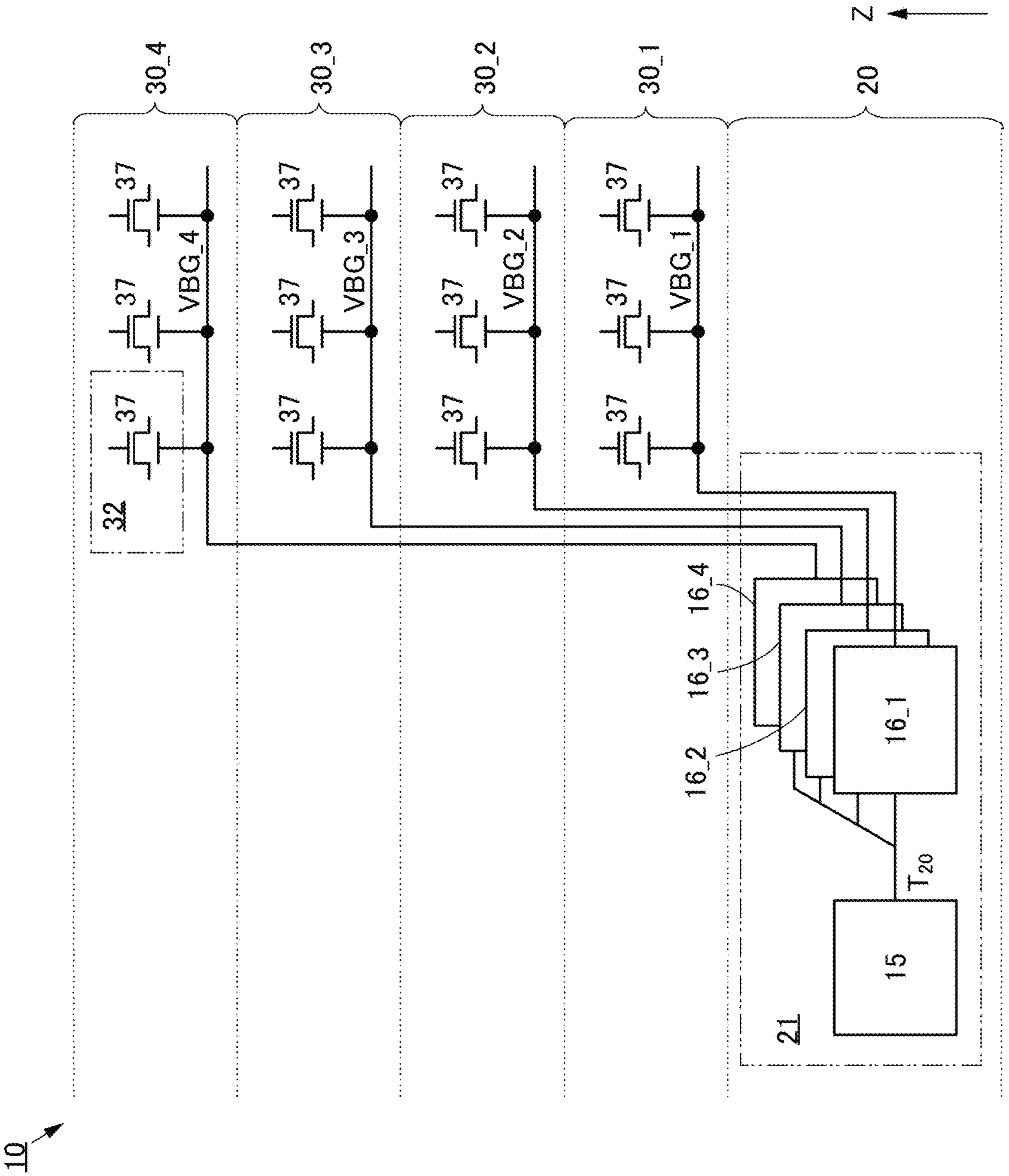
FIG. 2 is a diagram illustrating a structure example of a semiconductor device.

FIG. 1A is a perspective schematic view of a semiconductor device of one embodiment of the present invention. A semiconductor device 10 illustrated in FIG. 1A includes an element layer 20 and a plurality of element layers (element layers 30_1 to 30_4 in FIG. 1A as an example). FIG. 1B is a perspective view illustrating the element layer 20 and the plurality of element layers 30_1 to 30_4 separately in the structure of FIG. 1A. FIG. 2 is a block diagram illustrating the structure illustrated in FIG. 1A and FIG. 1B.

The element layer 20 is a layer including a transistor that includes silicon in a semiconductor layer including a channel formation region (a Si transistor). The element layer 20 includes, for example, a voltage control circuit 21, a peripheral circuit 22, and an arithmetic circuit 23. The element layers 30_1 to 30_4 each include a memory cell array 31. The memory cell array 31 includes memory cells 32. The memory cell 32 includes a transistor 37 having a back gate.

The voltage control circuit 21 has a function of supplying a voltage (back gate voltage) to be applied to the back gate of the transistor 37 included in the memory cell array 31 in each of the element layers 30_1 to 30_4. The back gate voltage differs between the element layers 30_1 to 30_4. The back gate voltage is controlled in accordance with a temperature sensed by the voltage control circuit 21. With this structure, different back gate voltages can be supplied to the element layer 30_1, which is close to the element layer 20, and the element layer 30_4, which is far from the element layer 20, thereby reducing the influence of variations in electrical characteristics of transistors that are different between the element layers 30_1 to 30_4.

The peripheral circuit 22 has a function of controlling writing or reading of data to/from the memory cells 32 included in the memory cell array 31 provided in each of the element layers 30_1 to 30_4. The peripheral circuit 22 includes a plurality of driver circuits for driving signal lines, such as word lines and bit lines connected to the memory cells 32, and a control circuit. For example, for n element layers 30 (n is an integer greater than or equal to 2), n driver circuits for driving the word lines connected to the memory cells 32 and n driver circuits for driving the bit lines connected to the memory cell 32 are preferably provided.

The arithmetic circuit 23 has a function of performing arithmetic processing using data stored in the memory cells 32 in the stacked memory cell arrays 31. For example, the arithmetic circuit 23 can perform arithmetic operation in any of the following cases: the case of using data read from all the memory cell arrays 31, the case of using data read from one of the memory cell arrays 31, and the case of using data read from some of the memory cell arrays 31. Although the arithmetic circuit 23 is described as an example, a circuit having another function, such as a cache memory or a controller circuit, may be used.

In the element layer 20 including Si transistors in the structure of FIG. 1A, FIG. 1B, and FIG. 2, a CMOS circuit (Si CMOS circuit) can be formed. The voltage control circuit 21, the peripheral circuit 22, and the arithmetic circuit 23 can be formed with CMOS circuits and are thus capable of high-speed operation.

Note that for the semiconductor layer including the channel formation region in the Si transistor, a single crystal semiconductor, a polycrystalline semiconductor, a microcrystalline semiconductor, an amorphous semiconductor, or the like can be used alone or in combination. A semiconductor material is not limited to silicon, and germanium or the like can be used, for example. Alternatively, a compound semiconductor such as silicon germanium, silicon carbide, gallium arsenide, or a nitride semiconductor may be used.

In the structure of FIG. 1A, FIG. 1B, and FIG. 2, a path from the memory cell arrays 31 in the element layers 30_1 to 30_4 to the arithmetic circuit 23 or a path from an amplifier circuit for data output from the memory cell arrays 31 to the arithmetic circuit 23 can be shorter than that in the case where a plurality of the memory cell arrays 31 are arranged side by side in the element layer 20. In other words, in the structure of FIG. 1A, FIG. 1B, and FIG. 2, it is possible to reduce the difference between the path from the memory cell array 31 in the element layer 30_1 provided near the element layer 20 (the memory cell array 31 positioned in the lowermost element layer) to the arithmetic circuit 23 and the path from the memory cell array 31 in the element layer 30_4 provided apart from the surface of the element layer 20 (the memory cell array positioned in the uppermost memory layer) to the arithmetic circuit 23.

The difference in length of the path between the memory cell array 31 and the arithmetic circuit 23 causes differences in parasitic capacitance and parasitic resistance and then leads to differences in signal delay and power consumption. Thus, in the structure of FIG. 1A, FIG. 1B, and FIG. 2, data can be read from each of the memory cell arrays 31 of the element layers 30_1 to 30_4 with similar signal delay and power consumption. Accordingly, arithmetic performance, power consumption, and arithmetic efficiency are not largely different depending on which of the memory cell arrays 31 data is stored in, whereby the degree of freedom in data storage is increased.

Note that by placing the arithmetic circuit 23 and the element layers 30_1 to 30_4 to overlap with each other, heat due to the driving of the arithmetic circuit 23 is transmitted to the element layers 30_1 to 30_4. As a result, the field-effect mobility of the OS transistors included in the element layers 30_1 to 30_4 can be increased. High-speed operation of the element layers 30_1 to 30_4 is possible.

The element layers 30_1 to 30_4 are each an element layer including a transistor using an oxide semiconductor in its channel formation region (hereinafter an OS transistor). The element layers 30_1 to 30_4 are stacked over the element layer 20. The Z direction in FIG. 1A and FIG. 1B is a direction perpendicular to a surface of a substrate where the element layer 20 is provided (a plane represented by the X direction and the Y direction) or a direction in which the element layers 30_1 to 30_4 are stacked over the element layer 20.

FIG. 1A, FIG. 1B, and FIG. 2 illustrate a state where the element layers 30_1 to 30_4 including the memory cell arrays 31 are stacked over the element layer 20 in the semiconductor device 10. Providing the element layers 30 including the memory cell arrays 31 over the element layer 20 can reduce the area occupied by the semiconductor device 10. Stacking the element layers 30 including the memory cell arrays 31 can increase the memory capacity per unit area.

For example, the memory cell 32 is preferably a DOSRAM, which is a memory circuit including an OS transistor (also referred to as an "OS memory" in some cases). DOSRAM (registered trademark) is an abbreviation for "Dynamic Oxide Semiconductor Random Access Memory." The DOSRAM refers to a RAM including a 1T (transistor) 1C (capacitor) memory cell. The DOSRAM is a DRAM formed using an OS transistor, and the DOSRAM is a memory that temporarily stores information transmitted from the outside. The DOSRAM is a memory utilizing low off-state current of an OS transistor.

In an OS transistor, a current that flows between the source and the drain in an off state, that is, an off-state current is extremely low. The DOSRAM enables long-term retention of electric charge corresponding to data stored in a capacitor (also referred to as a "cell capacitor" in some cases) by turning off an access transistor (by bring the access transistor into a non-conducting state). For this reason, the refresh operation frequency of the DOSRAM can be lower than that of a DRAM formed with a transistor including silicon in its channel formation region (hereinafter also referred to as a "Si transistor"). As a result, power consumption can be reduced.

When the memory cells 32 are arranged by stacking OS transistors, the element layers 30_1 to 30_4 including the memory cell arrays 31 can be stacked. When the element layers 30_1 to 30_4 included in the element layers 30 are positioned in the direction perpendicular to the surface of the substrate where the element layer 20 is provided, the memory density of the memory cells 32 can be increased. Moreover, the element layers 30 can be formed by repeating the same manufacturing process in the perpendicular direction. In the semiconductor device 10, the manufacturing cost of the element layers 30 can be reduced.

Although the DOSRAM is described as an example of a structure applicable to the memory cells 32 in this embodiment, another structure may be employed as long as a memory layer that can be stacked over the element layer 20 can be formed. For example, a NOSRAM, which is a memory circuit including OS transistors, may be employed. NOSRAM (registered trademark) is an abbreviation for "Nonvolatile Oxide Semiconductor Random Access Memory (RAM)." A memory cell of the NOSRAM is a two-transistor (2T) or three-transistor (3T) gain cell.

Note that it is preferable that the transistors included in the memory cells 32 be all OS transistors. In an OS transistor, a current that flows between the source and the drain in an off state, that is, an off-state current is extremely low. The NOSRAM can be used as a nonvolatile memory by holding electric charge corresponding to data in the memory cell 32 with the use of the characteristic of extremely low off-state current. In particular, the NOSRAM is capable of reading retained data without destruction (non-destructive reading), and thus is suitable for arithmetic processing in which only data reading operation is repeated many times.

Note that in FIG. 1A, FIG. 1B, and FIG. 2, a first element layer 30 is denoted by the element layer 30_1, a second element layer 30 is denoted by the element layer 30_2, and a third element layer 30 is denoted by the element layer 30_3. Furthermore, a k-th element layer 30 (k is an integer greater than or equal to 1 and less than or equal to n) is denoted by an element layer 30_*k*, and an n-th element layer 30 is denoted by an element layer 30_*n*. Note that in this embodiment and the like, a simple term "element layer 30" is sometimes used to describe matters related to all the n element layers 30 or matters common to the n element layers 30.

The voltage control circuit 21 illustrated in FIG. 1A, FIG. 1B, and FIG. 2 includes a temperature sensing circuit 15 and a plurality of voltage generation circuits 16_1 to 16_4. The transistor 37 included in the memory cell 32 illustrated in FIG. 2 is a transistor including a first gate (also referred to as a "front gate" or simply a "gate") and a second gate (also referred to as a "back gate"). The first gate and the second gate have regions overlapping with each other with a semiconductor layer therebetween. The second gate has a function of controlling the threshold voltage of the transistor 37, for example.

The temperature sensing circuit 15 illustrated in FIG. 2 has a function of outputting a signal $T_{20}$ corresponding to the temperature of the element layer 20. The temperature sensing circuit 15 includes a temperature sensor, for example. As the temperature sensor, a resistance thermometer of platinum, nickel, or copper, a thermistor, a thermocouple, an IC temperature sensor, or the like can be used, for example.

The temperature sensing circuit 15 may include an analog-to-digital converter circuit. When the temperature sensing circuit 15 converts temperature information that is an analog signal into a digital signal and outputs the digital signal, signal attenuation due to wiring resistance and parasitic capacitance or influence of noise can be reduced. Thus, even in the case where the temperature sensing circuit 15 is provided apart from the voltage generation circuits 16_1 to 16_4, the temperature information can be accurately transmitted to the voltage generation circuits 16_1 to 16_4.

The electrical characteristics, such as the threshold voltage, of the transistors in the element layers 30_1 to 30_4 change in accordance with a temperature change in the element layer 20. For example, heat is generated by a current that flows in response to the driving of the arithmetic circuit 23 in the element layer 20, and the temperatures of the element layers 30_1 to 30_4 positioned above the arithmetic circuit 23 change. By measuring a temperature change in the element layer 20, the temperature sensing circuit 15 outputs a signal for exercising control in accordance with a change in electrical characteristics due to temperature changes in the element layers 30_1 to 30_4.

The voltage generation circuits 16_1 to 16_4 illustrated in FIG. 2 have a function of generating respective back gate voltages VBG_1 to VBG_4 supplied to the back gates of the transistors 37 in the memory cells 32 included in the element layers 30_1 to 30_4. The voltage generation circuits 16_1 to 16_4 are, for example, circuits that generate an intended back gate voltage by using a combination of a reference voltage generation circuit and a step-down (or step-up) charge pump.

The back gate voltages VBG_1 to VBG_4 generated in the voltage generation circuits 16_1 to 16_4 are generated in accordance with a change in electrical characteristics due to temperature changes in the element layers 30_1 to 30_4. For example, in the case where the element layer 20 has a high temperature owing to the driving of the arithmetic circuit 23, the lower element layer 30_1 has a high temperature equivalent to that of the element layer 20, and the upper element layer 30_4, which is positioned apart from the element layer 20, has a lower temperature than the element layer 30_1. In other words, the back gate voltages VBG_1 to VBG_4 are generated so as to reduce variations in electrical characteristics caused in accordance with temperature gradients of the element layers 30_1 to 30_4 that occur depending on the temperature of the element layer 20.

In the case where the element layer 20 has a high temperature owing to the driving of the arithmetic circuit 23, the electrical characteristics of the transistors differ between the lower element layer 30_1 and the upper element layer 30_4; thus, the voltage control circuit 21 including the temperature sensing circuit 15 and the plurality of voltage generation circuits 16_1 to 16_4 can exercise control such that the back gate voltage VBG_1 is applied to the back gate of the transistor 37 included in the lower element layer 30_1 and the back gate voltage VBG_4 (>VBG_1) is applied to the back gate of the transistor 37 included in the upper element layer 30_4 to reduce variations in electrical characteristics.

Note that the back gate voltages VBG_1 to VBG_4 supplied to the transistors 37 in the element layers preferably satisfy VBG_4>VBG_3>VBG_2>VBG_1. In that case, the electrical characteristics of the transistor 37 included in the upper element layer 30_4 can be made close to the electrical characteristics of the transistor 37 included in the lower element layer 30_1, so that variations in electrical characteristics can be reduced.

Note that examples of a metal oxide employed for the OS transistor include indium oxide, gallium oxide, and zinc oxide. In addition, the metal oxide preferably contains two or three selected from indium, an element M, and zinc. Note that the element M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium. In particular, the element M is preferably one or more kinds selected from aluminum, gallium, yttrium, and tin.

It is particularly preferable to use an oxide containing indium (In), gallium (Ga), and zinc (Zn) (also referred to as IGZO) for the metal oxide. Alternatively, it is preferable to use an oxide containing indium, tin, and zinc (also referred to as ITZO (registered trademark)). Alternatively, it is preferable to use an oxide containing indium, gallium, tin, and zinc. Alternatively, it is preferable to use an oxide containing indium (In), aluminum (Al), and zinc (Zn) (also referred to as IAZO). Alternatively, it is preferable to use an oxide containing indium (In), aluminum (Al), gallium (Ga), and zinc (Zn) (also referred to as IAGZO). Alternatively, it is preferable to use an oxide containing indium (In), gallium (Ga), zinc (Zn), and tin (Sn) (also referred to as IGZTO).

The metal oxide employed for the OS transistor may include two or more metal oxide layers with different compositions. For example, a stacked-layer structure of a first metal oxide layer having In:M:Zn=1:3:4 [atomic ratio] or a composition in the neighborhood thereof and a second metal oxide layer that is provided over the first metal oxide layer and has In:M:Zn=1:1:1 [atomic ratio] or a composition in the neighborhood thereof can be suitably used.

Alternatively, a stacked-layer structure of any one selected from indium oxide, indium gallium oxide, and IGZO, and any one selected from IAZO, IAGZO, and ITZO may be used, for example.

Note that the metal oxide employed for the OS transistor preferably has crystallinity. Examples of an oxide semiconductor having crystallinity include a CAAC (c-axis aligned crystalline)-OS and an nc (nanocrystalline)-OS. When the oxide semiconductor having crystallinity is used, a highly reliable semiconductor device can be provided.

In addition, the OS transistor operates stably and has small fluctuation in characteristics even in a high-temperature environment. For example, the off-state current hardly increases even in a high-temperature environment. Specifically, the off-state current hardly increases even at an environment temperature higher than or equal to room temperature and lower than or equal to 200° C. Moreover, the on-state current is less likely to decrease even in a high-temperature environment. Thus, a memory cell including the OS transistor operates stably and has high reliability even in a high-temperature environment.

Figure 3A:
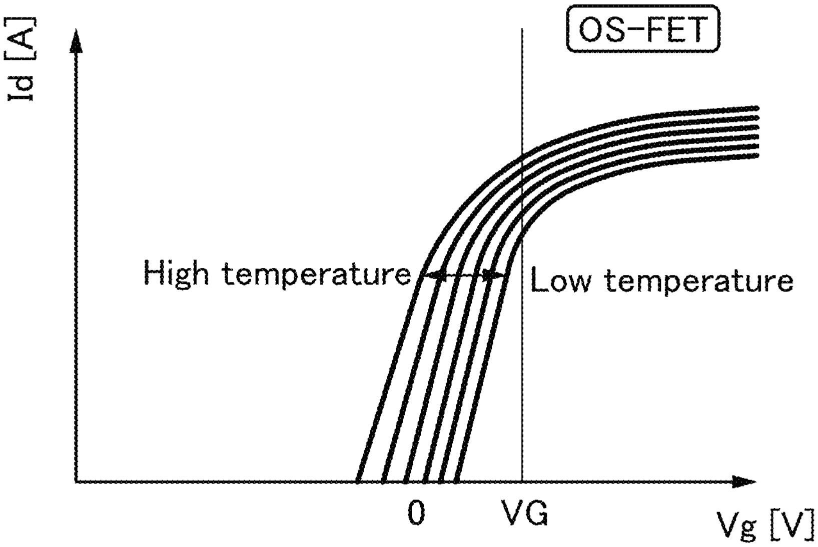
FIG. 3A and FIG. 3B are diagrams for describing a semiconductor device.
Figure 3B:
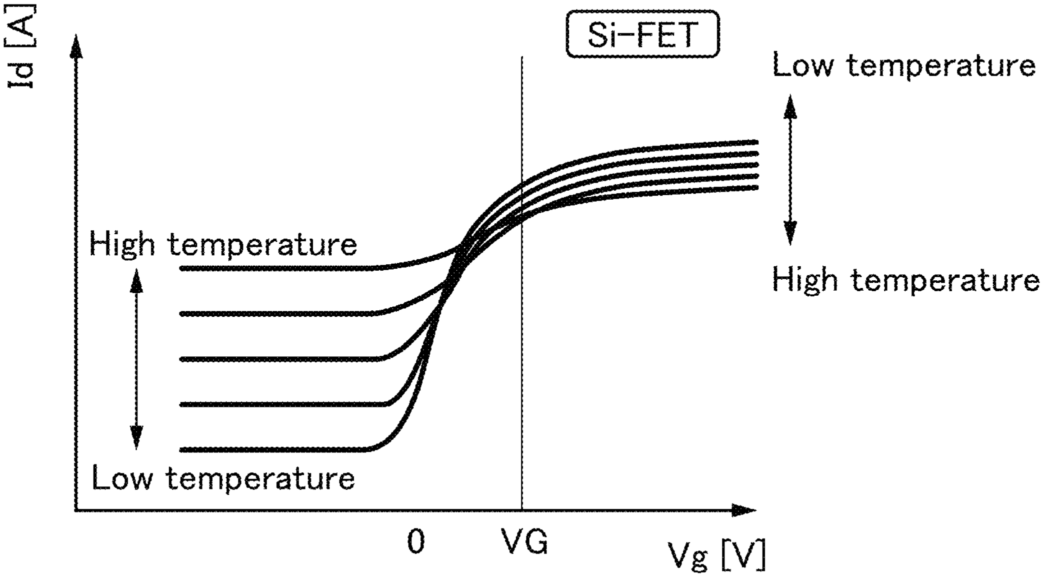

Here, temperature dependence of Id-Vg characteristics, which is one of the electrical characteristics of a transistor, is described. FIG. 3A shows the Id-Vg characteristics of an OS transistor (OS-FET). FIG. 3B shows the Id-Vg characteristics of a Si transistor (Si FET). Note that both FIG. 3A and FIG. 3B show the Id-Vg characteristics of an n-channel transistor. The Id-Vg characteristics indicate a change in drain current (Id) with respect to a change in gate voltage (Vg). The horizontal axis in FIG. 3A and FIG. 3B represents Vg on a linear scale. The vertical axis in FIG. 3A and FIG. 3B represents Id on a log scale.

In the OS transistor, the off-state current is less likely to increase even in the operation at high temperatures, as shown in FIG. 3A. In addition, in the OS transistor, Vth shifts in the negative direction with the increase in operating temperature, and the on-state current at an operating voltage VG increases in accordance with the increase in operating temperature. By contrast, in the Si transistor, the off-state current increases with the increase in operating temperature, as shown in FIG. 3B. Moreover, in the Si transistor, Vth shifts in the positive direction with the increase in operating temperature, and the on-state current at the operating voltage VG decreases in accordance with the increase in operating temperature.

When OS transistors are used as the transistors 37 included in the stacked element layers 30, the off-state current can be low even in the operation at high temperatures. Power consumption of the entire semiconductor device including the transistors 37 can be reduced even in the operation at high temperatures.

Figure 4A:
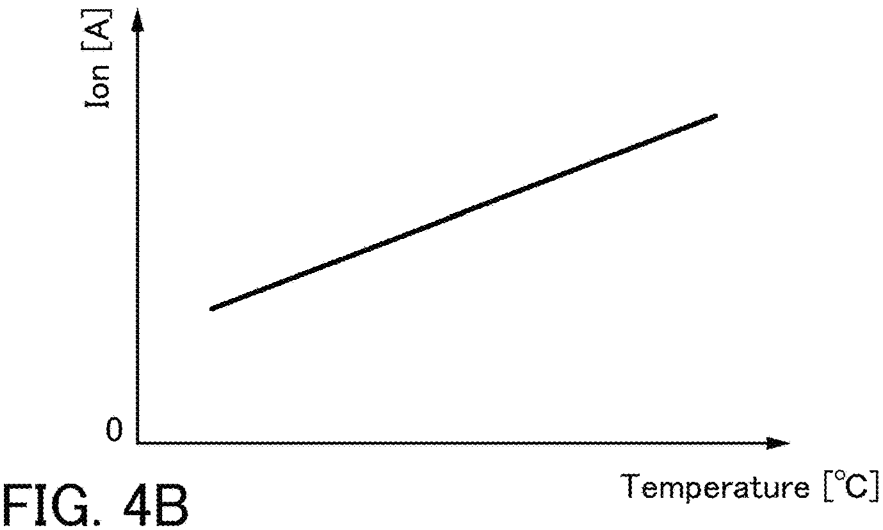
FIG. 4A to FIG. 4C are diagrams for describing a semiconductor device.

FIG. 4A is a graph showing the relation between an on-state current Ion (a drain current Id flowing at the operating voltage VG) and a temperature change based on a temperature-dependent change in Id-Vg characteristics of the OS transistor shown in FIG. 3A. As shown in FIG. 4A, the on-state current Ion varies depending on the temperature; thus, the electrical characteristics change in accordance with temperature changes in the element layers 30_1 to 30_4.

Figure 4B:
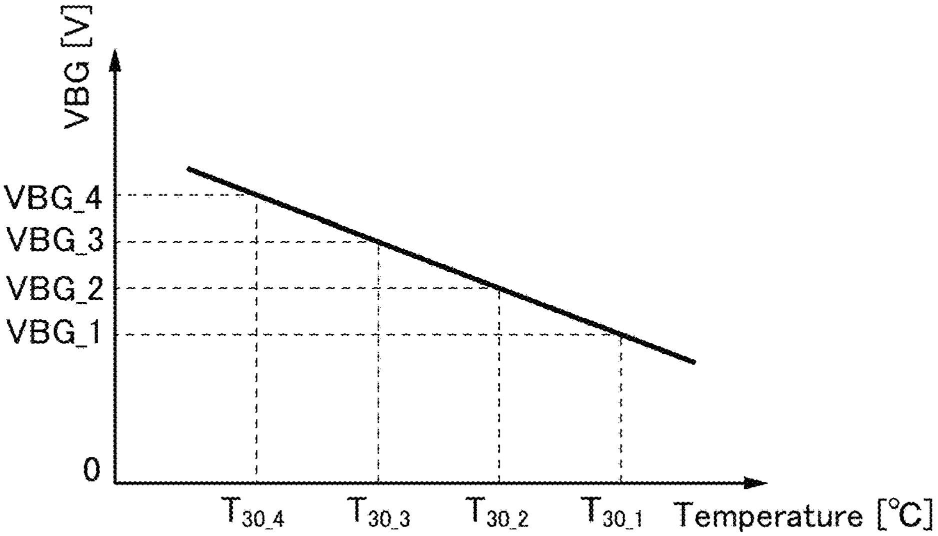
Figure 4C:
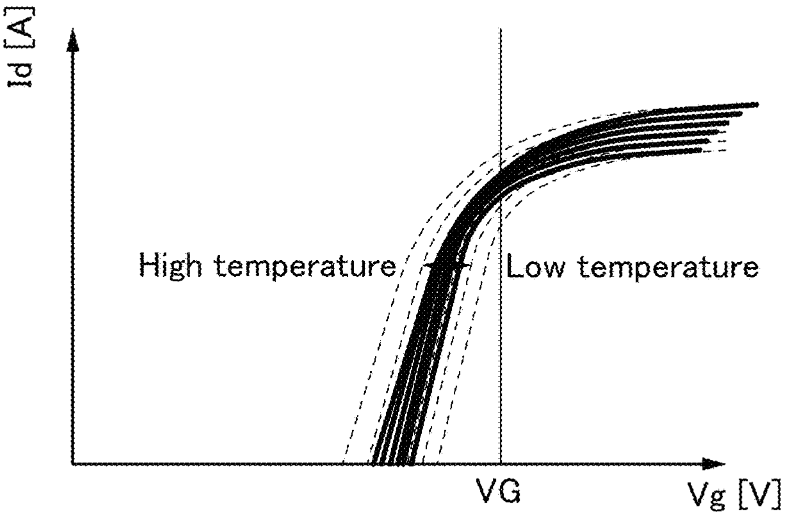

The voltage control circuit 21 generates the back gate voltages VBG_1 to VBG_4 to be supplied to the back gates of the transistors 37 in the memory cells 32 included in the element layers 30_1 to 30_4 so as to reduce a change in electrical characteristics caused by a change in electrical characteristics due to temperature changes in the element layers 30_1 to 30_4. Specifically, as shown in FIG. 4B, in the case where the temperatures of the element layers 30_1 to 30_4 are distributed such that the lower layers have higher temperatures, the back gate voltages VBG_1 to VBG_4 are made to be lower for the lower layers. That is, in the case where the temperature increases in the order of $T_{30\_4}$, $T_{30\_3}$, $T_{30\_2}$, and $T_{30\_1}$, the supplied voltage VBG4 is the highest, followed by VBG3, VBG2, and VBG1. With this structure, variations in electrical characteristics corresponding to variations in temperature changes in the element layers 30_1 to 30_4 can be reduced, as shown in the Id-Vg characteristics in FIG. 4C, for example.

Figure 5A:
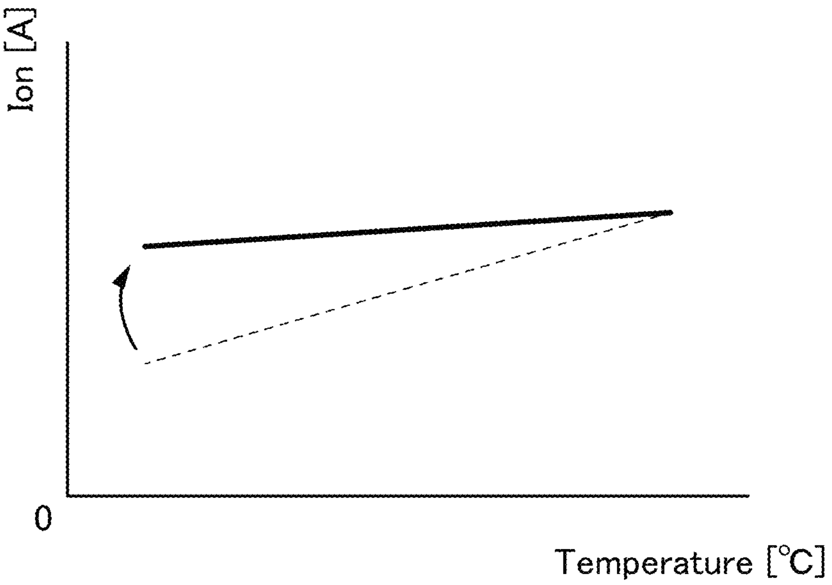
FIG. 5A and FIG. 5B are diagrams for describing a semiconductor device.
Figure 5B:
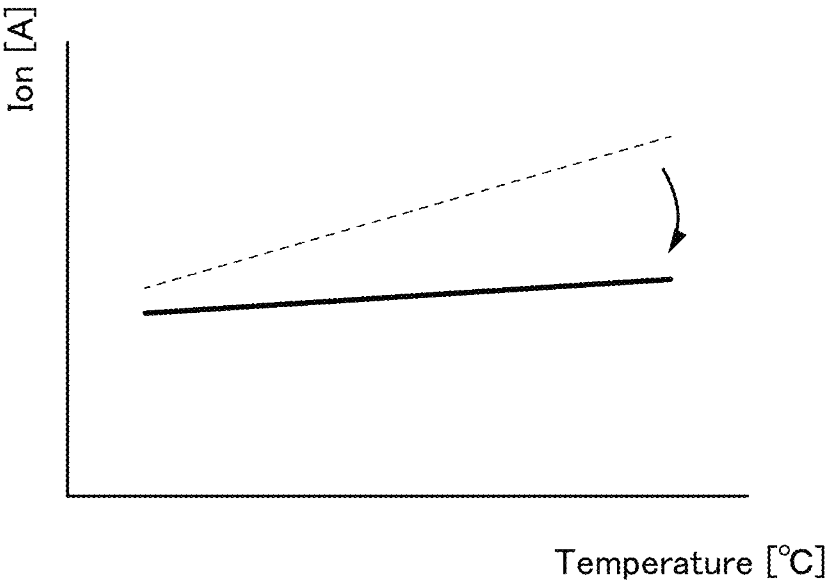

Note that in the case of correcting the element layers on the low-temperature side as shown in FIG. 4B, the on-state current of the transistors in the upper element layers (on the low-temperature side) is corrected to increase (the electrical characteristics indicated with the dotted line are corrected to the electrical characteristics indicated with the solid line) as shown in FIG. 5A; however, another correction may be performed. For example, as in the graph shown in FIG. 5B, the on-state current of the transistors in the lower element layers (on the high-temperature side) may be corrected to decrease (the electrical characteristics indicated with the dotted line may be corrected to the electrical characteristics indicated with the solid line). Such correction can reduce variations in on-state current between the upper element layers 30 and the lower element layers 30.

Figure 6:
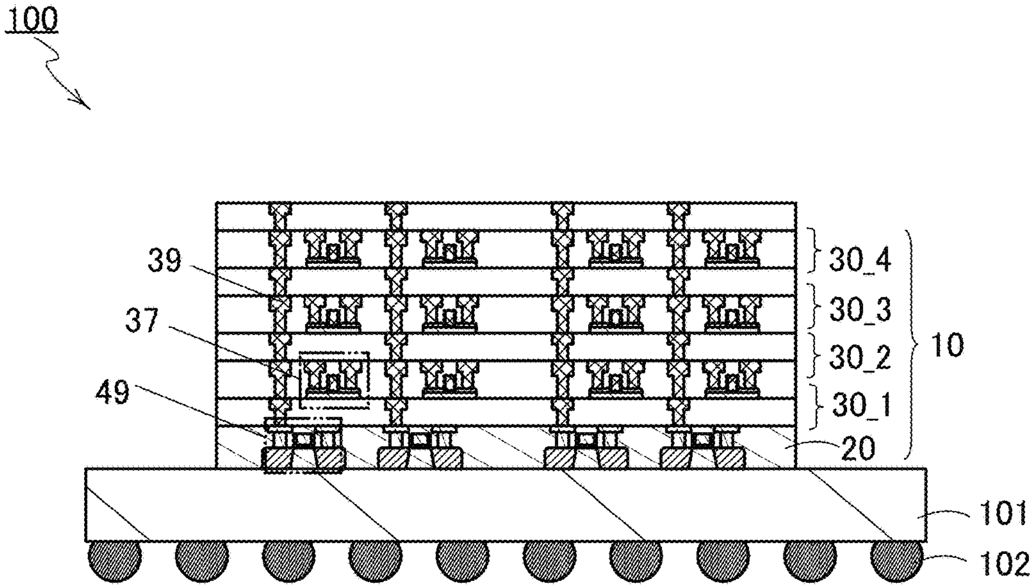
FIG. 6 is a diagram illustrating a structure example of a semiconductor device.

FIG. 6 illustrates an example of an integrated circuit (referred to as an IC chip) including the semiconductor device 10. The semiconductor device 10 can be one IC chip by mounting a plurality of element layers on a packaging substrate. FIG. 6 illustrates one example of the structure.

A schematic cross-sectional view of an IC chip 100 in FIG. 6 illustrates the semiconductor device 10 in which the element layer 20 serving as a base die is provided over a package substrate 101 and the four element layers 30_1 to 30_4, as an example, are stacked over the element layer 20. The package substrate 101 is provided with solder balls 102 for connecting the IC chip 100 to a printed circuit board or the like; electrodes 39 for connecting the element layer 20 and the element layers 30_1 to 30_4 can be provided in a process of manufacturing a transistor 49 that is a Si transistor or the transistor 37 that is an OS transistor.

The structure in FIG. 6 can be a monolithic structure where a technique using through electrodes such as TSVs (Through Silicon Vias) or a Cu—Cu direct bonding technique is not used for connection between the element layer 20 including the Si transistors 49 and the element layers 30_1 to 30_4 including the transistors 37. The element layers 30_1 to 30_4 over the element layer 20 can have a structure where wirings provided together with the transistors 37 included in the element layers 30_1 to 30_4 are used as the electrodes 39 for being connected to the upper or lower element layers.

The intervals between the wirings provided together with the transistors 37 can be made smaller than those between through electrodes using TSVs or a Cu—Cu direct bonding technique. Thus, in the structure of the semiconductor device 10 illustrated in FIG. 6, the number of electrodes for being connected to the upper or lower element layers can be increased. Accordingly, the number of wirings (the number of signal lines) between memory circuits including the memory cells provided in the element layers 30_1 to 30_4 and the arithmetic circuit 23 provided in the element layer 20 can be increased. In other words, the number of channels between the arithmetic circuit and the memory circuits can be increased. Therefore, the transfer amount (bandwidth) of signals transmitted and received between the element layer 20 and the element layer 30 can be increased. The increase in the bandwidth can increase the data transfer amount per unit time.

Figure 7B:
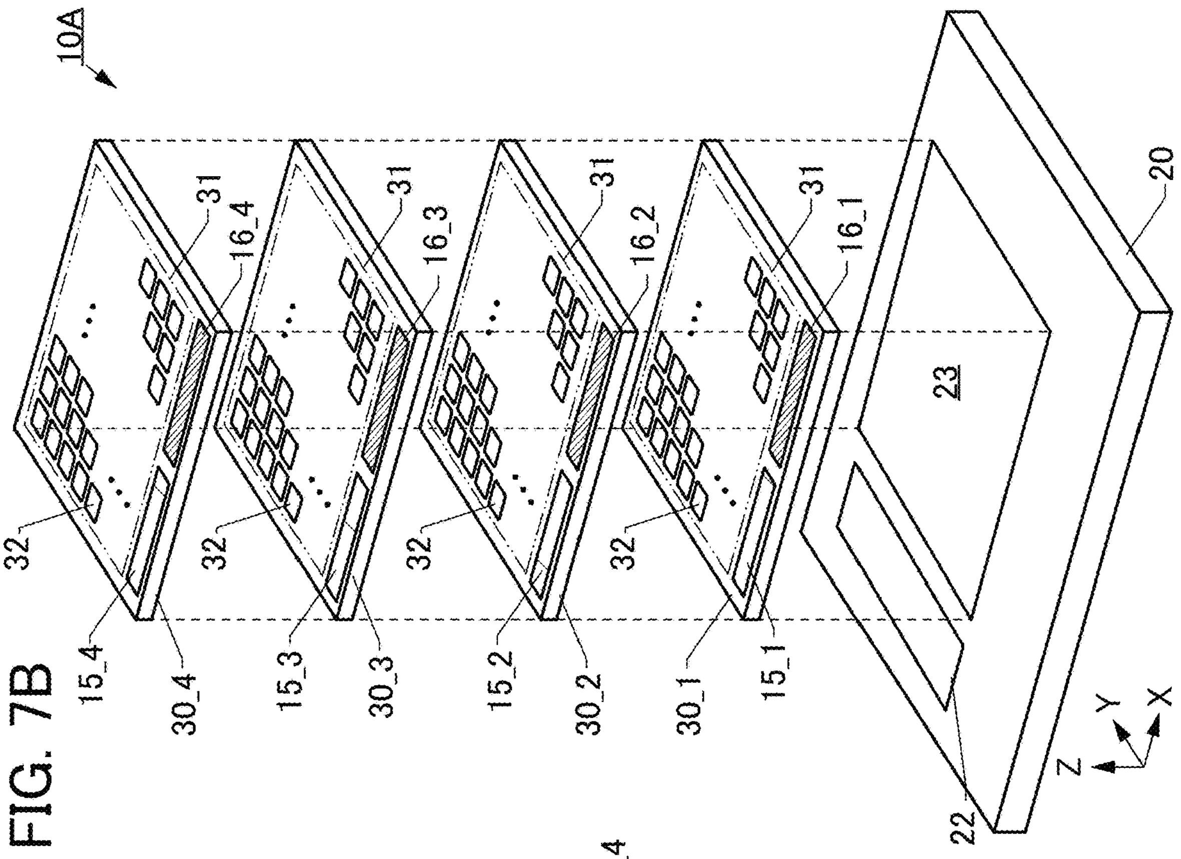
FIG. 7A and FIG. 7B are diagrams illustrating a structure example of a semiconductor device.
Figure 7A:
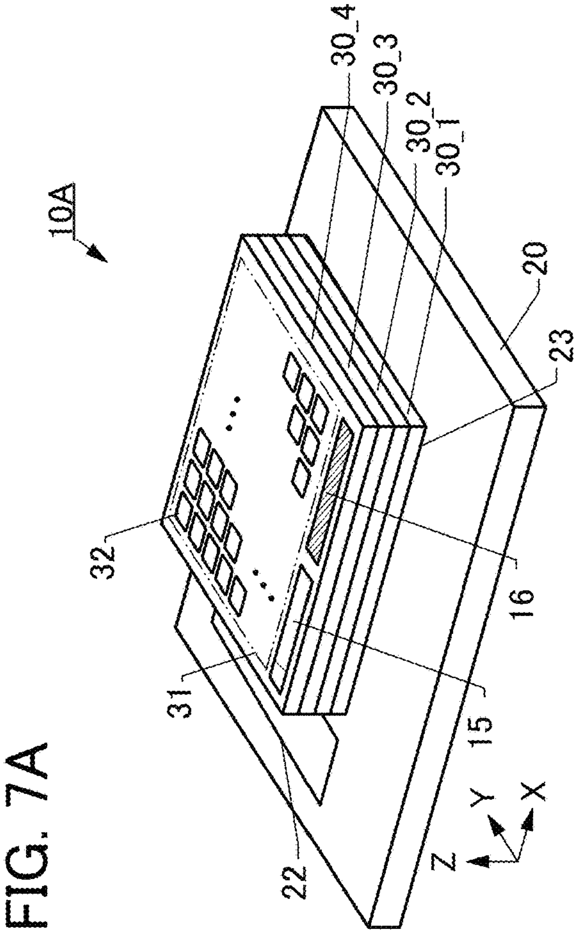
Figure 8:
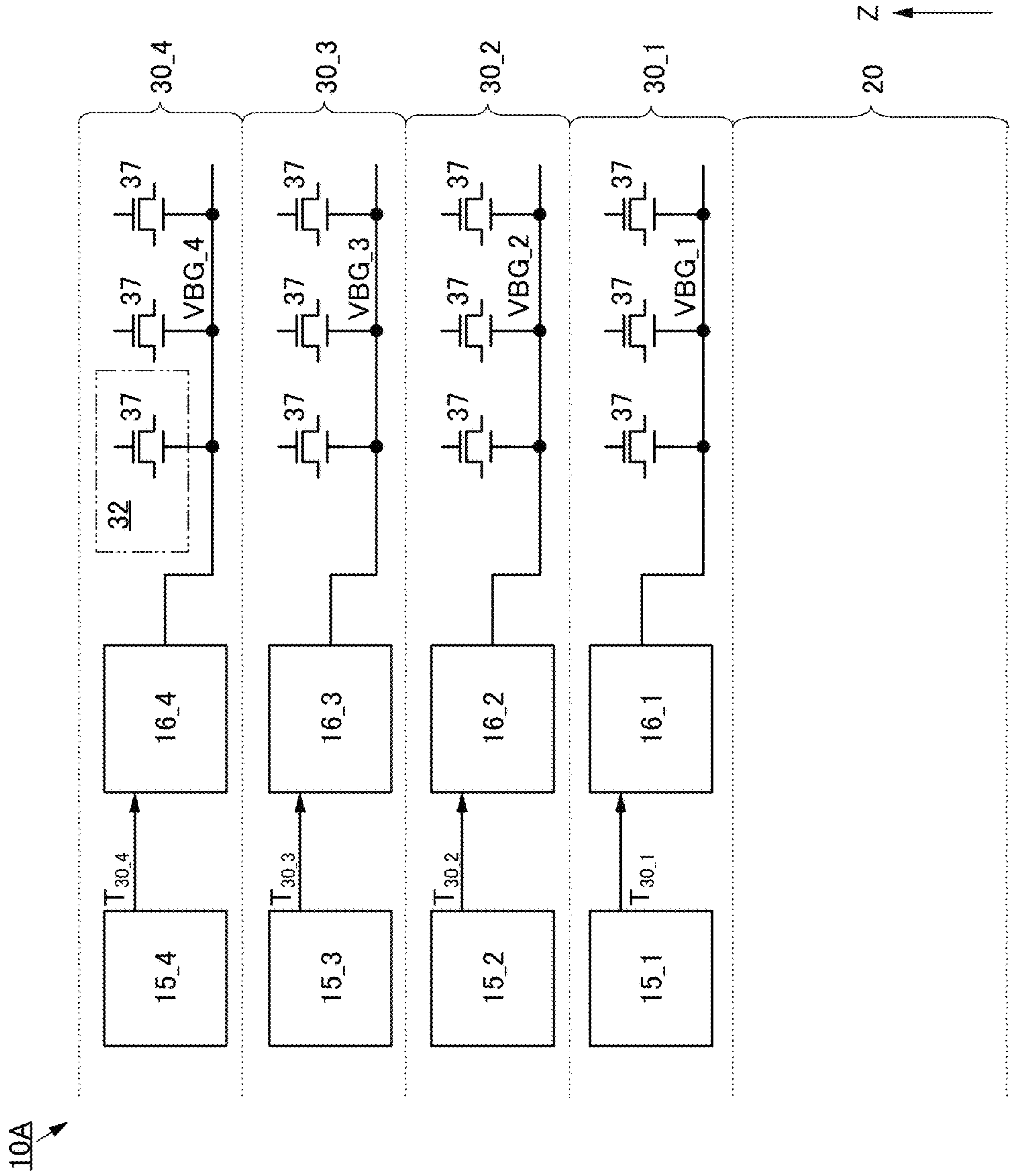
FIG. 8 is a diagram illustrating a structure example of a semiconductor device.

FIG. 7A is a schematic perspective view of a semiconductor device for describing a structure example different from that of the semiconductor device of one embodiment of the present invention described with FIG. 1A. A semiconductor device 10A illustrated in FIG. 7A includes the element layer 20 and a plurality of element layers (the element layers 30_1 to 30_4 in FIG. 7A as an example). FIG. 7B is a perspective view illustrating the element layer 20 and the plurality of element layers 30_1 to 30_4 separately in the structure of FIG. 7A. FIG. 8 is a block diagram illustrating the structure illustrated in FIG. 7A and FIG. 7B. Note that in the following description of FIG. 7A, FIG. 7B, and FIG. 8, a portion common to the description of FIG. 1A, FIG. 1B, and FIG. 2 is denoted by a common reference numeral, and its description is omitted.

The structure illustrated in FIG. 7A, FIG. 7B, and FIG. 8 is different from that in FIG. 1A, FIG. 1B, and FIG. 2 in that the element layers 30_1 to 30_4 each include the temperature sensing circuit 15 and the voltage generation circuit 16. That is, each element layer 30 includes the temperature sensing circuit 15 and the voltage generation circuit 16. Note that the voltage generation circuit 16 may be provided in the element layer 20.

As illustrated in FIG. 7B and FIG. 8, temperature sensing circuits 15_1 to 15_4 provided in the respective layers have a function of outputting the signals $T_{30\_1}$ to $T_{30\_4}$ corresponding to the temperatures of the element layers 30_1 to 30_4. The temperature sensing circuits 15_1 to 15_4 each include a temperature sensor including an OS transistor, for example.

As illustrated in FIG. 7B and FIG. 8, the voltage generation circuits 16_1 to 16_4 provided in the respective layers generate the back gate voltages VBG_1 to VBG_4 of the transistors 37 provided in the respective layers in accordance with a change in electrical characteristics due to temperature changes in the element layers 30_1 to 30_4.

The back gate voltages VBG_1 to VBG_4 generated in the voltage generation circuits 16_1 to 16_4 are generated in accordance with a change in electrical characteristics due to temperature changes in the element layers 30_1 to 30_4. For example, in the case where the element layer 20 has a high temperature owing to the driving of the arithmetic circuit 23, the lower element layer 30_1 has a high temperature equivalent to that of the element layer 20, and the upper element layer 30_4, which is positioned apart from the element layer 20, has a lower temperature than the element layer 30_1. In other words, the back gate voltages VBG_1 to VBG_4 are generated so as to reduce variations in electrical characteristics caused in accordance with temperature gradients of the element layers 30_1 to 30_4 that occur depending on the temperature of the element layer 20.

In the case where the element layer 20 has a high temperature owing to the driving of the arithmetic circuit 23, variations in electrical characteristics are reduced by applying the back gate voltage VBG_1 to the back gate of the transistor 37 included in the lower element layer 30_1 and applying the back gate voltage VBG_4 (>VBG_1) to the back gate of the transistor 37 included in the upper element layer 30_4. Note that the back gate voltages VBG_1 to VBG_4 supplied to the transistors 37 in the element layers preferably satisfy VBG_4>VBG_3>VBG_2>VBG_1. In that case, the electrical characteristics of the transistor 37 included in the upper element layer 30_4 can be made close to the electrical characteristics of the transistor 37 included in the lower element layer 30_1, so that variations in electrical characteristics can be reduced.

Figure 9A:
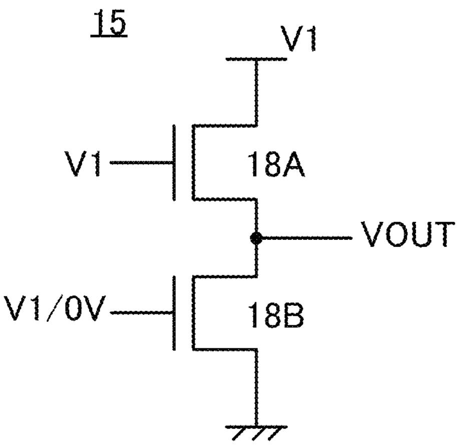
FIG. 9A to FIG. 9C are diagrams each illustrating a structure example of a semiconductor device.

A structure example of the temperature sensor including an OS transistor will be described. FIG. 9A illustrates a structure example of the temperature sensing circuit 15 composed of transistors 18A and 18B that are OS transistors.

In the temperature sensing circuit 15 illustrated in FIG. 9A, a potential V1 is applied to a gate and a drain of the transistor 18A, and 0 V is applied to a gate of the transistor 18B. Electrical continuity is established between a source and the drain of the transistor 18A (the transistor 18A is turned on), and electrical continuity is not established between a source and a drain of the transistor 18B (the transistor 18B is turned off). With the transistor 18A being in a conducting state, the potential of an output VOUT increases from 0 V to V1 (>0 V). This potential increase stops when the potential of the output VOUT becomes V1-VTH, where the threshold voltage of the transistor 18A is VTH.

The temperature is sensed by utilizing a change in the threshold voltage VTH of the transistor 18A depending on the temperature. The output VOUT, which is a value including VTH, can be an output corresponding to the temperature. Note that the output VOUT can be reset (to 0 V) by turning on the transistor 18B with the gate of the transistor 18B set to V1. The output VOUT can be output as a digital signal through the analog-to-digital converter circuit.

Figure 9B:
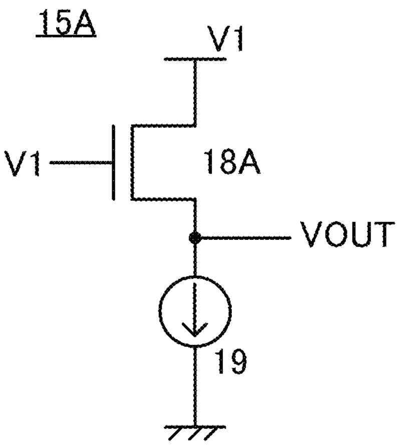

As another structure of the temperature sensing circuit 15, FIG. 9B illustrates a structure example of a temperature sensing circuit 15A composed of the transistor 18A, which is an OS transistor, and a constant current source 19. The constant current source 19 can include an OS transistor. In the structure illustrated in FIG. 9B, the temperature is sensed by utilizing a change in the threshold voltage VTH of the transistor 18A depending on the temperature. The output VOUT, which is a value including VTH, can be an output corresponding to the temperature.

Figure 9C:
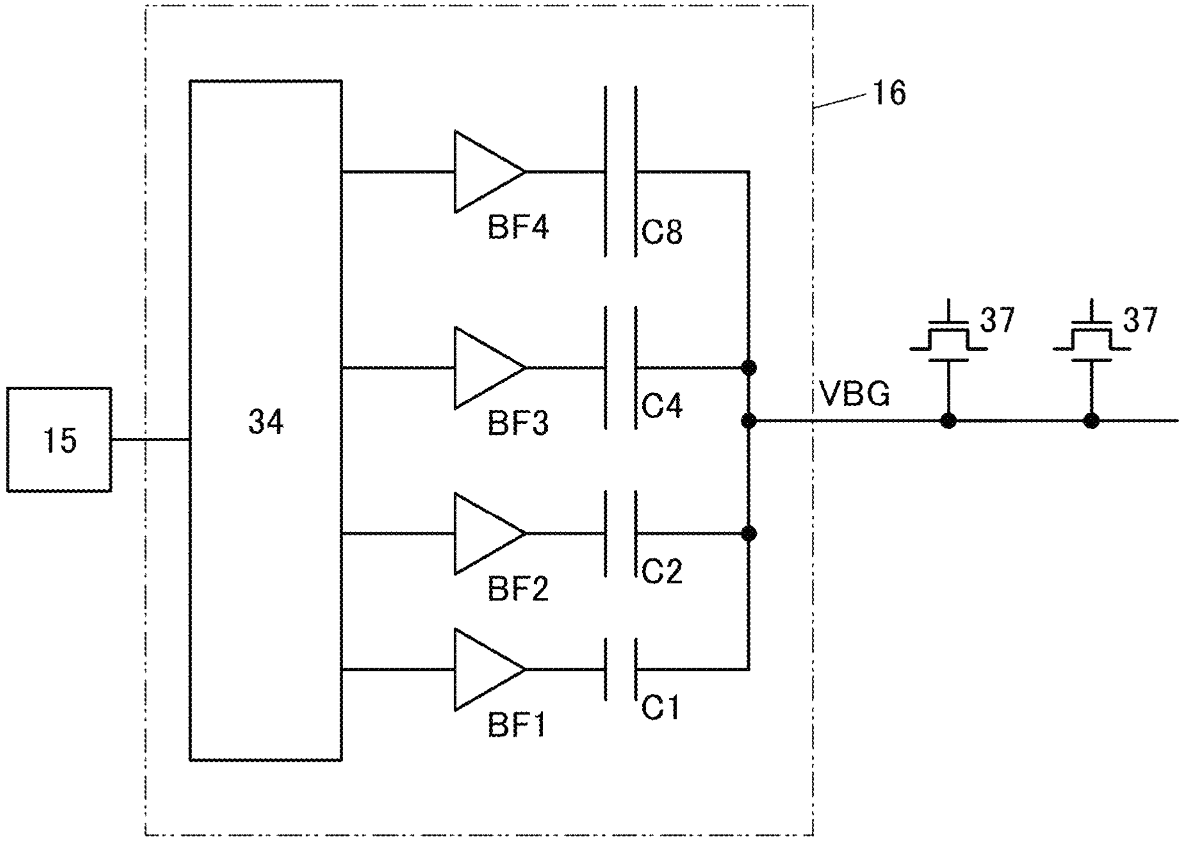

FIG. 9C shows a structure of the voltage generation circuit. The voltage generation circuit 16 includes a logic circuit 34, a plurality of buffers (BF1 to BF4 in FIG. 9C as an example), and a plurality of capacitors (C1, C2, C4, and C8 in FIG. 9C as an example). The logic circuit 34 has a function of supplying voltages to the buffers BF1 to BF4 on the basis of an output signal (temperature information) supplied from the temperature sensing circuit 15. For example, the logic circuit 34 converts serial signals supplied from the temperature sensing circuit 15 into parallel signals and supplies the parallel signals to the buffers BF1 to BF4.

One electrode of the capacitor C1 is connected to an output of the buffer BF1, and the other electrode thereof is connected to a wiring supplying the back gate voltage VBG to the back gates of the transistors 37. One electrode of the capacitor C2 is connected to an output of the buffer BF2, and the other electrode thereof is connected to the wiring supplying the back gate voltage VBG to the back gates of the transistors 37. One electrode of the capacitor C4 is connected to an output of the buffer BF3, and the other electrode thereof is connected to the wiring supplying the back gate voltage VBG to the back gates of the transistors 37. One electrode of the capacitor C8 is connected to an output of the buffer BF4, and the other electrode thereof is connected to the wiring supplying the back gate voltage VBG to the back gates of the transistors 37.

The voltage applied from the voltage generation circuit 16 to the wiring supplying the back gate voltage VBG to the back gates of the transistors 37 is determined by the ratio of the combined capacitance of the capacitor C1, the capacitor C2, the capacitor C4, and the capacitor C8 to the parasitic capacitance generated at the wiring supplying the back gate voltage VBG to the back gates of the transistors 37. The capacitance of the capacitor C1 is preferably sufficiently larger than the parasitic capacitance. Specifically, the capacitance of the capacitor C1 is preferably 5 times or more, further preferably 10 times or more the parasitic capacitance. When the temperature sensing circuit 15 and the voltage generation circuit 16 are arranged in each of the element layers including the memory cells 32 as described above, the back gate voltage VBG can be changed in accordance with a temperature change in each element layer.

Note that the structure of the voltage generation circuit 16 is not limited to the structure illustrated in FIG. 9C and may be another structure. For example, a charge pump circuit or the like may be used.

Note that a voltage holding circuit having a function of holding the back gate voltage VBG may be provided between the voltage generation circuit 16 and the wiring supplying the back gate voltage VBG to the back gates of the transistors 37. Structure examples of the voltage holding circuit are described with reference to FIG. 10A to FIG. 10D.

Figure 10A:
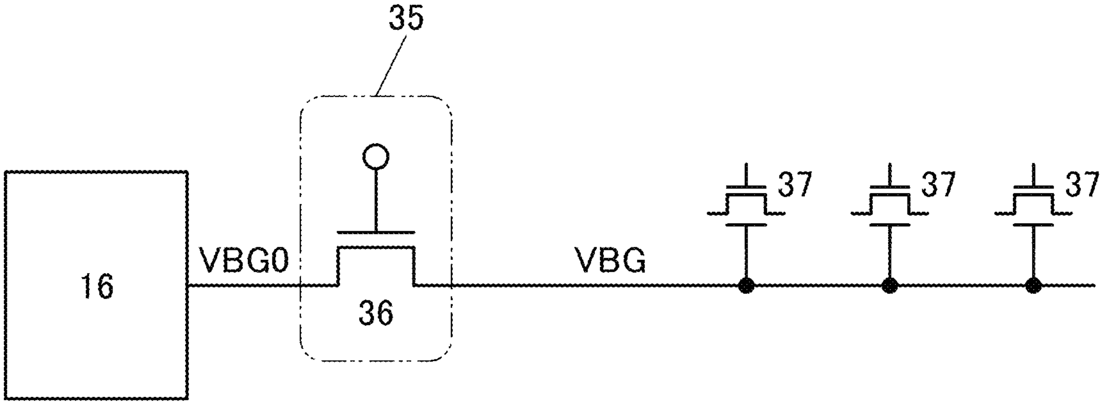
FIG. 10A to FIG. 10D are diagrams each illustrating a structure example of a semiconductor device.

FIG. 10A illustrates a structure example in which a voltage holding circuit 35 is provided between the voltage generation circuit 16 and the wiring supplying the back gate voltage VBG to the back gates of the transistors 37. The voltage holding circuit 35 includes a transistor 36. A first terminal (one of a source and a drain) of the transistor 36 is connected to the voltage generation circuit 16, and a second terminal (the other of the source and the drain) of the transistor 36 is connected to the wiring supplying the back gate voltage VBG to the back gates of the transistors 37.

The voltage holding circuit 35 has a function of supplying a voltage VBG0 generated by the voltage generation circuit 16 to the wiring supplying the back gate voltage VBG to the back gates of the transistors 37, by turning on the transistor 36. It is preferable to apply a voltage higher than or equal to VBG0+Vth1 to a gate of the transistor 36 to turn on the transistor 36*b*, where the threshold voltage of the transistor 36 is Vth1. Moreover, the voltage holding circuit 35 has a function of holding the voltage of the wiring supplying the back gate voltage VBG to the back gates of the transistors 37, by turning off the transistor 36. With the structure of holding the back gate voltage VBG, the voltage generation circuit 16 can be intermittently stopped, and power consumption can be reduced.

Figure 10B:
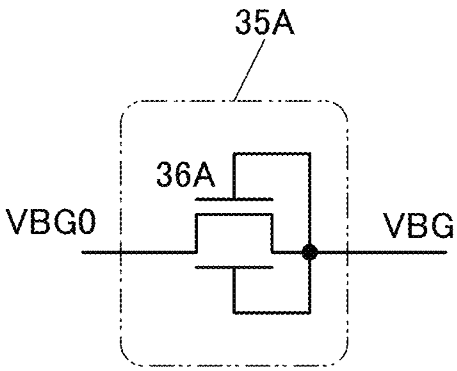

In the case where a negative potential is supplied as the voltage VBG0, a transistor including a first gate and a second gate may be used as the transistor 36, and the first gate and the second gate may be connected to the second terminal (see FIG. 10B). In this case, a transistor 36A can function as a diode. Given that a voltage output from the transistor 36A is a voltage VBG1, the relation of VBG1=VBG+Vth1 is satisfied. When a first terminal of the transistor 36A is set to GND, a negative potential written to the wiring supplying the back gate voltage VBG to the back gates of the transistors 37 can be held.

In the transistor 36A illustrated in FIG. 10B, when the first terminal is set to GND after a negative potential is supplied to the wiring supplying the back gate voltage VBG to the back gates of the transistors 37, the gate voltage (Vg) becomes 0 V. Thus, Id at the time when Vg is 0 V (also referred to as "cutoff current") is preferably low. When the cutoff current is sufficiently low, a negative potential written to the wiring supplying the back gate voltage VBG to the back gates of the transistors 37 can be held for a long period.

The channel length of the transistor 36A is preferably longer than the channel length of the transistor 37. For example, in the case where the channel length of the transistor 37 is shorter than 1 μm, the channel length of the transistor 36A is longer than or equal to 1 μm, preferably longer than or equal to 3 μm, further preferably longer than or equal to 5 μm, still further preferably longer than or equal to 10 μm. When the transistor 36A has a long channel length, the transistor 36A is not affected by a short-channel effect and can have a low cutoff current. Furthermore, the transistor 36A can have a high breakdown voltage between its source and drain. The breakdown voltage between the source and the drain of the transistor 36A is preferably high, in which case the transistor 36A can be easily connected to the transistor 37 even when the voltage generated by the voltage generation circuit 16 is a high voltage.

An OS transistor is preferably used as the transistor 36A. An OS transistor has a low cutoff current and a high breakdown voltage between its source and drain.

Figure 10C:
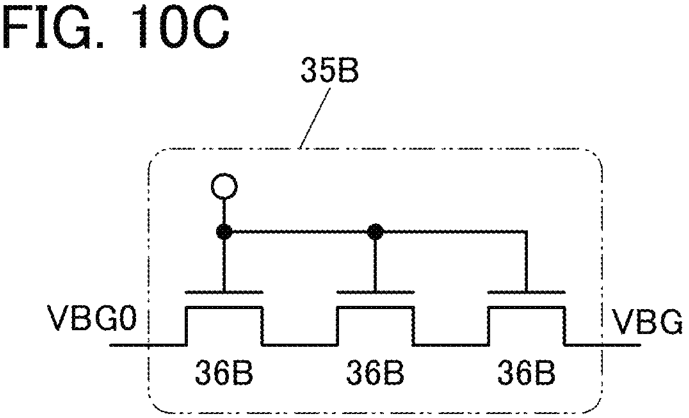
Figure 10D:
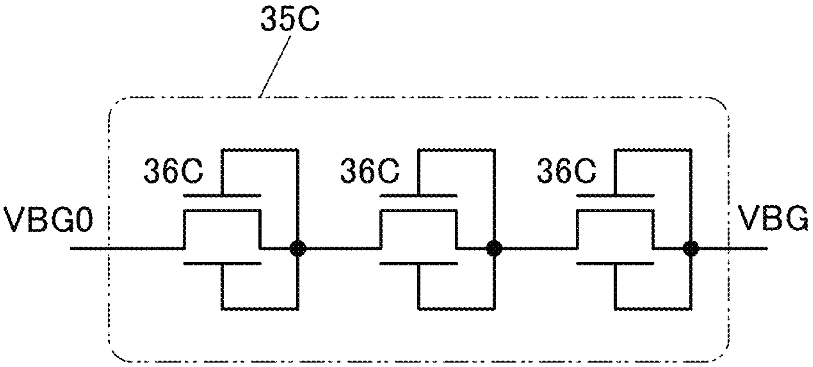

The voltage holding circuit 35 can employ a structure of a voltage holding circuit 35B or 35C as illustrated in FIG. 10C or FIG. 10D. FIG. 10C and FIG. 10D show a structure in which the voltage holding circuit is composed of a plurality of transistors 36B or 36C connected in series.

FIG. 11A to FIG. 11E illustrate structure examples of memory cells that include an OS transistor and can be used as the memory cell 32. Examples of the structure of the memory cell including an OS transistor are a DOSRAM and a NOSRAM, as described above.

Figure 11A:
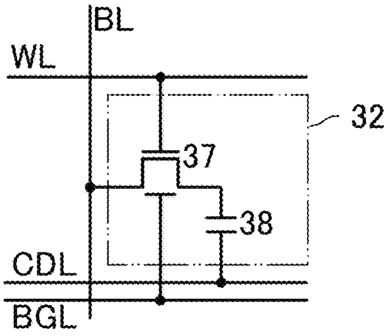
FIG. 11A to FIG. 11E are diagrams each illustrating a structure example of a semiconductor device.

FIG. 11A illustrates an example of a 1T1C (capacitor) DOSRAM memory cell applicable to the memory cell 32. The memory cell 32 illustrated in FIG. 11A is connected to a wiring WL functioning as a word line, a wiring BL functioning as a bit line, a wiring CDL functioning as a capacitor line, and a wiring BGL functioning as a wiring supplying a back gate voltage. The memory cell 32 includes the transistor 37 and a capacitor 38. The back gate of the transistor 37 is connected to the wiring BGL.

The transistor 37 is an OS transistor. The off-state current of the OS transistor is extremely low. Thus, the frequency of data refresh can be reduced in the memory cell 32. Accordingly, power required for data retention can be reduced.

Figure 11B:
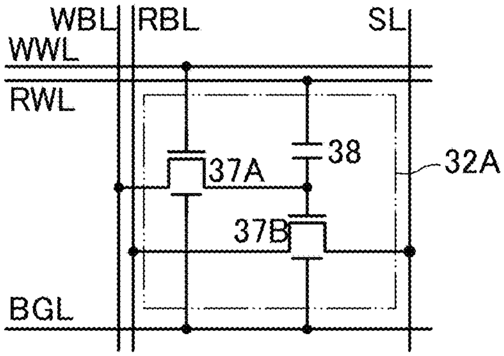

FIG. 11B illustrates an example of a memory cell of the NOSRAM that is a two-transistor (2T) gain cell applicable to the memory cell 32. A memory cell 32A illustrated in FIG. 11B includes transistors 37A and 37B and the capacitor 38. Note that the capacitor 38 included in the memory cell of the NOSRAM can be omitted by utilizing parasitic capacitance such as gate capacitance of the transistor. The transistor 37A is a write transistor and the transistor 37B is a read transistor. Back gates of the transistors 37A and 37B are connected to the wiring BGL.

Since an OS transistor serves as the write transistor, turning off the write transistor enables continuous retention of charge corresponding to data. Thus, the memory cell 32A does not consume power for data retention. Accordingly, the memory cell 32A can function as a low-power-consumption memory cell capable of retaining data for a long period.

Other structure examples of memory cells used for the NOSRAM will be described with reference to FIG. 11C to FIG. 11E.

Figure 11C:
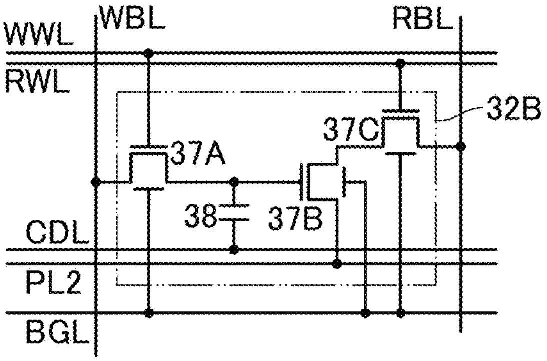

A memory cell 32B illustrated in FIG. 11C is a 3T gain cell and includes transistors 37A, 37B, and 37C and the capacitor 38. The transistors 37A, 37B, and 37C are a write transistor, a read transistor, and a selection transistor, respectively. Back gates of the transistors 37A, 37B, and 37C are connected to the wiring BGL. The memory cell 32B is connected to wirings RWL and WWL, wirings RBL and WBL, the wiring CDL, and a power supply line PL2. For example, a voltage GND (low-level-side power supply voltage) is input to the wiring CDL and the wiring PL2.

Figure 11D:
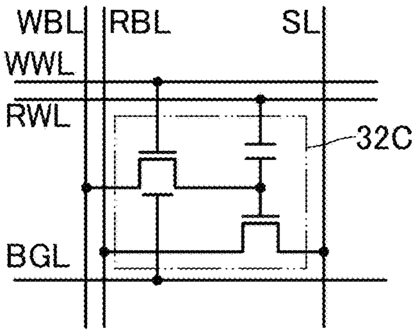

FIG. 11D illustrates another structure example of a 2T gain cell. A memory cell 32C illustrated in FIG. 11D differs from the memory cell 32A illustrated in FIG. 11B in that the read transistor is an OS transistor without a back gate.

Figure 11E:
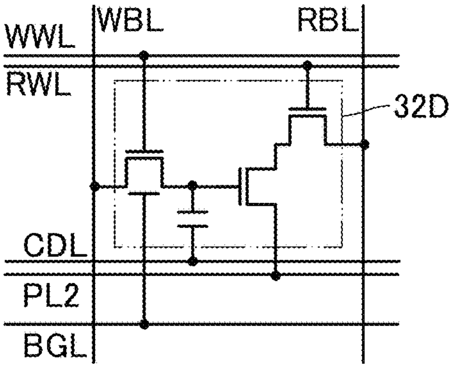

FIG. 11E illustrates another structure example of a 3T gain cell. A memory cell 32D illustrated in FIG. 11E differs from the memory cell 32A illustrated in FIG. 11B in that the read transistor and the selection transistor are each an OS transistor without a back gate.

In each of the above gain cells, a bit line serving as both the wiring RBL and the wiring WBL may be provided.

In the case where the memory cell 32 is a DOSRAM or a NOSRAM, the other portions can be power-gated with a voltage that turns off a transistor serving as an access transistor (the transistor 37 or 37A in FIG. 11A to 11E) applied to the wiring connected to the gate of the transistor (the wiring WL or WWL in FIG. 11A to 11E). With this structure, the supply of the power supply voltage can be stopped while data is stored in the memory cell 32.

This embodiment can be implemented in combination with the other embodiments described in this specification as appropriate.

Embodiment 2

This embodiment will describe a structure example where a DOSRAM is used as the memory cell included in the semiconductor device described in the above embodiment and an element layer including an amplifier circuit having functions of amplifying and outputting a data potential retained in the memory cell is provided between the element layers including the stacked memory cells.

[Structure Example of Semiconductor Device]

Figure 12:
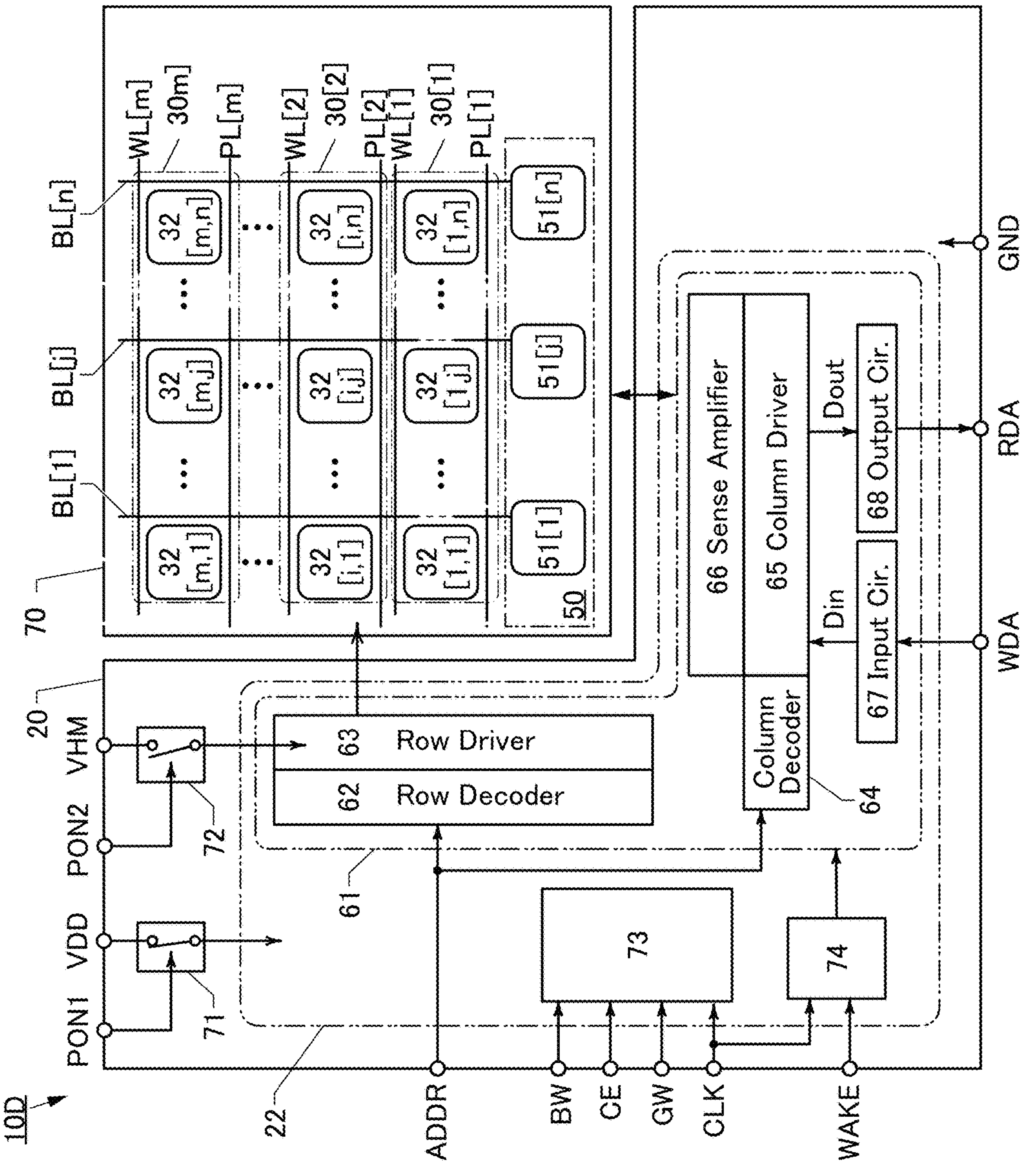
FIG. 12 is a diagram illustrating a structure example of a semiconductor device.

FIG. 12 is a block diagram illustrating a structure example of a semiconductor device 10D of one embodiment of the present invention. The semiconductor device 10D illustrated in FIG. 12 includes the element layer 20 and a multilayer element layer 70. The multilayer element layer 70 includes stacked element layers 30[1] to 30[m] and an element layer 50 including amplifier circuits 51.

FIG. 12 illustrates an example in which the element layers 30[1] to 30[m] include a plurality of the memory cells 32 arranged in a matrix of m rows and n columns (each of m and n is an integer greater than or equal to 2). The amplifier circuit 51 is provided for each wiring BL functioning as a bit line, for example. FIG. 12 illustrates an example in which a plurality of the amplifier circuits 51 (an amplifier circuit 51[1] to an amplifier circuit 51[n]) are provided to correspond to n wirings BL.

In FIG. 12, the memory cell 32 in the first row and the first column is denoted as a memory cell 32[1,1], and the memory cell 32 in the m-th row and the n-th column is denoted as a memory cell 32[m,n]. In this embodiment and the like, a given row is denoted as an i-th row in some cases. A given column is denoted as a j-th column in some cases. Thus, i is an integer greater than or equal to 1 and less than or equal to m, and j is an integer greater than or equal to 1 and less than or equal to n. In this embodiment and the like, the memory cell 32 in the i-th row and the j-th column is denoted as a memory cell 32[i,j]. Note that in this embodiment and the like, "i+α" (α is a positive or negative integer) is not below 1 and does not exceed m. Similarly, "j+α" is not below 1 and does not exceed n.

The element layers 30[1] to 30[m] each include m wirings WL extending in the row direction, m wirings PL extending in the row direction, and the n wirings BL extending in the column direction. In this embodiment and the like, a first wiring WL (provided in the first row) is denoted as a wiring WL[1], and an m-th wiring WL (provided in the m-th row) is denoted as a wiring WL[m]. Similarly, a first wiring PL (provided in the first row) is denoted as a wiring PL[1], and an m-th wiring PL (provided in the m-th row) is denoted as a wiring PL[m]. Similarly, a first wiring BL (provided in the first column) is denoted as a wiring BL[1], and an n-th wiring BL (provided in the n-th column) is denoted as a wiring BL[n].

A plurality of the memory cells 32 provided in the i-th row are connected to the wiring WL in the i-th row (wiring WL[i]) and the wiring PL in the i-th row (wiring PL[i]). A plurality of the memory cells 32 provided in the j-th column are connected to the wiring BL in the j-th column (wiring BL[j]).

The wiring BL functions as a bit line for writing and reading data. The wiring WL functions as a word line for controlling the on and off state (conducting and non-conducting state) of the access transistor serving as a switch. The wiring PL has a function of transmitting a back gate potential to a back gate of the OS transistor, which is the access transistor, in addition to a function of a constant potential line connected to the capacitor. Note that a wiring CL (not illustrated) can be separately provided as a wiring for transmitting the back gate potential.

The memory cell 32 included in each of the element layers 30[1] to 30[m] is connected to the amplifier circuit 51 through the wiring BL. The wiring BL can be provided in the direction perpendicular to the surface of the substrate provided with the element layer 20. Since the wiring BL provided to extend from the memory cells 32 included in the element layers 30[1] to 30[m] is provided in the direction perpendicular to the surface of the substrate, the length of the wiring between the element layer 30 and the amplifier circuit 51 can be shortened. Accordingly, a signal transmission distance between the two circuits connected to the bit line can be shortened, and the resistance and parasitic capacitance of the bit line can be significantly reduced; hence, power consumption and signal delays can be reduced. Moreover, operation is possible even when the capacitance of the capacitors included in the memory cells 32 is reduced.

The amplifier circuit 51 has functions of amplifying data potentials retained in the memory cells 32 and outputting the amplified data potentials to a sense amplifier 66 included in the element layer 20 through an after-mentioned wiring GBL (not illustrated). With this structure, a slight difference in the potential of the wiring BL can be amplified at the time of data reading. Like the wiring BL, the wiring GBL can be provided in the direction perpendicular to the surface of the substrate provided with the element layer 20. Since the wiring BL and the wiring GBL provided to extend from the memory cells 32 included in the element layers 30[1] to 30[m] are provided in the direction perpendicular to the surface of the substrate, the length of the wiring between the amplifier circuit 51 and the sense amplifier 66 can be shortened. Accordingly, a signal transmission distance between the two circuits connected to the wiring GBL can be shortened, and the resistance and parasitic capacitance of the wiring GBL can be significantly reduced; hence, power consumption and signal delays can be reduced.

Note that the wiring BL is provided in contact with a semiconductor layer of the transistor included in the memory cell 32. Alternatively, the wiring BL is provided in contact with a region functioning as a source or a drain in the semiconductor layer of the transistor included in the memory cell 32. Alternatively, the wiring BL is provided in contact with a conductor provided in contact with the region functioning as the source or the drain in the semiconductor layer of the transistor included in the memory cell 32. That is, the wiring BL can be regarded as a wiring for connecting one of the source and the drain of the transistor included in the memory cell 32 in each element layer 30 to the amplifier circuit 51 in the perpendicular direction.

The multilayer element layer 70 can be provided over the element layer 20 to overlap with the element layer 20. Providing the element layer 20 and the multilayer element layer 70 to overlap with each other can shorten a signal transmission distance between the element layers 30 and the element layer 50 and between the element layer 20 and the element layer 50. Thus, the resistance and parasitic capacitance between the element layers are reduced, so that power consumption and signal delays can be reduced. In addition, the semiconductor device 10D can be downsized.

When the amplifier circuit 51 is composed of OS transistors like the transistor included in the memory cell 32 of the DOSRAM, the amplifier circuit 51 can be provided at any desired position, e.g., over a circuit using Si transistors, as in the element layers 30[1] to 30[m]; thus, integration can be easily performed. With the structure in which a signal is amplified by the amplifier circuit 51, a circuit in a subsequent stage, such as the sense amplifier 66, can be downsized; hence, the semiconductor device 10D can be downsized.

The element layer 20 includes a PSW 71 (power switch), a PSW 72, and the peripheral circuit 22. The peripheral circuit 22 includes a driver circuit 61, a control circuit 73, and a voltage generation circuit 74.

In the semiconductor device 10D, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside. The signal CLK is a clock signal.

The signal BW, the signal CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 73.

The control circuit 73 is a logic circuit having a function of controlling the overall operation of the semiconductor device 10D. For example, the control circuit performs logical operation on the signal CE, the signal GW, and the signal BW to determine an operation mode (e.g., writing operation or reading operation) of the semiconductor device 10D. Alternatively, the control circuit 73 generates a control signal for the driver circuit 61 so that the operation mode is executed.

The voltage generation circuit 74 has a function of generating a negative voltage. The signal WAKE has a function of controlling the input of the signal CLK to the voltage generation circuit 74. For example, when an H-level signal is supplied as the signal WAKE, the signal CLK is input to the voltage generation circuit 74, and the voltage generation circuit 74 generates a negative voltage.

The driver circuit 61 is a circuit for writing and reading data to/from the memory cells 32. Moreover, the driver circuit 61 is a circuit that outputs various signals for controlling the amplifier circuits 51. The driver circuit 61 includes a row decoder 62, a column decoder 64, a row driver 63, a column driver 65, an input circuit 67 (Input Cir.), an output circuit 68 (Output Cir.), and the sense amplifier 66.

The row decoder 62 and the column decoder 64 have a function of decoding the signal ADDR. The row decoder 62 is a circuit for specifying a row to be accessed, and the column decoder 64 is a circuit for specifying a column to be accessed. The row driver 63 has a function of selecting the wiring WL specified by the row decoder 62. The column driver 65 has a function of writing data to the memory cells 32, a function of reading data from the memory cells 32, a function of retaining the read data, and the like.

The input circuit 67 has a function of retaining the signal WDA. Data retained by the input circuit 67 is output to the column driver 65. Data output from the input circuit 67 is data (Din) to be written to the memory cells 32. Data (Dout) read from the memory cells 32 by the column driver 65 is output to the output circuit 68. The output circuit 68 has a function of retaining Dout. Moreover, the output circuit 68 has a function of outputting Dout to the outside of the semiconductor device 10D. Data output from the output circuit 68 is the signal RDA.

The PSW 71 has a function of controlling the supply of VDD to the peripheral circuit 22. The PSW 72 has a function of controlling the supply of VHM to the row driver 63. Here, in the semiconductor device 10D, a high power supply voltage is VDD and a low power supply voltage is GND (a ground potential). In addition, VHM is a high power supply voltage used to set the word line at high level and is higher than VDD. The on/off state of the PSW 71 is controlled by the signal PON1, and the on/off state of the PSW 72 is controlled by the signal PON2. The number of power domains to which VDD is supplied is one in the peripheral circuit 22 in FIG. 12 but can be more than one. In such a case, a power switch is provided for each power domain.

Figure 13A:
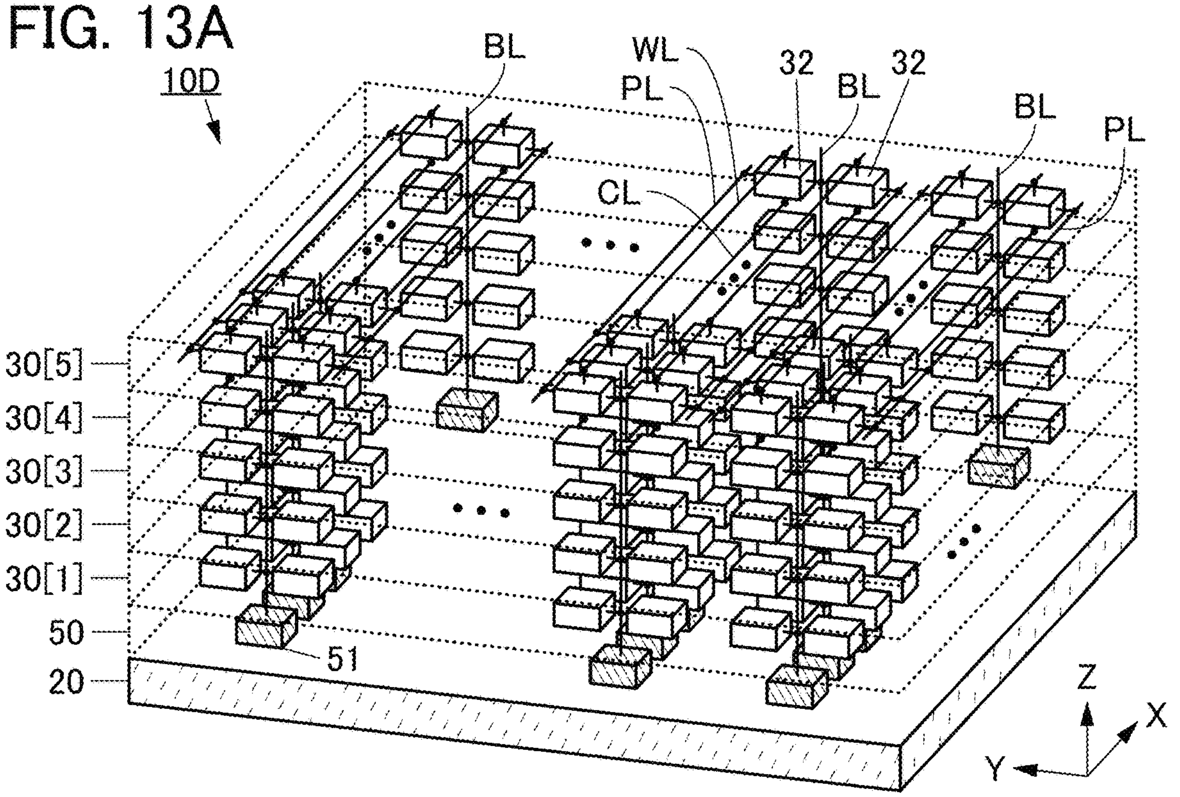
FIG. 13A and FIG. 13B are diagrams each illustrating a structure example of a semiconductor device.

The element layers 30[1] to 30[m] and the element layer 50 can be provided over the element layer 20 to overlap with the element layer 20. FIG. 13A is a perspective view of the semiconductor device 10D in which five element layers 30[1] to 30[5] (m=5) and the element layer 50 are provided over the element layer 20 to overlap with the element layer 20.

In FIG. 13A, the element layer 30 provided in the first layer is denoted as the element layer 30[1], the element layer 30 provided in the second layer is denoted as the element layer 30[2], and the element layer 30 provided in the fifth layer is denoted as the element layer 30[5]. FIG. 13A also illustrates the wiring WL, the wiring PL, and the wiring CL provided to extend in the X direction and the wiring BL provided to extend in the Z direction (the direction perpendicular to the surface of the substrate provided with the driver circuit). For easy viewing of the drawing, some of the wirings WL and the wirings PL included in the element layers 30 are not illustrated.

Figure 13B:
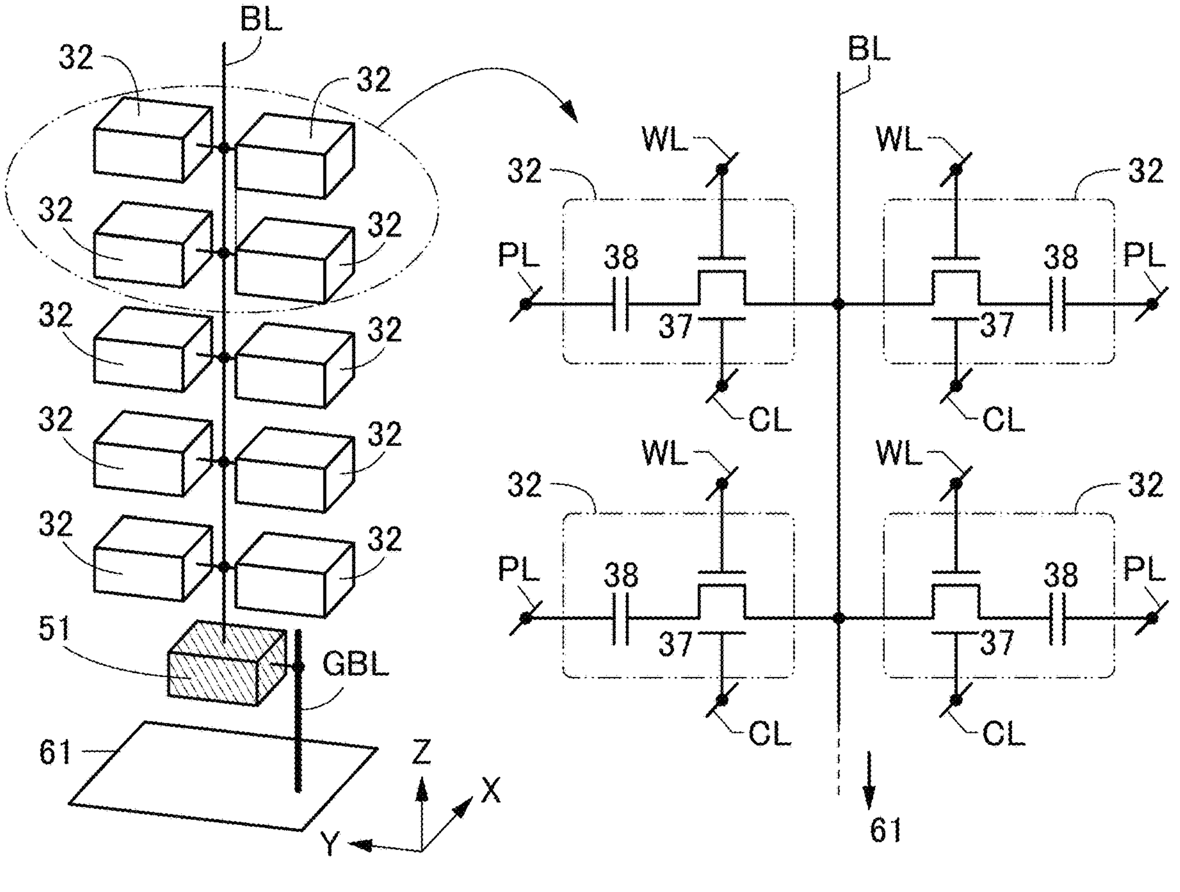

FIG. 13B illustrates a schematic view for describing a structure example of the amplifier circuit 51, which is connected to the wiring BL, and the memory cells 32 included in the element layers 30[1] to 30[5], which are connected to the wiring BL, illustrated in FIG. 13A. FIG. 13B also illustrates the wiring GBL provided between the amplifier circuit 51 and the driver circuit 61. Note that a structure in which a plurality of memory cells (memory cells 32) are connected to one wiring BL is also referred to as "memory string." In the drawings, the wiring GBL is sometimes represented by a bold line for increasing visibility.

FIG. 13B illustrates an example of a circuit structure of the memory cell 32 connected to the wiring BL. The memory cell 32 includes the transistor 37 and the capacitor 38. As for the transistor 37, the capacitor 38, and the wirings (e.g., BL and WL), for example, the wiring BL[1] and the wiring WL[1] are referred to as the wiring BL and the wiring WL in some cases.

In the memory cell 32, one of the source and the drain of the transistor 37 is connected to the wiring BL. The other of the source and the drain of the transistor 37 is connected to one electrode of the capacitor 38. The other electrode of the capacitor 38 is connected to the wiring PL. The gate of the transistor 37 is connected to the wiring WL. The back gate of the transistor 37 is connected to the wiring CL.

The wiring PL is a wiring for supplying a fixed potential for retaining a potential of the capacitor 38. The wiring CL has a constant potential for controlling the threshold voltage of the transistor 37. The wiring PL and the wiring CL may have the same potential. In that case, the number of wirings connected to the memory cell 32 can be reduced by connecting the two wirings.

Figure 14A:
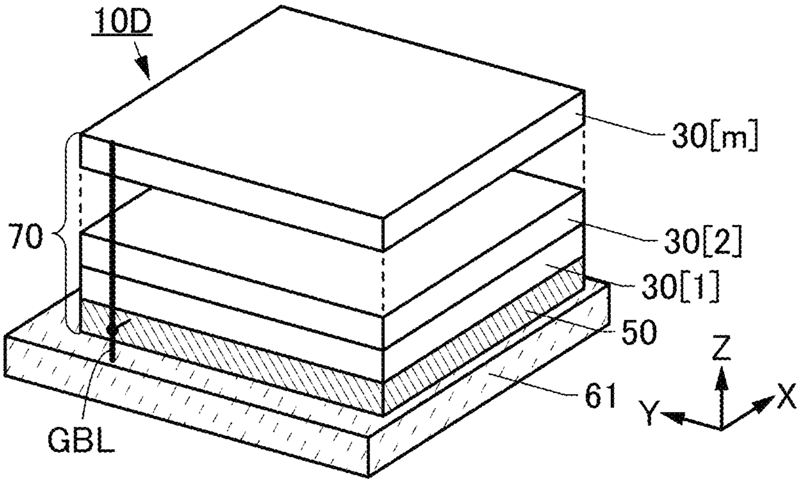
FIG. 14A and FIG. 14B are diagrams each illustrating a structure example of a semiconductor device.

The wiring GBL illustrated in FIG. 13B is provided to connect the amplifier circuit 51 and the driver circuit 61. FIG. 14A is a schematic view of the semiconductor device 10D including the multilayer element layer 70 including the amplifier circuit 51 and the element layers 30[1] to 30[m] as a repeating unit. Note that although FIG. 14A illustrates one of the wirings GBL, the wirings GBL are provided as appropriate depending on the number of amplifier circuits 51 provided in the element layer 50.

Note that the wiring GBL is provided in contact with a semiconductor layer of a transistor included in the amplifier circuit 51. Alternatively, the wiring GBL is provided in contact with a region functioning as a source or a drain in the semiconductor layer of the transistor included in the amplifier circuit 51. Alternatively, the wiring GBL is provided in contact with a conductor provided in contact with the region functioning as the source or the drain in the semiconductor layer of the transistor included in the amplifier circuit 51. That is, the wiring GBL can be regarded as a wiring for connecting one of the source and the drain of the transistor included in the amplifier circuit 51 in the element layer 50 to the element layer 20 in the perpendicular direction.

Figure 14B:
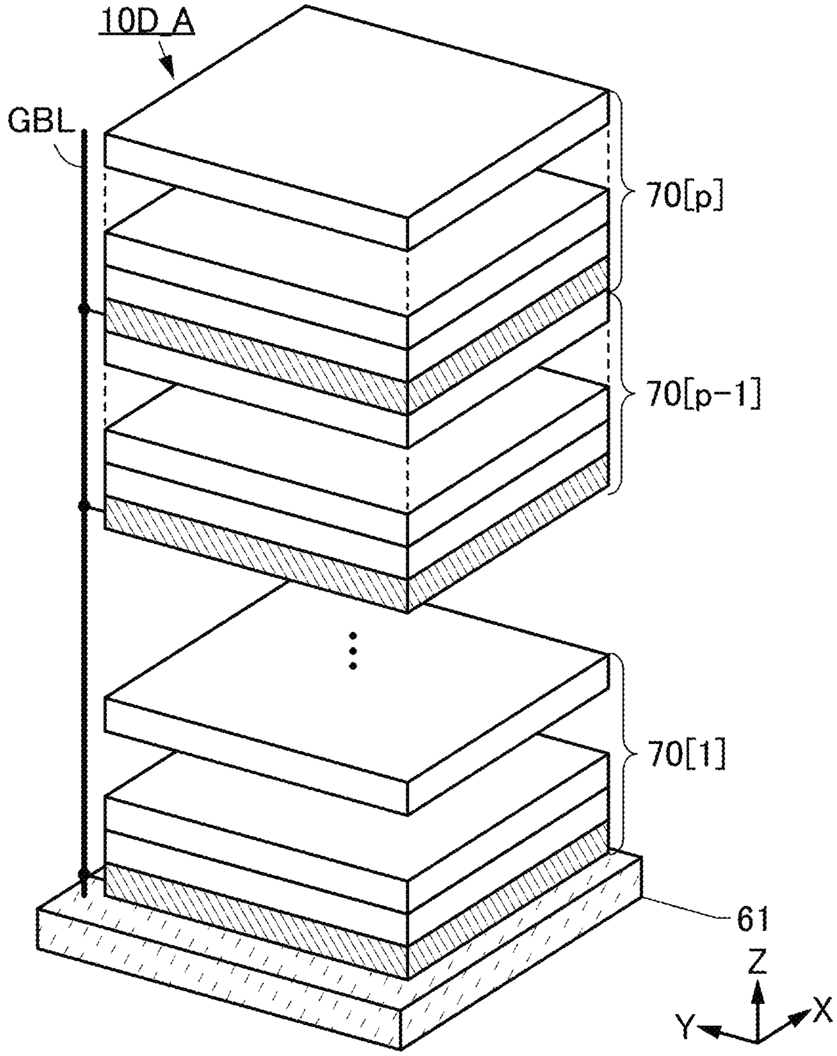

The multilayer element layers 70 including the amplifier circuit 51 and the element layers 30[1] to 30[m] may be stacked. A semiconductor device 10D_A of one embodiment of the present invention can include multilayer element layers 70[1] to 70[p] (p is an integer greater than or equal to 2) as illustrated in FIG. 14B. The wiring GBL is connected to the element layers 50 included in the multilayer element layers 70. The wirings GBL are provided as appropriate depending on the number of amplifier circuits 51.

In one embodiment of the present invention, the OS transistors are provided to be stacked, and the wiring functioning as the bit line is placed in the direction perpendicular to the surface of the substrate provided with the element layer 20. When the wiring that is provided to extend from the element layer 30 and functions as the bit line is provided in the direction perpendicular to the surface of the substrate, the length of the wiring between the element layer 30 and the element layer 20 can be shortened. Thus, the parasitic capacitance of the bit line can be significantly reduced.

In one embodiment of the present invention, the element layer 50 including the amplifier circuit 51 having functions of amplifying and outputting a data potential retained in the memory cell 32 is provided in the layer where the element layer 30 is provided. With this structure, a slight difference in the potential of the wiring BL functioning as the bit line can be amplified at the time of data reading to drive the sense amplifier 66 included in the element layer 20. A circuit such as the sense amplifier can be downsized, so that the semiconductor device 10D can be downsized. Moreover, operation is possible even when the capacitance of the capacitors included in the memory cells 32 is reduced.

[Structure Example of Memory Cell 32, Amplifier Circuit 51, and Control Circuit 81]

Figure 15A:
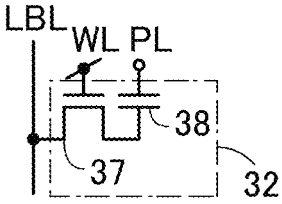
FIG. 15A to FIG. 15D are diagrams each illustrating a structure example of a semiconductor device.
Figure 15B:
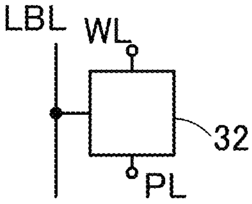

FIG. 15A and FIG. 15B show a circuit diagram corresponding to the memory cell 32 illustrated in FIG. 13B or the like and a diagram illustrating a circuit block corresponding to the circuit diagram. As illustrated in FIG. 15A and FIG. 15B, the memory cell 32 is sometimes illustrated as a block in the drawing and the like. Note that a wiring LBL connected to the memory cell 32 as illustrated in FIG. 15A and FIG. 15B can be represented as the wiring LBL functioning as a local bit line to be distinguished from other wirings functioning as bit lines. The wiring WL can be represented as the wiring WL functioning as the word line to be distinguished from the other wirings.

Figure 15C:
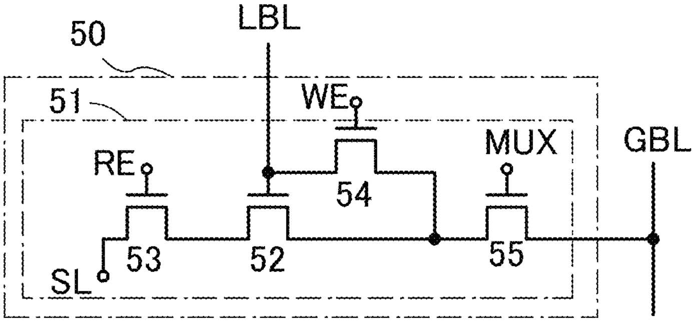
Figure 15D:
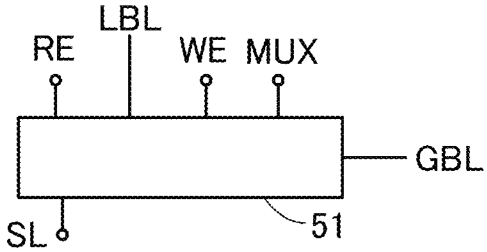

FIG. 15C and FIG. 15D show a circuit diagram corresponding to the element layer 50 including the amplifier circuit 51 illustrated in FIG. 12 or the like and a diagram illustrating a circuit block corresponding to the circuit diagram. As illustrated in FIG. 15C and FIG. 15D, the amplifier circuit 51 including transistors 52 to 55 is sometimes illustrated as a block of the amplifier circuit 51 in the drawing and the like. The amplifier circuit 51 has functions of amplifying the potential of the wiring LBL and transmitting the amplified potential to the wiring GBL. Moreover, the amplifier circuit 51 can perform operation in which a fluctuation in the threshold voltage of the transistor 52 is corrected by providing a correction period. The wiring GBL can be represented as the wiring GBL functioning as a global bit line to be distinguished from other wirings functioning as bit lines. Signals WE, RE, and MUX are control signals for controlling the amplifier circuit 51. The wiring SL is a wiring supplying a constant potential.

Figure 16A:
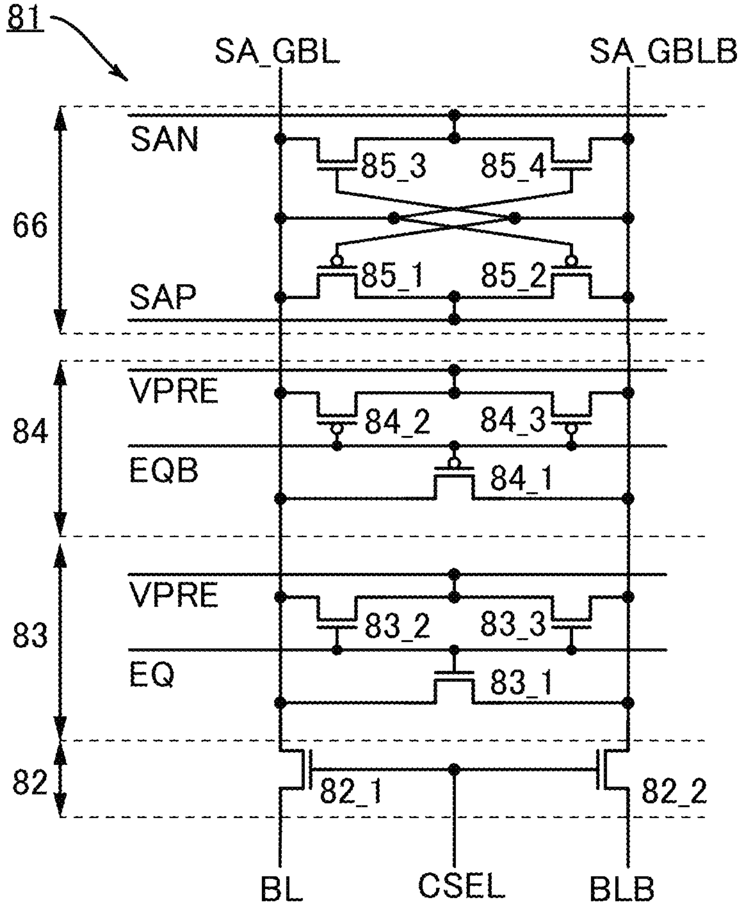
FIG. 16A and FIG. 16B are diagrams illustrating a structure example of a semiconductor device.

FIG. 16A illustrates a circuit structure example of a control circuit 81 including the sense amplifier 66 described with FIG. 12 and the like. The control circuit 81 includes a switch circuit 82, a precharge circuit 83, a precharge circuit 84, the sense amplifier 66, and a wiring SA_GBL, a wiring SA_GBLB, and wirings BL and BLB, that are connected to the control circuit 81.

The switch circuit 82 includes, for example, n-channel transistors 82_1 and 82_2, as illustrated in FIG. 16A. The transistors 82_1 and 82_2 switch electrical continuity between the wiring SA_GBL and the wiring BL and between the wiring SA_GBLB and the wiring BLB in response to a signal CSEL; the wiring SA_GBL and the wiring SA_GBLB form a wiring pair and the wiring BL and the wiring BLB form a wiring pair.

The precharge circuit 83 is composed of n-channel transistors 83_1 to 83_3 as illustrated in FIG. 16A. The precharge circuit 83 is a circuit for precharging the wiring BL and the wiring BLB to an intermediate potential VPRE corresponding to half of the potential VDD in response to a signal EQ.

The precharge circuit 84 is composed of p-channel transistors 84_1 to 84_3 as illustrated in FIG. 16A. The precharge circuit 84 is a circuit for precharging the wiring BL and the wiring BLB to the intermediate potential VPRE, which corresponds to half of the potential VDD, in response to a signal EQB.

The sense amplifier 66 is composed of p-channel transistors 85_1 and 85_2 and n-channel transistors 85_3 and 85_4 that are connected to a wiring SAP or a wiring SAN, as illustrated in FIG. 16A. The wiring SAP or the wiring SAN is a wiring having a function of supplying VDD or VSS. The transistors 85_1 to 85_4 are transistors that form an inverter loop.

Figure 16B:
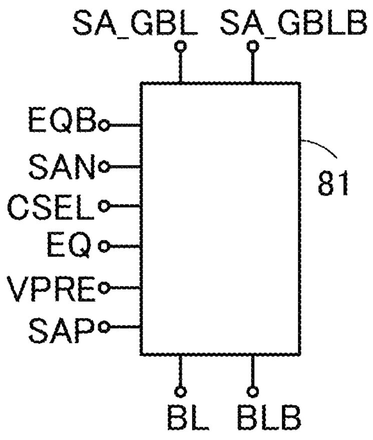

FIG. 16B illustrates a circuit block corresponding to the control circuit 81 illustrated in FIG. 16A or the like. As illustrated in FIG. 16B, the control circuit 81 is sometimes expressed as a block in the drawing and the like.

Figure 17:
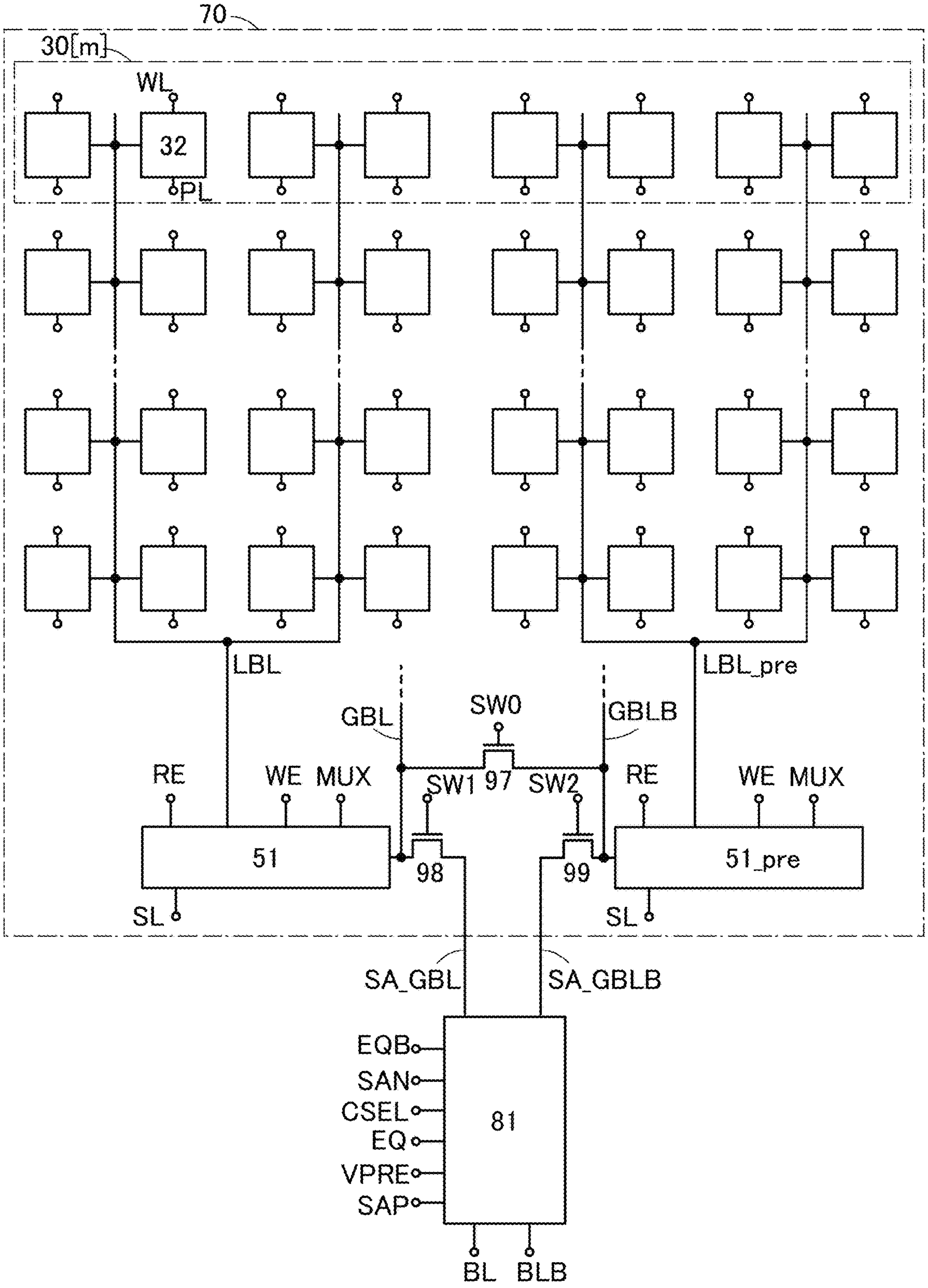
FIG. 17 is a diagram illustrating a structure example of a semiconductor device.

FIG. 17 is a circuit diagram for describing an operation example of the semiconductor device 10D in FIG. 12. In FIG. 17, the circuit blocks described with FIG. 15A to FIG. 15D, FIG. 16A, and FIG. 16B are used.

As illustrated in FIG. 17, the multilayer element layer 70 including the element layer 30[m] includes the memory cells 32. The memory cells 32 are connected to the wiring LBL and a wiring LBL_pre that are paired together. The memory cells 32 connected to the wiring LBL are memory cells to/from which data is written or read. The wiring LBL_pre is a local bit line to be precharged, and the memory cells 32 connected to the wiring LBL_pre continue to retain data.

The wiring LBL is connected to the wiring GBL through the amplifier circuit 51. The wiring LBL_pre is connected to a wiring GBLB through an amplifier circuit 51_pre.

A transistor 97 functions as a switch for switching electrical continuity and discontinuity between the wiring GBL and the wiring GBLB. The on/off state of the transistor 97 is switched by a signal SW0.

A transistor 98 functions as a switch for switching electrical continuity and discontinuity between the wiring GBL and the wiring SA_GBL positioned on the control circuit 81 side. The on/off state of the transistor 98 is switched by a signal SW1.

A transistor 99 functions as a switch for switching electrical continuity and discontinuity between the wiring GBLB and the wiring SA_GBLB positioned on the control circuit 81 side. The on/off state of the transistor 99 is switched by a signal SW2.

As illustrated in FIG. 17, the memory cell 32 can be connected to the amplifier circuit 51 and the control circuit 81 through the wiring LBL and the wiring GBL provided in the perpendicular direction, i.e., in the shortest distance. Even with the addition of the element layer 50 including the transistors that constitute the amplifier circuits 51, a reduction in the load of the wiring LBL can shorten the write time or facilitate data reading.

As illustrated in FIG. 17, transistors included in the amplifier circuits 51 and 51_pre are controlled in accordance with the signals WE, RE, and MUX. The transistors can output the potential of the wiring LBL to the control circuit 81 through the wiring in accordance with the signals. The amplifier circuits 51 and 51_pre can each function as a sense amplifier that consists of OS transistors. With this structure, a slight difference in the potential of the wiring LBL can be amplified at the time of reading to drive the sense amplifier 66.

[Operation Example of Memory Cell 32, Amplifier Circuit 51, and Control Circuit 81]

Figure 18:
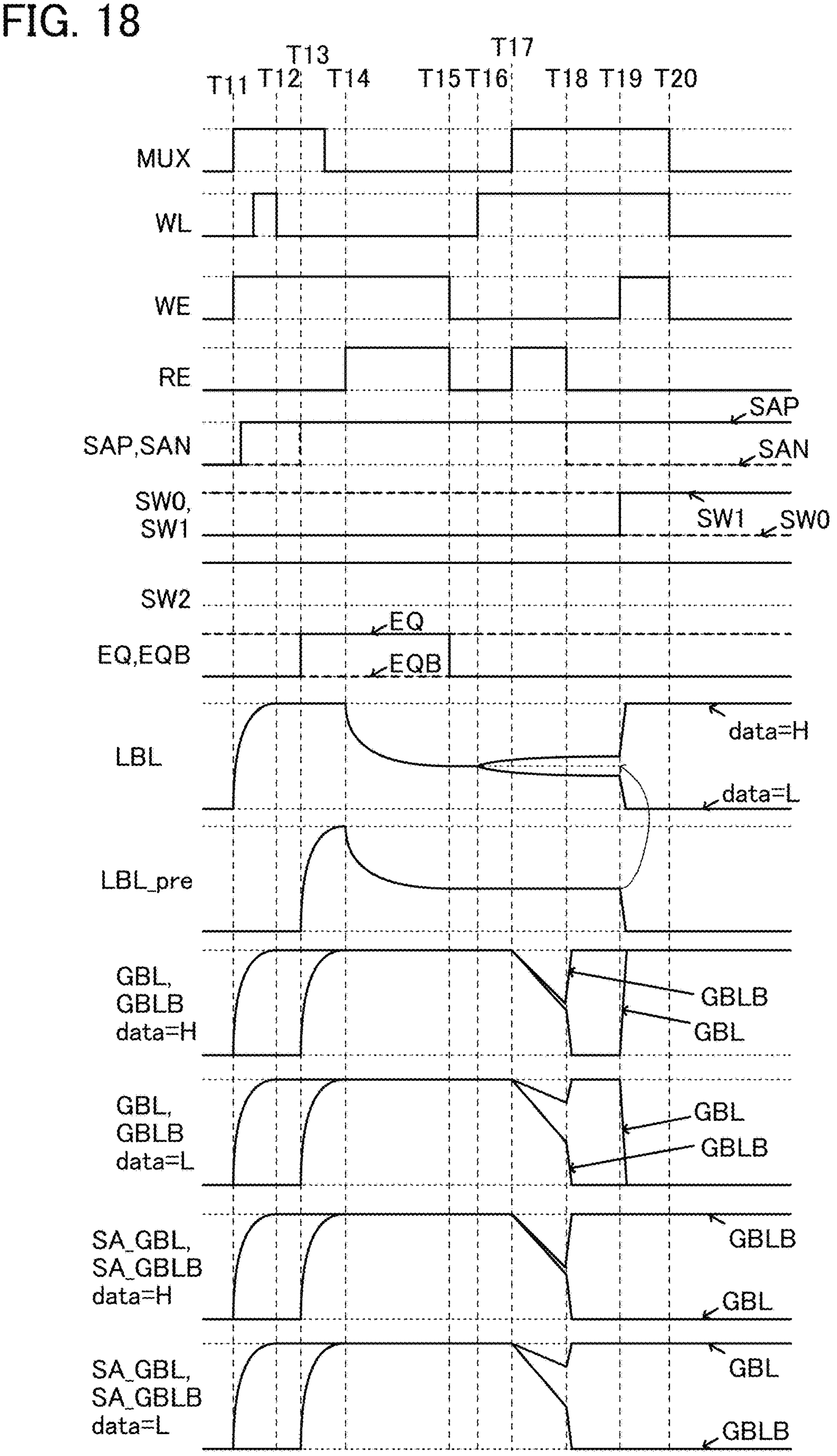
FIG. 18 is a diagram illustrating a structure example of a semiconductor device.

FIG. 18 is a timing chart for describing the operation of the circuit diagram shown in FIG. 17, and an operation example of the memory cell 32, the amplifier circuit 51, and the control circuit 81 is described. Note that the timing chart in FIG. 18 separately shows the case where data is at H level (data=H) and the case where data is at L level (data=L), for the wiring pair of the wiring SA_GBL and the wiring SA_GBLB and the wiring pair of the wiring GBL and the wiring GBLB.

In the timing chart in FIG. 18, Time T11 to Time T13 correspond to a period for data writing. Time T13 to Time T16 correspond to a correction period. Time T16 to Time T18 correspond to a period for data reading. Note that the signal CSEL is set to H level from Time T11 to T20.

At Time T11, the signal MUX and the signal WE are set to H level. The signals SW1 and SW2 are set to H level, and the signal SW0 is set to L level. Then, the power supply voltages (VDD and VSS) are applied to the wirings SAP and SAN, thereby charging one of the wiring SA_GBL and the wiring SA_GBLB, which form the wiring pair, and one of the wiring GBL and the wiring GBLB, which form the wiring pair. The potential of the wiring LBL increases. The potential of the wiring WL is set to H level, and the potential applied to the wiring LBL (H level in the case of FIG. 18) is written to the memory cell 32.

At Time T12, the potential of the wiring WL is set to L level. Data is retained in the memory cell 32.

At Time T13, both the wirings SAP and SAN are set to VDD, and the signals EQ and EQB are inverted, whereby both the wiring pair of the wiring SA_GBL and the wiring SA_GBLB and the wiring pair of the wiring GBL and the wiring GBLB are set to H level. The wiring LBL_pre is precharged to an H-level potential. After that, the signal MUX is set to L level. The signal WE may be also set to low level.

At Time T14, the signal RE and the signal WE are set to H level. The potential of the wiring LBL and the potential of the wiring LBL_pre decrease by discharge through the transistor 52. This discharge stops when the voltage between the gate and the source of the transistor 52 becomes equal to the threshold voltage of the transistor 52.

At Time T15, both the signal WE and the signal RE are set to L level. A potential corresponding to the threshold voltage of the transistor 52 is retained in the wiring LBL and the wiring LBL_pre. The signals EQ and EQB are inverted again, and precharge is stopped. That is, the wiring pair of the wiring SA_GBL and the wiring SA_GBLB and the wiring pair of the wiring GBL and the wiring GBLB are brought into an electrically floating state, or a floating state.

At Time T16, the wiring WL is set to H level to perform charge sharing. The potential of the wiring LBL varies in accordance with the data written to the memory cell 32. When H-level data is written to the memory cell 32, the potential of the wiring LBL increases, and when L-level data is written to the memory cell 32, the potential of the wiring LBL decreases. Meanwhile, the potential of the wiring LBL_pre does not vary because the charge sharing by the operation of the wiring WL is not performed in the wiring LBL_pre.

At Time T17, the signal RE and the signal MUX are set to H level, whereby current flows through the transistor 52 included in the amplifier circuit 51 and the transistor 52 included in the amplifier circuit 51_pre in accordance with the potentials of the wiring LBL and the wiring LBL_pre. Since the potentials of the wiring LBL and the wiring LBL_pre are different from each other, a difference occurs between current flowing through the transistor 52 included in the amplifier circuit 51 and current flowing through the transistor 52 included in the amplifier circuit 51_pre. The difference in the current corresponds to the potential of the wiring LBL varying depending on the charge sharing, i.e., data read from the memory cell 32. Thus, the data of the memory cell 32 can be converted into the amount of changes in the potentials of the wiring pair of the wiring SA_GBL and the wiring SA_GBLB and the wiring pair of the wiring GBL and the wiring GBLB, as shown in FIG. 18.

At Time T18, the signal RE is set to L level. Then, the power supply voltages (VDD and VSS) are applied to the wirings SAP and SAN, whereby the sense amplifier 66 is operated. When the sense amplifier 66 operates, the potentials of the wiring pair of the wiring SA_GBL and the wiring SA_GBLB and the wiring pair of the wiring GBL and the wiring GBLB are determined.

At Time T19, the signal SW0 is set to L level and the signal SW1 is set to H level, and the potentials of the wiring pair of the wiring GBL and the wiring GBLB are switched in accordance with the read data. Specifically, when the data is at H level, the potentials of the wiring GBL and the wiring GBLB, which form the wiring pair, are both switched to H level. When the data is at L level, the potentials of the wiring GBL and the wiring GBLB, which form the wiring pair, are both switched to L level. By setting the wiring WL to H level in this state, the voltage corresponding to the logic of the read data can be written back to the memory cell 32.

At Time T20, the signal MUX, the wiring WL, and the signal WE are set to L level. In the memory cell 32, data corresponding to the logic of the read data can be refreshed.

Note that in the semiconductor device 10 of one embodiment of the present invention, the element layers 30 including the memory cells 32 are stacked. In this structure, the wiring LBL can be shortened, and the capacitance of the capacitor 38 in the memory cell 32 can be reduced.

In the semiconductor device of one embodiment of the present invention, OS transistors with an extremely low off-state current are used as the transistors provided in the element layers 30. The OS transistors can be provided in stacked layers over the substrate where the element layer 20 provided with Si transistors is provided. Thus, the OS transistors can be manufactured in the perpendicular direction by repeating the same manufacturing process, so that manufacturing cost can be reduced. Furthermore, in one embodiment of the present invention, the memory density can be increased by arranging the transistors included in the memory cells 32 in not the plane direction but the perpendicular direction, whereby the semiconductor device can be downsized.

In addition, one embodiment of the present invention is provided with the element layer 50 including the amplifier circuits 51. In the functional circuit, the wiring LBL is connected to the gate of the transistor 52; thus, the transistor 52 can function as an amplifier. With this structure, a slight difference in the potential of the wiring LBL can be amplified at the time of reading to drive the sense amplifier 66 formed using Si transistors. Since the circuit such as the sense amplifier 66 formed using Si transistors can be downsized, the semiconductor device can be downsized. Moreover, operation is possible even when the capacitance of the capacitors 38 included in the memory cells 32 is reduced.

[Variation Example of Semiconductor Device]

Next, as a variation example of the semiconductor device 10, the case where a CPU including a backup circuit is used as the arithmetic circuit 23 will be described. Combining a backup circuit including an OS transistor with a register or the like in a CPU can achieve a normally-off CPU (NoffCPU (registered trademark)).

In the NoffCPU, power supply to a circuit that does not need to operate can be stopped so that the circuit can be set in a standby state. The circuit set in the standby state because of the stop of power supply does not consume power. Thus, the power usage of the NoffCPU can be minimized.

Figure 19:
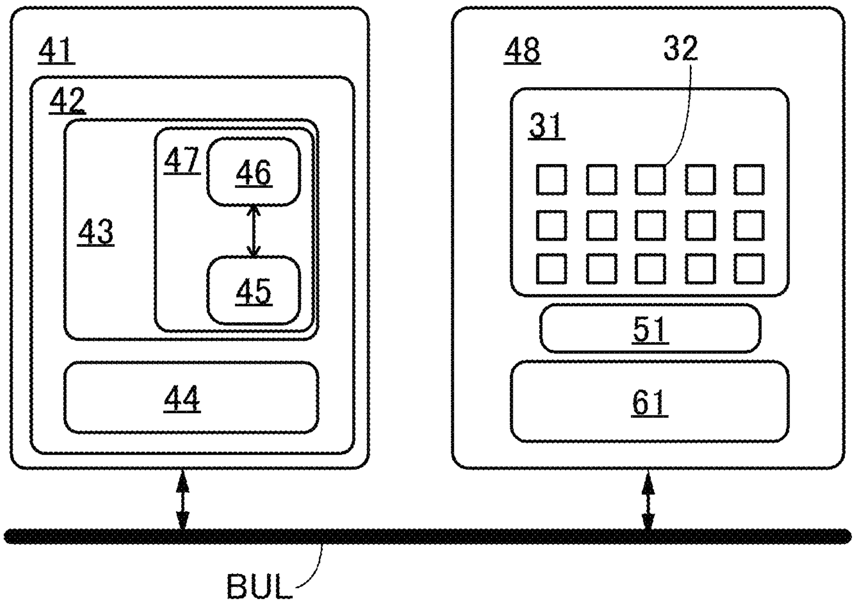
FIG. 19 is a diagram illustrating a structure example of a semiconductor device.

FIG. 19 is a block diagram in which a CPU 41 is connected to a memory circuit 48 through a bus BUL. The CPU 41 has a function of performing arithmetic operation for executing a program.

The CPU 41 illustrated in FIG. 19 includes a CPU core 42. The CPU core 42 includes a register portion 43 and an arithmetic portion 44. The register portion 43 includes a flip-flop 47. The flip-flop 47 includes a scan flip-flop 45 and a backup circuit 46.

The memory circuit 48 illustrated in FIG. 19 includes the memory cell array 31 including the memory cells 32, the amplifier circuit 51, and the driver circuit 61.

Figure 20A:
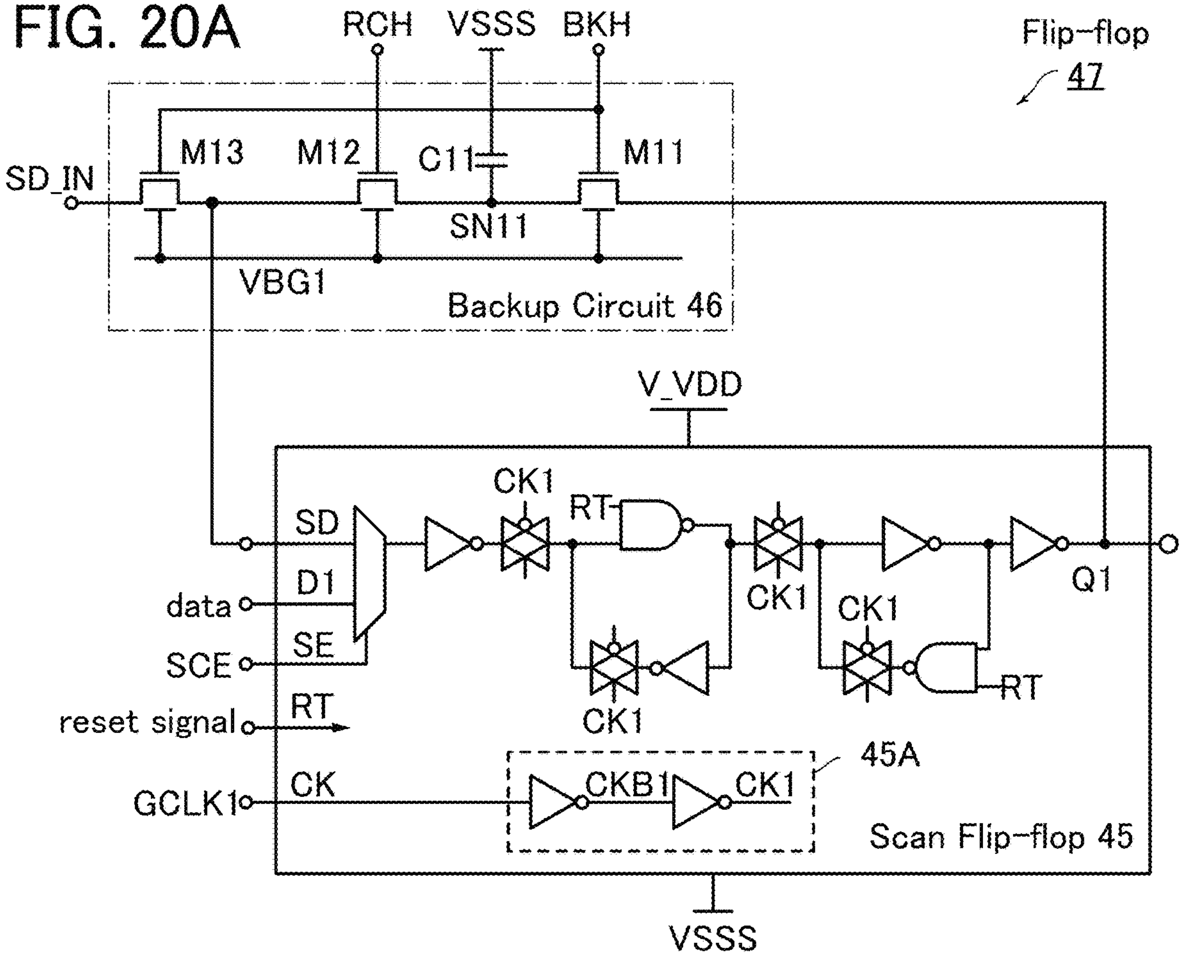
FIG. 20A and FIG. 20B are diagrams each illustrating a structure example of a semiconductor device.

FIG. 20A shows a circuit structure example of the flip-flop 47.

The scan flip-flop 45 includes nodes D1, Q1, SD, SE, RT, and CK and a clock buffer circuit 45A.

The node D1 is a data input node, the node Q1 is a data output node, and the node SD is a scan test data input node. The node SE is a signal SCE input node. The node CK is a clock signal GCLK1 input node. The clock signal GCLK1 is input to the clock buffer circuit 45A. Respective analog switches in the scan flip-flop 45 are connected to nodes CK1 and CKB1 of the clock buffer circuit 45A. The node RT is a reset signal input node. The node SE is a scan enable signal input node.

The circuit structure of the scan flip-flop 45 is not limited to that in FIG. 20A. A flip-flop prepared in a standard circuit library can be employed.

The backup circuit 46 includes nodes SD_IN and SN11, transistors M11 to M13, and a capacitor C11.

The node SD_IN is a scan test data input node and is connected to the node Q1 of the scan flip-flop 45. The node SN11 is a retention node of the backup circuit 46. The capacitor C11 is a storage capacitor for retaining the voltage of the node SN11.

The transistor M11 controls electrical continuity between the node Q1 and the node SN11. The transistor M12 controls electrical continuity between the node SN11 and the node SD. The transistor M13 controls electrical continuity between the node SD_IN and the node SD. The on/off states of the transistors M11 and M13 are controlled by a signal BKH, and the on/off state of the transistor M12 is controlled by a signal RCH.

The transistors M11 to M13 are OS transistors like the transistors included in the memory cell 32 and the amplifier circuit 51. The transistors M11 to M13 have back gates in the illustrated structure. In the illustrated example, the back gates of the transistors M11 to M13 are connected to a power supply line for supplying the voltage VBG1.

At least the transistors M11 and M12 are preferably OS transistors. Because of extremely low off-state current, which is a feature of the OS transistor, a decrease in the voltage of the node SN11 can be suppressed and almost no electric power is consumed to retain data; therefore, the backup circuit 46 has nonvolatile properties. Data is rewritten by charge and discharge of the capacitor C11; hence, there is theoretically no limitation on rewrite cycles of the backup circuit 46, and data can be written and read with low energy.

Figure 20B:
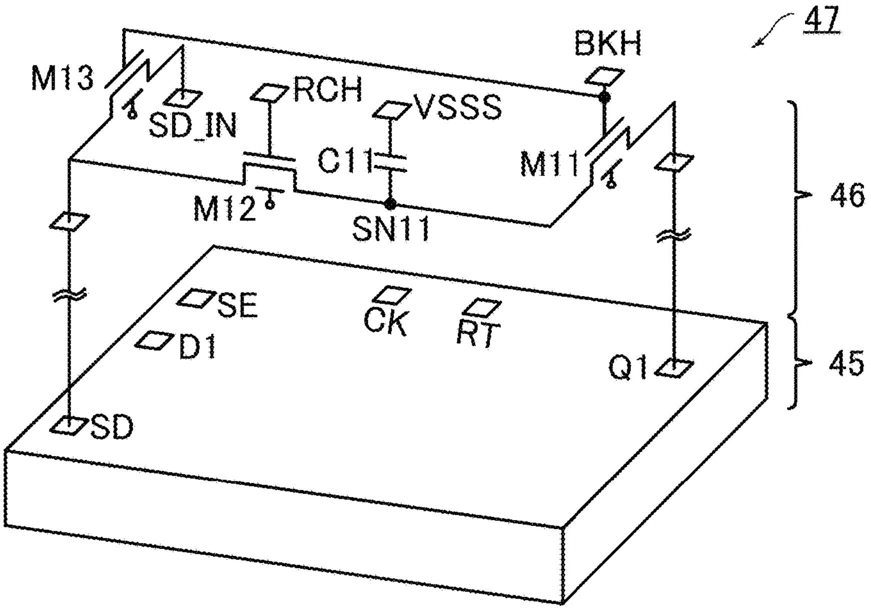

All of the transistors in the backup circuit 46 are highly preferably OS transistors. As illustrated in FIG. 20B, the backup circuit 46 can be stacked on the scan flip-flop 45 configured with a silicon CMOS circuit.

The number of elements is much smaller in the backup circuit 46 than in the scan flip-flop 45; thus, there is no need to change the circuit structure and layout of the scan flip-flop 45 in order to stack the backup circuit 46. That is, the backup circuit 46 is a highly versatile backup circuit. In addition, the backup circuit 46 can be provided to overlap with a region where the scan flip-flop 45 is formed; hence, even when the backup circuit 46 is incorporated, the area overhead of the flip-flop 47 can be zero. Accordingly, providing the backup circuit 46 in the flip-flop 47 enables power gating of the CPU core 42. The CPU core 42 can be power-gated with high efficiency owing to little energy necessary for the power gating.

When the backup circuit 46 is provided, parasitic capacitance due to the transistor M11 is added to the node Q1. However, the parasitic capacitance is lower than parasitic capacitance due to a logic circuit connected to the node Q1, and thus does not adversely affect the operation of the scan flip-flop 45. That is, even when the backup circuit 46 is provided, the performance of the flip-flop 47 does not substantially decrease.

As a low-power-consumption state (non-operation state) of the CPU core 42, a clock gating state, a power gating state, and a resting state can be set, for example. For example, in the case of transition from a normal operation state to a clock gating state, the supply of the clock signal GCLK1 is stopped.

In the case where the CPU core 42 transitions from a normal operation state to a power gating state, data in the scan flip-flop 45 is backed up to the backup circuit 46. When the CPU core 42 is returned from the power gating state to the normal operation state, recovery operation of writing back data in the backup circuit 46 to the scan flip-flop 45 is performed.

In the CPU 41 and the memory circuit 48 illustrated in FIG. 19, when the transistors included in the backup circuit 46, the amplifier circuit 51, and the memory cell 32 are OS transistors, layers including the OS transistors can be stacked in the direction perpendicular to the surface of the substrate where the Si transistors are provided (also referred to as the z direction).

Figure 21A:
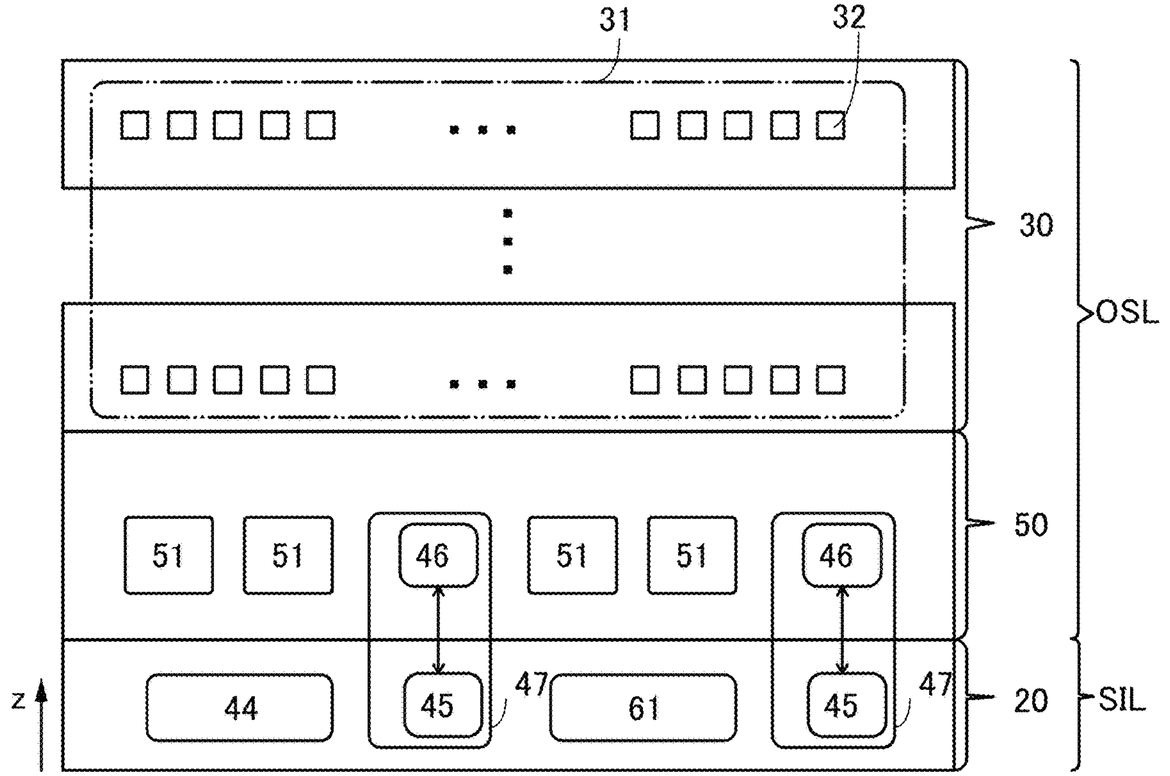
FIG. 21A and FIG. 21B are diagrams each illustrating a structure example of a semiconductor device.

FIG. 21A is a schematic cross-sectional view in which a layer including Si transistors and a layer including OS transistors are stacked, schematically illustrating the arrangement of the components illustrated in FIG. 19. In FIG. 21A, a layer SIL including Si transistors and a layer OSL including OS transistors are provided to be stacked in the z direction. In the layer OSL including OS transistors, a plurality of layers including OS transistors can be stacked; the element layer 50 and the element layers 30 described above are illustrated as an example. Note that a wiring layer or the like can be provided as appropriate between the layers including transistors.

In the schematic cross-sectional view illustrated in FIG. 21A, the arithmetic portion 44 and the scan flip-flop 45 included in the CPU 41 and the driver circuit 61 included in the memory circuit 48, which are described with FIG. 19, can be provided in the layer SIL. In the element layer 50 provided over the layer SIL, the backup circuit 46 connected to the scan flip-flop 45 and the amplifier circuit 51 included in the memory circuit 48 can be provided. Furthermore, the memory cell array 31 can be provided in the element layer 30 provided over the element layer 50. Since the memory cells 32 included in the memory cell array 31 can be provided in stacked layers, the density of memory cells 32 per unit area can be increased.

As illustrated in FIG. 21A, the element layer 50 including the backup circuit 46 included in the CPU 41 and the amplifier circuit 51 included in the memory circuit 48 can be provided over the layer SIL where a Si CMOS circuit can be provided, and the element layers 30 including the memory cells 32 can be stacked thereover. That is, a structure where the memory circuit 48, such as a DOSRAM, is monolithically stacked over the CPU 41 (an on-chip memory) can be achieved. The on-chip memory structure allows an interface portion between the CPU and the memory to operate at high speed. With the on-chip memory structure, the size of a connection wiring and the like can be reduced; thus, the number of connection pins can be increased. An increase in the number of connection pins enables parallel operations, which can increase the bandwidth of the memory (also referred to as memory bandwidth).

Figure 21B:
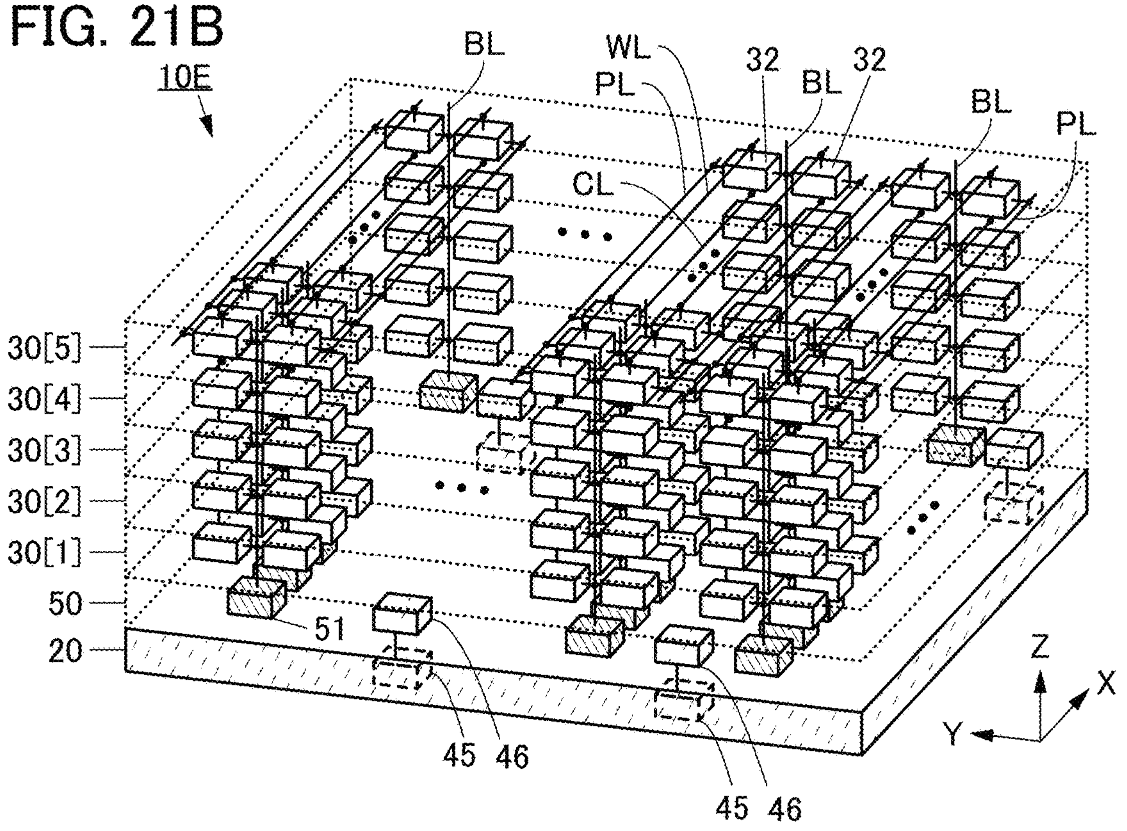

A semiconductor device 10E illustrated in FIG. 21B shows examples of the scan flip-flop 45 provided in the element layer 20 and the backup circuit 46 provided in the element layer 50 in the perspective view illustrated in FIG. 13A. In the element layer 50, providing the amplifier circuit 51 and the backup circuit 46 in a common layer can reduce the number of element layers including OS transistors. As illustrated in FIG. 21B, the backup circuit 46 can be placed directly over the scan flip-flop 45, and a region where the amplifier circuit 51 is not provided in the element layer 50 can be effectively used.

With the structure of integrating the circuits in the three-dimensional direction as illustrated in FIG. 21A and FIG. 21B, wirings that connect the circuits in different layers can be shorter than those in a stacked-layer structure using a through silicon via (TSV) or the like; hence, the parasitic capacitance of the wirings can be reduced. Power consumption needed for charging and discharging the wirings can be reduced. Consequently, the arithmetic processing efficiency can be improved. In the structure illustrated in FIG. 21A and FIG. 21B, the circuit area can be reduced. Thus, power consumption can be reduced owing to a reduction in circuit area.

This embodiment can be combined as appropriate with any of the other embodiments and the like described in this specification.

Embodiment 3

In this embodiment, structures of transistors that can be used in the semiconductor device described in the above embodiment will be described. As an example, a structure in which transistors having different electrical characteristics are stacked will be described. With this structure, the degree of freedom in design of a semiconductor device can be increased. In addition, providing transistors having different electrical characteristics to be stacked can increase the integration degree of the semiconductor device.

Figure 22:
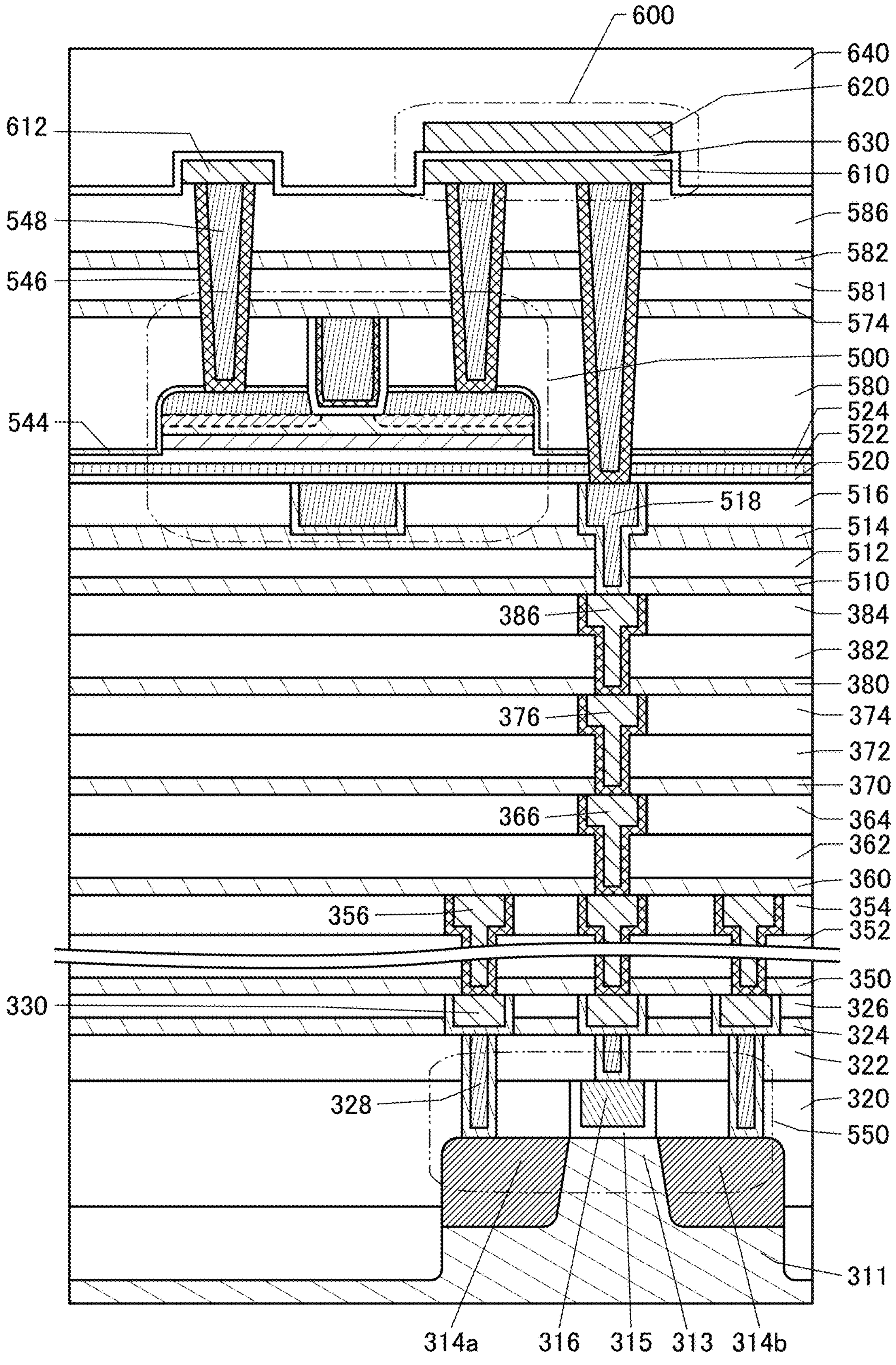
FIG. 22 is a diagram illustrating a structure example of a semiconductor device.
Figure 23A:
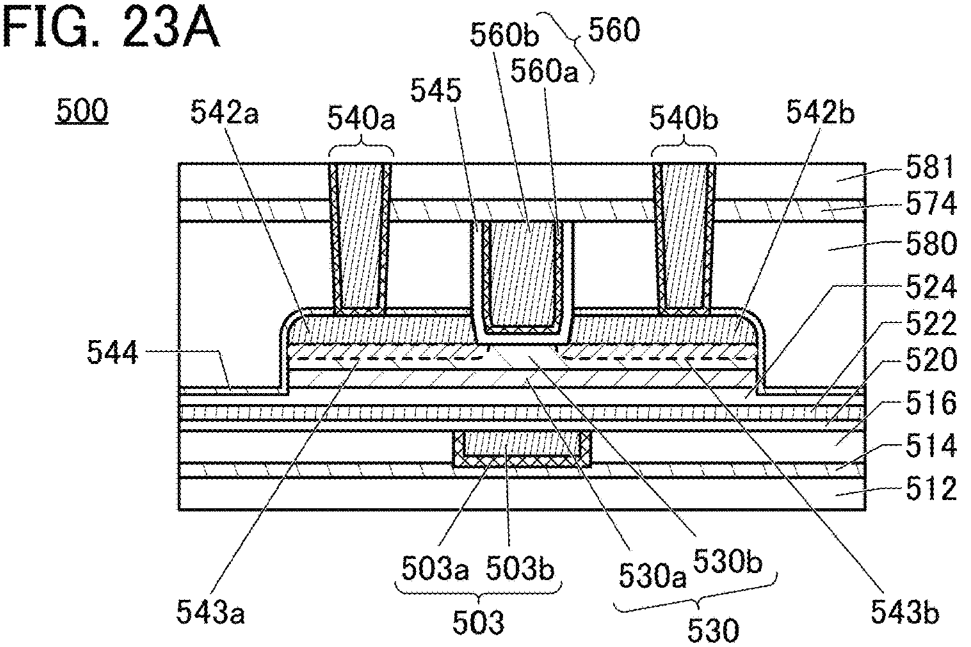
FIG. 23A to FIG. 23C are diagrams each illustrating a structure example of a semiconductor device.
Figure 23B:
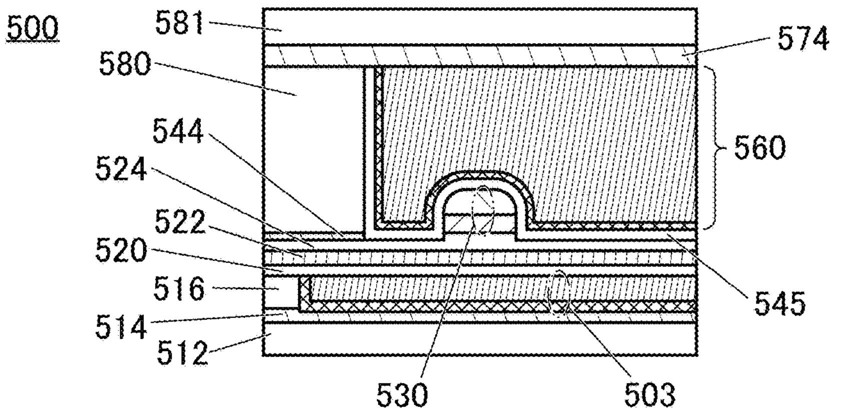
Figure 23C:
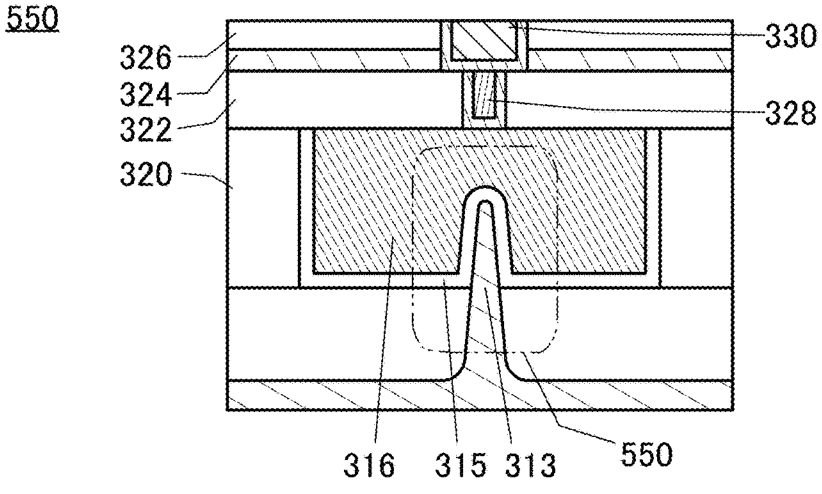

FIG. 22 illustrates part of a cross-sectional structure of a semiconductor device. The semiconductor device illustrated in FIG. 22 includes a transistor 550, a transistor 500, and a capacitor 600. FIG. 23A is a cross-sectional view of the transistor 500 in the channel length direction, FIG. 23B is a cross-sectional view of the transistor 500 in the channel width direction, and FIG. 23C is a cross-sectional view of the transistor 550 in the channel width direction. For example, the transistor 500 corresponds to the Si transistor described in the above embodiment, and the transistor 550 corresponds to an OS transistor.

In FIG. 22, the transistor 500 is provided above the transistor 550, and the capacitor 600 is provided above the transistor 550 and the transistor 500.

The transistor 550 is provided on a substrate 311 and includes a conductor 316, an insulator 315, a semiconductor region 313 that is part of the substrate 311, and a low-resistance region 314*a* and a low-resistance region 314*b* each functioning as a source region or a drain region.

As illustrated in FIG. 23C, the top surface and the side surface in the channel width direction of the semiconductor region 313 of the transistor 550 are covered with the conductor 316 with the insulator 315 positioned therebetween. Such a Fin-type transistor 550 can have an increased effective channel width and thus have improved on-state characteristics. In addition, contribution of the electric field of a gate electrode can be increased, so that the off-state characteristics of the transistor 550 can be improved.

Note that the transistor 550 may be either a p-channel transistor or an n-channel transistor.

A region of the semiconductor region 313 where a channel is formed, a region in the vicinity thereof, the low-resistance region 314*a* and the low-resistance region 314*b* each functioning as a source region or a drain region, and the like preferably include a semiconductor such as a silicon-based semiconductor, and preferably include single crystal silicon. Alternatively, the regions may be formed using a material containing Ge (germanium), SiGe (silicon germanium), GaAs (gallium arsenide), GaAlAs (gallium aluminum arsenide), or the like. A structure using silicon whose effective mass is controlled by applying stress to a crystal lattice and changing lattice spacing may be employed. Alternatively, the transistor 550 may be a HEMT (High Electron Mobility Transistor) using GaAs and GaAlAs, or the like.

The low-resistance region 314*a* and the low-resistance region 314*b* include an element that imparts n-type conductivity, such as arsenic or phosphorus, or an element that imparts p-type conductivity, such as boron, in addition to the semiconductor material used for the semiconductor region 313.

For the conductor 316 functioning as a gate electrode, it is possible to use a semiconductor material such as silicon containing the element that imparts n-type conductivity, such as arsenic or phosphorus, or the element that imparts p-type conductivity, such as boron, or a conductive material such as a metal material, an alloy material, or a metal oxide material.

Note that since a work function depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The transistor 550 may be formed using an SOI (silicon on Insulator) substrate or the like.

As the SOI substrate, any of the following substrates may be used: a SIMOX (Separation by Implanted Oxygen) substrate formed in such a manner that an oxygen ion is implanted into a mirror-polished wafer, and then, an oxide layer is formed at a certain depth from the surface and defects generated in a surface layer are eliminated by high-temperature annealing, and an SOI substrate formed by a Smart-Cut method in which a semiconductor substrate is cleaved by utilizing growth of a minute void, which is formed by implantation of a hydrogen ion, by heat treatment; an ELTRAN method (registered trademark: Epitaxial Layer Transfer); or the like. A transistor formed using a single crystal substrate includes a single crystal semiconductor in a channel formation region.

An insulator 320, an insulator 322, an insulator 324, and an insulator 326 are sequentially stacked and provided to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 550 or the like provided below the insulator 322. For example, the top surface of the insulator 322 may be planarized by planarization treatment using a chemical mechanical polishing (CMP) method or the like to have improved planarity.

For the insulator 324, it is preferable to use a film having a barrier property that prevents diffusion of hydrogen, impurities, or the like from the substrate 311, the transistor 550, or the like into a region where the transistor 500 is provided.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Thus, a film that inhibits hydrogen diffusion is preferably provided between the transistor 500 and the transistor 550. The film that inhibits hydrogen diffusion is specifically a film from which a small amount of hydrogen is released.

The amount of released hydrogen can be measured by thermal desorption spectroscopy (TDS) or the like, for example. The amount of hydrogen released from the insulator 324 that is converted into hydrogen atoms per area of the insulator 324 is less than or equal to $1\times10^{16}$ atoms/cm$^2$, preferably less than or equal to $5\times10^{15}$ atoms/cm$^2$, in TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. In addition, the relative permittivity of the insulator 326 is, for example, preferably 0.7 times or less, further preferably 0.6 times or less the relative permittivity of the insulator 324. When a material with low permittivity is used for the interlayer film, parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. A plurality of conductors functioning as plugs or wirings are collectively denoted by the same reference numeral in some cases. In this specification and the like, a wiring and a plug connected to the wiring may be a single component. That is, part of a conductor functions as a wiring in some cases and part of a conductor functions as a plug in other cases.

As a material for each of the plugs and wirings (the conductor 328, the conductor 330, and the like), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, an insulator 350, an insulator 352, and an insulator 354 are stacked sequentially in FIG. 22. Furthermore, a conductor 356 is formed in the insulator 350, the insulator 352, and the insulator 354. The conductor 356 has a function of a plug or a wiring that is connected to the transistor 550. Note that the conductor 356 can be formed using a material similar to that for the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen. With this structure, the transistor 550 and the transistor 500 can be separated with a barrier layer, so that hydrogen diffusion from the transistor 550 into the transistor 500 can be inhibited.

Note that for the conductor having a barrier property against hydrogen, tantalum nitride or the like is preferably used, for example. By stacking tantalum nitride and tungsten, which has high conductivity, diffusion of hydrogen from the transistor 550 can be inhibited while the conductivity as a wiring is ensured. In that case, a tantalum nitride layer having a barrier property against hydrogen is preferably in contact with the insulator 350 having a barrier property against hydrogen.

A wiring layer may be provided over the insulator 354 and the conductor 356. For example, an insulator 360, an insulator 362, and an insulator 364 are stacked sequentially in FIG. 22. Furthermore, a conductor 366 is formed in the insulator 360, the insulator 362, and the insulator 364. The conductor 366 has a function of a plug or a wiring. Note that the conductor 366 can be formed using a material similar to that for the conductor 328 and the conductor 330.

Note that for example, the insulator 360 is preferably formed using an insulator having a barrier property against hydrogen, like the insulator 324. Furthermore, the conductor 366 preferably includes a conductor having a barrier property against hydrogen. The conductor having a barrier property against hydrogen is formed particularly in an opening portion of the insulator 360 having a barrier property against hydrogen. With this structure, the transistor 550 and the transistor 500 can be separated with a barrier layer, so that hydrogen diffusion from the transistor 550 into the transistor 500 can be inhibited.

A wiring layer may be provided over the insulator 364 and the conductor 366. For example, an insulator 370, an insulator 372, and an insulator 374 are stacked sequentially in FIG. 22. Furthermore, a conductor 376 is formed in the insulator 370, the insulator 372, and the insulator 374. The conductor 376 has a function of a plug or a wiring. Note that the conductor 376 can be formed using a material similar to that for the conductor 328 and the conductor 330.

Note that for example, the insulator 370 is preferably formed using an insulator having a barrier property against hydrogen, like the insulator 324. Furthermore, the conductor 376 preferably includes a conductor having a barrier property against hydrogen. The conductor having a barrier property against hydrogen is formed particularly in an opening portion of the insulator 370 having a barrier property against hydrogen. With this structure, the transistor 550 and the transistor 500 can be separated with a barrier layer, so that hydrogen diffusion from the transistor 550 into the transistor 500 can be inhibited.

A wiring layer may be provided over the insulator 374 and the conductor 376. For example, an insulator 380, an insulator 382, and an insulator 384 are stacked sequentially in FIG. 22. Furthermore, a conductor 386 is formed in the insulator 380, the insulator 382, and the insulator 384. The conductor 386 has a function of a plug or a wiring. Note that the conductor 386 can be formed using a material similar to that for the conductor 328 and the conductor 330.

Note that for example, the insulator 380 is preferably formed using an insulator having a barrier property against hydrogen, like the insulator 324. Furthermore, the conductor 386 preferably includes a conductor having a barrier property against hydrogen. The conductor having a barrier property against hydrogen is formed particularly in an opening portion of the insulator 380 having a barrier property against hydrogen. With this structure, the transistor 550 and the transistor 500 can be separated with a barrier layer, so that hydrogen diffusion from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device according to this embodiment is not limited thereto. The number of wiring layers similar to the wiring layer including the conductor 356 may be three or less, or five or more.

An insulator 510, an insulator 512, an insulator 514, and an insulator 516 are sequentially stacked and provided over the insulator 384. A substance having a barrier property against oxygen, hydrogen, or the like is preferably used for any of the insulator 510, the insulator 512, the insulator 514, and the insulator 516.

For example, for each of the insulator 510 and the insulator 514, it is preferable to use a film having a barrier property that prevents diffusion of hydrogen, impurities, or the like from the substrate 311, a region where the transistor 550 is provided, or the like into a region where the transistor 500 is provided. Thus, a material similar to that for the insulator 324 can be used.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Thus, a film that inhibits hydrogen diffusion is preferably provided between the transistor 500 and the transistor 550. The film that inhibits hydrogen diffusion is specifically a film from which a small amount of hydrogen is released.

For the film having a barrier property against hydrogen used for each of the insulator 510 and the insulator 514, for example, a metal oxide such as aluminum oxide, hafnium oxide, or tantalum oxide is preferably used.

In particular, aluminum oxide has an excellent blocking effect that prevents passage of both oxygen and impurities such as hydrogen and moisture that cause a change in electrical characteristics of the transistor. Accordingly, the use of aluminum oxide can prevent entry of impurities such as hydrogen and moisture into the transistor 500 during and after a manufacturing process of the transistor. In addition, release of oxygen from the oxide included in the transistor 500 can be inhibited. Thus, aluminum oxide is suitably used for a protective film of the transistor 500.

The insulator 512 and the insulator 516 can be formed using a material similar to that for the insulator 320, for example. In the case where a material with relatively low permittivity is used for these insulators, the parasitic capacitance between wirings can be reduced. A silicon oxide film, a silicon oxynitride film, or the like can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be formed using a material similar to that for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated with a layer having a barrier property against oxygen, hydrogen, and water, so that hydrogen diffusion from the transistor 550 into the transistor 500 can be inhibited.

The transistor 500 is provided above the insulator 516.

As illustrated in FIGS. 23A and 23B, the transistor 500 includes the conductor 503 placed so as to be embedded in the insulator 514 and the insulator 516, an insulator 520 placed over the insulator 516 and the conductor 503, an insulator 522 placed over the insulator 520, an insulator 524 placed over the insulator 522, an oxide 530*a* placed over the insulator 524, an oxide 530*b* placed over the oxide 530*a*, a conductor 542*a* and a conductor 542*b* placed apart from each other over the oxide 530*b*, an insulator 580 that is placed over the conductor 542*a* and the conductor 542*b* and has an opening overlapping with an area between the conductor 542*a* and the conductor 542*b*, an insulator 545 placed on the bottom surface and a side surface of the opening, and a conductor 560 that is placed on the formation surface of the insulator 545.

As illustrated in FIGS. 23A and 23B, an insulator 544 is preferably placed between the insulator 580 and the oxide 530*a*, the oxide 530*b*, the conductor 542*a*, and the conductor 542*b*. In addition, as illustrated in FIGS. 23A and 23B, the conductor 560 preferably includes a conductor 560*a* provided inside the insulator 545 and a conductor 560*b* provided to be embedded inside the conductor 560*a*. Moreover, as illustrated in FIGS. 23A and 23B, an insulator 574 is preferably placed over the insulator 580, the conductor 560, and the insulator 545.

Note that in this specification and the like, the oxide 530*a* and the oxide 530*b* may be collectively referred to as an oxide 530.

Note that the transistor 500 is illustrated to have a structure in which two layers, the oxide 530*a* and the oxide 530*b*, are stacked in the region where the channel is formed and its vicinity; however, the present invention is not limited thereto. For example, a single layer of the oxide 530*b* or a stacked-layer structure of three or more layers may be provided.

Although the conductor 560 has a two-layer structure in the transistor 500, the present invention is not limited thereto. For example, the conductor 560 may have a single-layer structure or a stacked-layer structure of three or more layers. The transistor 500 illustrated in FIG. 22 and FIG. 23A is just an example and is not limited to the structure illustrated therein, and an appropriate transistor can be used in accordance with a circuit structure, a driving method, or the like.

Here, the conductor 560 functions as a gate electrode of the transistor, and the conductor 542*a* and the conductor 542*b* each function as a source electrode or a drain electrode. As described above, the conductor 560 is formed to be embedded in the opening of the insulator 580 and the region sandwiched between the conductor 542*a* and the conductor 542*b*. The positions of the conductor 560, the conductor 542*a*, and the conductor 542*b* with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

Since the conductor 560 is formed in the region between the conductor 542*a* and the conductor 542*b* in a self-aligned manner, the conductor 560 does not have a region overlapping with the conductor 542*a* or the conductor 542*b*. Thus, parasitic capacitance between the conductor 560 and each of the conductor 542*a* and the conductor 542*b* can be reduced. As a result, the transistor 500 can have increased switching speed and excellent frequency characteristics.

The conductor 560 sometimes functions as a first gate (also referred to as top gate) electrode. The conductor 503 sometimes functions as a second gate (also referred to as bottom gate) electrode. In that case, by changing a potential applied to the conductor 503 not in synchronization with but independently of a voltage applied to the conductor 560, the threshold voltage of the transistor 500 can be controlled. In particular, when a negative potential is applied to the conductor 503, the threshold voltage of the transistor 500 can be made higher than 0 V, and the off-state current can be reduced. Thus, a drain current at the time when a potential applied to the conductor 560 is 0 V can be made lower in the case where a negative potential is applied to the conductor 503 than in the case where a negative potential is not applied to the conductor 503.

The conductor 503 is positioned to overlap with the oxide 530 and the conductor 560. Accordingly, when a potential is applied to the conductor 560 and the conductor 503, an electric field generated from the conductor 560 and an electric field generated from the conductor 503 are connected, thereby covering the channel formation region in the oxide 530.

In this specification and the like, a transistor structure where a channel formation region is electrically surrounded by an electric field of a first gate electrode is referred to as a surrounded channel (S-channel) structure. The S-channel structure disclosed in this specification and the like is different from a Fin-type structure or a planar structure. Meanwhile, the S-channel structure disclosed in this specification and the like can be regarded as a kind of Fin-type structure. Note that in this specification and the like, the Fin-type structure refers to a structure where at least two or more surfaces (specifically, two surfaces, three surfaces, four surfaces, or the like) of a channel are covered with a gate electrode. With the Fin-type structure and the S-channel structure, resistance to a short-channel effect can be increased, that is, a transistor in which a short-channel effect is less likely to occur can be provided.

When the transistor has the S-channel structure, the channel formation region can be electrically surrounded.

Since the S-channel structure is a structure with the electrically surrounded channel formation region, the S-channel structure is, in a sense, equivalent to a GAA (Gate All Around) structure or a LGAA (Lateral Gate All Around) structure. In the transistor having any of the S-channel structure, GAA structure, and LGAA structure, the channel formation region that is formed at the interface between the oxide 530 and the gate insulator or in the vicinity of the interface can spread throughout the entire bulk of the oxide 530. Accordingly, the density of current flowing through the transistor can be increased, which can be expected to improve the on-state current of the transistor or increase the field-effect mobility of the transistor.

The conductor 503 has a structure similar to that of the conductor 518; a conductor 503*a* is formed in contact with an inner wall of an opening in the insulator 514 and the insulator 516, and a conductor 503*b* is formed over the conductor 503*a* so as to be embedded in the opening. Although the conductor 503*a* and the conductor 503*b* are stacked in the transistor 500, the present invention is not limited thereto. For example, the conductor 503 may have a single-layer structure or a stacked-layer structure of three or more layers.

Here, for the conductor 503*a*, it is preferable to use a conductive material that has a function of inhibiting diffusion of impurities such as a hydrogen atom, a hydrogen molecule, a water molecule, and a copper atom (a conductive material through which the impurities are less likely to pass). Alternatively, it is preferable to use a conductive material that has a function of inhibiting diffusion of oxygen (e.g., at least one of an oxygen atom, an oxygen molecule, and the like) (a conductive material through which the above oxygen is less likely to pass). Note that in this specification, the function of inhibiting diffusion of impurities or oxygen means a function of inhibiting diffusion of any one or all of the above impurities and the above oxygen.

For example, when the conductor 503*a* has a function of inhibiting diffusion of oxygen, a reduction in conductivity of the conductor 503*b* due to oxidation can be inhibited.

In the case where the conductor 503 also functions as a wiring, the conductor 503*b* is preferably formed using a conductive material with high conductivity that includes tungsten, copper, or aluminum as its main component. Although the conductor 503 is illustrated to have a stacked layer of the conductor 503*a* and the conductor 503*b* in this embodiment, the conductor 503 may have a single-layer structure.

The insulator 520, the insulator 522, and the insulator 524 have a function of a second gate insulating film.

Here, an insulator including oxygen more than that in the stoichiometric composition is preferably used as the insulator 524 in contact with the oxide 530. Such oxygen is easily released from the film by heating. In this specification and the like, oxygen released by heating is sometimes referred to as excess oxygen. That is, a region including excess oxygen (also referred to as an "excess-oxygen region") is preferably formed in the insulator 524. When such an insulator including excess oxygen is provided in contact with the oxide 530, oxygen vacancies ($V_O$) in the oxide 530 can be reduced and the reliability of the transistor 500 can be increased. Note that when hydrogen enters the oxygen vacancies in the oxide 530, such defects (hereinafter referred to as $V_OH$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that includes a large amount of hydrogen is likely to have normally-on characteristics. Moreover, hydrogen in an oxide semiconductor is easily transferred by stress such as heat or an electric field; thus, the reliability of the transistor might be reduced when the oxide semiconductor includes a large amount of hydrogen. In one embodiment of the present invention, $V_OH$ in the oxide 530 is preferably reduced as much as possible so that the oxide 530 becomes a highly purified intrinsic or substantially highly purified intrinsic oxide. In order to obtain such an oxide semiconductor with sufficiently reduced $V_OH$, it is important to remove impurities such as moisture and hydrogen in the oxide semiconductor (this treatment is also referred to as "dehydration" or "dehydrogenation treatment") and supply oxygen to the oxide semiconductor to fill oxygen vacancies (this treatment is also referred to as "oxygen adding treatment"). When an oxide semiconductor with sufficiently reduced impurities such as $V_OH$ is used for a channel formation region of a transistor, the transistor can have stable electrical characteristics.

As the insulator including the excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

Any one or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when reaction in which a bond of $V_OH$ is cut occurs, i.e., reaction of "$V_OH \rightarrow V_O + H$" occurs. Part of hydrogen generated at this time is bonded to oxygen and is removed as $H_2O$ from the oxide 530 or an insulator in the vicinity of the oxide 530 in some cases. Some hydrogen may be gettered into the conductors 542*a* and 542*b* in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The microwave treatment is performed under a pressure of 133 Pa or higher, preferably 200 Pa or higher, further preferably 400 Pa or higher. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In the manufacturing process of the transistor 500, the heat treatment is preferably performed with the surface of the oxide 530 exposed. For example, the heat treatment is performed at a temperature higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at higher than or equal to 10 ppm, higher than or equal to 1%, or higher than or equal to 10%. For example, the heat treatment is preferably performed in an oxygen atmosphere. Accordingly, oxygen can be supplied to the oxide 530 to reduce oxygen vacancies ($V_O$). Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at higher than or equal to 10 ppm, higher than or equal to 1%, or higher than or equal to 10% in order to compensate for released oxygen. Alternatively, the heat treatment may be performed in such a manner that heat treatment is performed in an atmosphere containing an oxidizing gas at higher than or equal to 10 ppm, higher than or equal to 1%, or higher than or equal to 10%, and then another heat treatment is successively performed in a nitrogen gas or inert gas atmosphere.

Note that oxygen adding treatment performed on the oxide 530 can promote reaction in which oxygen vacancies in the oxide 530 are filled with supplied oxygen, i.e., reaction of "$V_O$+O→null." Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In the case where the insulator 524 includes an excess-oxygen region, the insulator 522 preferably has a function of inhibiting diffusion of oxygen (e.g., oxygen atoms and oxygen molecules) (it is preferable that oxygen be less likely to pass through the insulator 522).

The insulator 522 preferably has a function of inhibiting diffusion of oxygen, impurities, or the like, in which case diffusion of oxygen included in the oxide 530 to the insulator 520 side is prevented. Furthermore, the conductor 503 can be inhibited from reacting with oxygen included in the insulator 524, the oxide 530, or the like.

The insulator 522 preferably has a single-layer structure or a stacked-layer structure using an insulator including what is called a high-k material such as aluminum oxide, hafnium oxide, an oxide including aluminum and hafnium (hafnium aluminate), tantalum oxide, zirconium oxide, lead zirconate titanate (PZT), strontium titanate ($SrTiO_3$), or $(Ba,Sr)TiO_3$ (BST), for example. As miniaturization and high integration of transistors progress, a problem such as off-state current might arise because of a thinner gate insulating film. When a high-k material is used for an insulator functioning as the gate insulating film, a gate potential during transistor operation can be reduced while the physical thickness is maintained.

It is particularly preferable to use an insulator including an oxide of one or both of aluminum and hafnium, which is an insulating material having a function of inhibiting diffusion of impurities, oxygen, and the like (an insulating material through which the above oxygen is less likely to pass). Aluminum oxide, hafnium oxide, an oxide including aluminum and hafnium (hafnium aluminate), or the like is preferably used for the insulator including an oxide of one or both of aluminum and hafnium. The insulator 522 formed of such a material functions as a layer that inhibits release of oxygen from the oxide 530 or entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulator 520 be thermally stable. For example, silicon oxide and silicon oxynitride are preferred because of their thermal stability. Furthermore, a combination of an insulator that is a high-k material and silicon oxide or silicon oxynitride enables the insulator 520 to have a stacked-layer structure that has thermal stability and high relative permittivity.

Note that the transistor 500 in FIGS. 23A and 23B includes the insulator 520, the insulator 522, and the insulator 524 as the second gate insulating film having a three-layer structure; however, the second gate insulating film may have a single-layer structure, a two-layer structure, or a stacked-layer structure of four or more layers. In such a case, the stacked layers are not necessarily formed of the same material and may be formed of different materials.

In the transistor 500, a metal oxide functioning as an oxide semiconductor is used as the oxide 530 including the channel formation region.

The metal oxide functioning as an oxide semiconductor may be formed by a sputtering method or an ALD (Atomic Layer Deposition) method. Note that the metal oxide functioning as an oxide semiconductor will be described in detail in another embodiment.

The metal oxide functioning as the channel formation region in the oxide 530 has a band gap of preferably 2 eV or more, further preferably 2.5 eV or more. The use of a metal oxide having such a wide band gap can reduce the off-state current of the transistor.

When the oxide 530 includes the oxide 530*a* under the oxide 530*b*, it is possible to inhibit diffusion of impurities into the oxide 530*b* from the components formed below the oxide 530*a*.

Note that the oxide 530 preferably has a plurality of oxide layers that differ in the atomic ratio of metal atoms. Specifically, the atomic ratio of the element M to the constituent elements in the metal oxide used as the oxide 530*a* is preferably higher than the atomic ratio of the element M to the constituent elements in the metal oxide used as the oxide 530*b*. In addition, the atomic ratio of the element M to In in the metal oxide used as the oxide 530*a* is preferably higher than the atomic ratio of the element M to In in the metal oxide used as the oxide 530*b*. Furthermore, the atomic ratio of In to the element M in the metal oxide used as the oxide 530*b* is preferably higher than the atomic ratio of In to the element M in the metal oxide used as the oxide 530*a*.

The energy of the conduction band minimum of the oxide 530*a* is preferably higher than the energy of the conduction band minimum of the oxide 530*b*. In other words, the electron affinity of the oxide 530*a* is preferably smaller than the electron affinity of the oxide 530*b*.

Here, the energy level of the conduction band minimum gradually changes at a junction portion of the oxide 530*a* and the oxide 530*b*. In other words, the energy level of the conduction band minimum at the junction portion of the oxide 530*a* and the oxide 530*b* continuously changes or is continuously connected. To change the energy level gradually, the density of defect states in a mixed layer formed at the interface between the oxide 530*a* and the oxide 530*b* is preferably made low.

Specifically, when the oxide 530*a* and the oxide 530*b* include a common element (as a main component) in addition to oxygen, a mixed layer with a low density of defect states can be formed. For example, in the case where the oxide 530*b* is an In—Ga—Zn oxide, an In—Ga—Zn oxide, a Ga—Zn oxide, gallium oxide, or the like is preferably used for the oxide 530*a*.

At this time, the oxide 530*b* serves as a main carrier path. When the oxide 530*a* has the above structure, the density of defect states at the interface between the oxide 530*a* and the oxide 530*b* can be made low. Thus, the influence of interface scattering on carrier conduction is small, and the transistor 500 can have high on-state current.

The conductor 542*a* and the conductor 542*b* functioning as the source electrode and the drain electrode are provided over the oxide 530*b*. For the conductor 542*a* and conductor 542*b*, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy including any of the above metal elements as its component; an alloy including a combination of the above metal elements; or the like. For example, it is preferable to use tantalum nitride, titanium nitride, tungsten, a nitride including titanium and aluminum, a nitride including tantalum and aluminum, ruthenium oxide, ruthenium nitride, an oxide including strontium and ruthenium, an oxide including lanthanum and nickel, or the like. Tantalum nitride, titanium nitride, a nitride including titanium and aluminum, a nitride including tantalum and aluminum, ruthenium oxide, ruthenium nitride, an oxide including strontium and ruthenium, and an oxide including lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

Although the conductor 542*a* and the conductor 542*b* have a single-layer structure in FIG. 23A, they may have a stacked-layer structure of two or more layers. For example, it is preferable to stack a tantalum nitride film and a tungsten film. Alternatively, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material including indium oxide, tin oxide, or zinc oxide may be used.

As illustrated in FIG. 23A, a region 543*a* and a region 543*b* are sometimes formed as low-resistance regions at and near the interface between the oxide 530 and the conductor 542*a* (the conductor 542*b*). In that case, the region 543*a* functions as one of a source region and a drain region, and the region 543*b* functions as the other of the source region and the drain region. The channel formation region is formed in a region between the region 543*a* and the region 543*b*.

When the conductor 542*a* (the conductor 542*b*) is provided to be in contact with the oxide 530, the oxygen concentration in the region 543*a* (the region 543*b*) sometimes decreases. In addition, a metal compound layer that includes the metal included in the conductor 542*a* (the conductor 542*b*) and the component of the oxide 530 is sometimes formed in the region 543*a* (the region 543*b*). In such a case, the carrier concentration of the region 543*a* (the region 543*b*) increases, and the region 543*a* (the region 543*b*) becomes a low-resistance region.

The insulator 544 is provided to cover the conductor 542*a* and the conductor 542*b* and inhibits oxidation of the conductor 542*a* and the conductor 542*b*. Here, the insulator 544 may be provided to cover a side surface of the oxide 530 and to be in contact with the insulator 524.

A metal oxide including one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use, as the insulator 544, an insulator including an oxide of one or both of aluminum and hafnium, such as aluminum oxide, hafnium oxide, or an oxide including aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542*a* and the conductor 542*b* are oxidation-resistant materials or materials that do not significantly lose their conductivity even after absorbing oxygen. Design is appropriately set in consideration of required transistor characteristics.

The insulator 544 can inhibit impurities such as water and hydrogen included in the insulator 580 from diffusing into the oxide 530*b*. Moreover, the oxidation of the conductors 542*a* and 542*b* due to excess oxygen included in the insulator 580 can be inhibited.

The insulator 545 functions as a first gate insulating film. Like the insulator 524, the insulator 545 is preferably formed using an insulator that includes excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide each including excess oxygen. In particular, silicon oxide and silicon oxynitride, which have thermal stability, are preferable.

When an insulator including excess oxygen is provided as the insulator 545, oxygen can be effectively supplied from the insulator 545 to the channel formation region of the oxide 530*b*. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen included in the insulator 545 to the oxide 530, a metal oxide may be provided between the insulator 545 and the conductor 560.

The metal oxide preferably inhibits diffusion of oxygen from the insulator 545 to the conductor 560. Providing the metal oxide that inhibits diffusion of oxygen inhibits diffusion of excess oxygen from the insulator 545 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as off-state current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have high relative permittivity.

Although the conductor 560 functioning as the first gate electrode has a two-layer structure in FIGS. 23A and 23B, the conductor 560 may have a single-layer structure or a stacked-layer structure of three or more layers.

For the conductor **560*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom, an oxygen molecule, and the like). When the conductor 560*a* has a function of inhibiting diffusion of oxygen, the conductivity of the conductor 560*b* can be inhibited from being lowered because of oxidation due to oxygen included in the insulator 545. As a conductive material having a function of inhibiting diffusion of oxygen, for example, tantalum, tantalum nitride, ruthenium, ruthenium oxide, or the like is preferably used. Alternatively, the conductor 560*a* can be formed using an oxide semiconductor that can be used for the oxide 530. In that case, when the conductor 560*b* is deposited by a sputtering method, the conductor 560*a*** can have a reduced electrical resistance and become a conductor. Such a conductor can be referred to as an OC (Oxide Conductor) electrode.

The conductor **560*b* is preferably formed using a conductive material including tungsten, copper, or aluminum as its main component. The conductor 560*b* also functions as a wiring and thus is preferably formed using a conductor having high conductivity. For example, a conductive material including tungsten, copper, or aluminum as its main component can be used. The conductor 560*b*** may have a stacked-layer structure, for example, a stacked-layer structure of titanium or titanium nitride and the above conductive material.

The insulator 580 is provided over the conductor **542*a* and the conductor 542*b* with the insulator 544 therebetween. The insulator 580 preferably includes an excess-oxygen region. For example, the insulator 580** preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride, which have thermal stability, are preferable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor **542*a* and the conductor 542*b*. Accordingly, the conductor 560 is formed to be embedded in the opening of the insulator 580 and the region between the conductor 542*a* and the conductor 542*b***.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 545. When the insulator 574 is deposited by a sputtering method, excess-oxygen regions can be provided in the insulator 545 and the insulator 580. Accordingly, oxygen can be supplied from the excess-oxygen regions to the oxide 530.

For example, a metal oxide including one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably reduced.

A conductor **540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The conductor 540*a* and the conductor 540*b* have a structure similar to that of a conductor 546 and a conductor 548** described later.

An insulator 582 is provided over the insulator 581. A substance having a barrier property against oxygen, hydrogen, or the like is preferably used for the insulator 582. Thus, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents passage of both oxygen and impurities such as hydrogen and moisture that cause a change in electrical characteristics of the transistor. Accordingly, aluminum oxide can prevent mixing of impurities such as hydrogen and moisture into the transistor 500 during and after the manufacturing process of the transistor. In addition, release of oxygen from the oxide included in the transistor 500 can be inhibited. Thus, aluminum oxide is suitably used for a protective film of the transistor 500.

An insulator 586 is provided over the insulator 582. For the insulator 586, a material similar to that for the insulator 320 can be used. Furthermore, when a material with comparatively low permittivity is used for these insulators, parasitic capacitance generated between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be formed using a material similar to that for the conductor 328 and the conductor 330.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, formation of an opening reaching the insulator 522 or the insulator 514 and formation of the insulator having a high barrier property to be in contact with the insulator 522 or the insulator 514 are suitable because these formation steps can also serve as some of the manufacturing steps of the transistor 500. Note that for the insulator having a high barrier property against hydrogen or water, a material similar to that for the insulator 522 or the insulator 514 can be used, for example.

Figure 24:
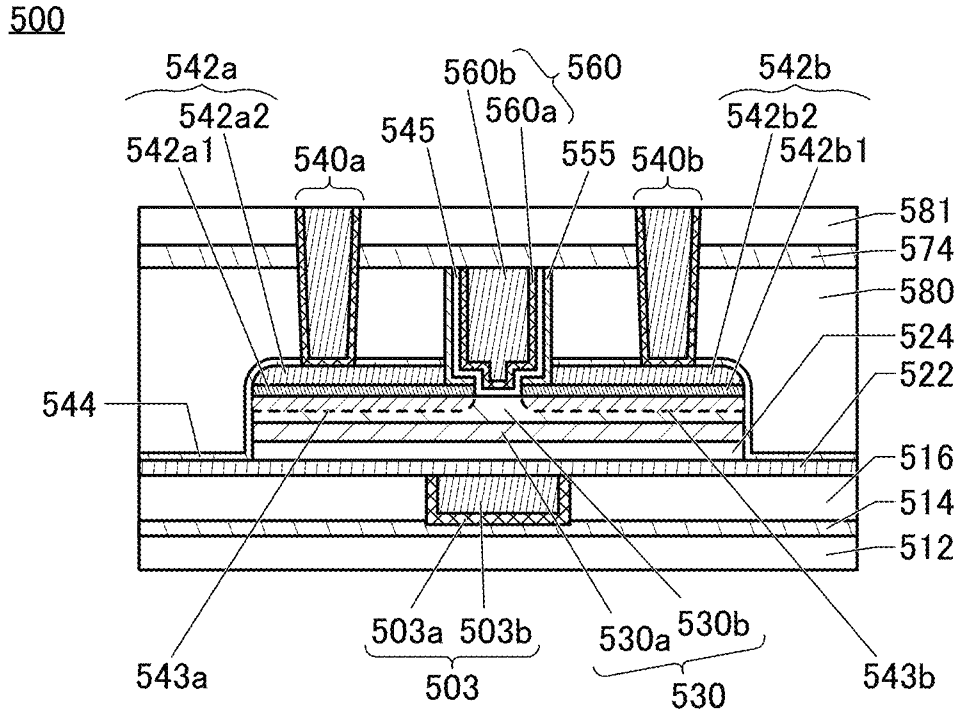
FIG. 24 is a diagram illustrating a structure example of a semiconductor device.

Note that the transistor that can be used in the present invention is not limited to the transistor 500 illustrated in FIG. 23A and FIG. 23B. For example, the transistor 500 having a structure illustrated in FIG. 24 may be used. The transistor 500 illustrated in FIG. 24 is different from the transistor illustrated in FIG. 23A and FIG. 23B in that an insulator 555 is used and that the conductor 542*a* (a conductor 542*al* and a conductor 542*a*2) and the conductor 542*b* (a conductor 542*b*1 and a conductor 542*b*2) each have a stacked-layer structure.

The conductor 542*a* has a stacked-layer structure of the conductor 542*al* and the conductor 542*a*2 over the conductor 542*a*1, and the conductor 542*b* has a stacked-layer structure of the conductor 542*b*1 and the conductor 542*b*2 over the conductor 542*b*1. The conductor 542*al* and the conductor 542*b*1 in contact with the oxide 530*b* are preferably conductors that are less likely to be oxidized, such as a metal nitride. Thus, excessive oxidation of the conductor 542*a* and the conductor 542*b* due to oxygen included in the oxide 530*b* can be prevented. Moreover, the conductor 542*a*2 and the conductor 542*b*2 are preferably conductors having higher conductivity than the conductor 542*al* and the conductor 542*b*1, such as a metal layer. Thus, the conductor 542*a* and the conductor 542*b* can function as wirings or electrodes having high conductivity. In this manner, it is possible to provide a semiconductor device in which the conductor 542*a* and the conductor 542*b* that function as wirings or electrodes are provided in contact with the top surface of the oxide 530 functioning as an active layer.

As the conductors 542*al* and 542*b*1, a metal nitride is preferably used; for example, a nitride including tantalum, a nitride including titanium, a nitride including molybdenum, a nitride including tungsten, a nitride including tantalum and aluminum, or a nitride including titanium and aluminum is preferably used. In one embodiment of the present invention, a nitride including tantalum is particularly preferable. As another example, ruthenium, ruthenium oxide, ruthenium nitride, an oxide including strontium and ruthenium, or an oxide including lanthanum and nickel may be used. These materials are preferable because they are each a conductive material that is less likely to be oxidized or a material that maintains the conductivity even after absorbing oxygen.

The conductor 542*a*2 and the conductor 542*b*2 preferably have higher conductivity than the conductor 542*al* and the conductor 542*b*1. For example, the thicknesses of the conductor 542*a*2 and the conductor 542*b*2 are preferably larger than the thicknesses of the conductor 542*al* and the conductor 542*b*1. For the conductor 542*a*2 and the conductor 542*b*2, a conductor that can be used for the conductor 560*b* can be used. The above structure can reduce the resistance of the conductor 542*a*2 and the conductor 542*b*2.

For example, tantalum nitride or titanium nitride can be used for the conductor 542*al* and the conductor 542*b*1, and tungsten can be used for the conductor 542*a*2 and the conductor 542*b*2.

As illustrated in FIG. 24, in a cross-sectional view of the transistor 500 in the channel length direction, the distance between the conductor 542*al* and the conductor 542*b*1 is smaller than the distance between the conductor 542*a*2 and the conductor 542*b*2. With such a structure, the distance between the source and the drain can be shortened, and the channel length can be accordingly shortened. Thus, the frequency characteristics of the transistor 500 can be improved. In this manner, miniaturization of the semiconductor device enables the semiconductor device to have a higher operating speed.

The insulator 555 is preferably an insulator that is less likely to be oxidized, such as a nitride. The insulator 555 is formed in contact with a side surface of the conductor 542*a*2 and a side surface of the conductor 542*b*2 and has a function of protecting the conductor 542*a*2 and the conductor 542*b*2. The insulator 555 is exposed to an oxidized atmosphere, and thus is preferably an inorganic insulator that is less likely to be oxidized. Since the insulator 555 is in contact with the conductor 542*a*2 and the conductor 542*b*2, the insulator 555 is preferably an inorganic insulator that is less likely to oxidize the conductors 542*a*2 and 542*b*2. Therefore, for the insulator 555, an insulating material having a barrier property against oxygen is preferably used. For example, silicon nitride can be used for the insulator 555.

The transistor 500 illustrated in FIG. 24 is formed in the following manner: an opening is formed in the insulator 580 and the insulator 544, the insulator 555 is formed in contact with a sidewall of the opening, and then the conductor 542*al* and the conductor 542*b*1 are separated using a mask. Here, the opening overlaps with a region between the conductor 542*a*2 and the conductor 542*b*2. The conductor 542*al* and the conductor 542*b*1 are formed to partly extend in the opening. Thus, in the opening, the insulator 555 is in contact with the top surface of the conductors 542*a*1, the top surface of the conductor 542*b*1, a side surface of the conductor 542*a*2, and a side surface of the conductor 542*b*2. The insulator 545 is in contact with the top surface of the oxide 530 in a region between the conductor 542*al* and the conductor 542*b*1.

Heat treatment in an atmosphere containing oxygen is preferably performed after the separation of the conductor into the conductor 542*al* and the conductor 542*b*1 and before the deposition of the insulator 545. Thus, oxygen can be supplied to the oxide 530*a* and the oxide 530*b* to reduce oxygen vacancies. Furthermore, since the insulator 555 is formed in contact with the side surface of the conductor 542*a*2 and the side surface of the conductor 542*b*2, excessive oxidation of the conductor 542*a*2 and the conductor 542*b*2 can be prevented. Accordingly, the transistor can have favorable electrical characteristics and higher reliability. In addition, variations in electrical characteristics of transistors formed over the same substrate can be reduced.

In the transistor 500, the insulator 524 may be formed into an island shape, as illustrated in FIG. 24. Here, the insulator 524 may be formed such that its side end portion is substantially aligned with a side end portion of the oxide 530.

In the transistor 500, the insulator 522 may be in contact with the insulator 516 and the conductor 503, as illustrated in FIG. 24. In other words, the insulator 520 illustrated in FIG. 23A and FIG. 23B may be omitted.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, it is possible to use a metal film including an element selected from molybdenum, titanium, tantalum, tungsten, aluminum, copper, chromium, neodymium, and scandium; a metal nitride film including the above element as its component (a tantalum nitride film, a titanium nitride film, a molybdenum nitride film, or a tungsten nitride film); or the like. Alternatively, it is possible to employ a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each have a single-layer structure in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In the case where the conductor 620 is formed at the same time as another component such as a conductor, copper (Cu), aluminum (Al), or the like, which is a low-resistance metal material, is used.

An insulator 640 is provided over the conductor 620 and the insulator 630. The insulator 640 can be formed using a material similar to that for the insulator 320. The insulator 640 may function as a planarization film that covers an uneven shape therebelow.

With the use of this structure, a semiconductor device using a transistor including an oxide semiconductor can be miniaturized or highly integrated.

As a substrate that can be used for the semiconductor device of one embodiment of the present invention, a glass substrate, a quartz substrate, a sapphire substrate, a ceramic substrate, a metal substrate (e.g., a stainless steel substrate, a substrate including stainless steel foil, a tungsten substrate, a substrate including tungsten foil, or the like), a semiconductor substrate (e.g., a single crystal semiconductor substrate, a polycrystalline semiconductor substrate, a compound semiconductor substrate, or the like), an SOI (silicon on Insulator) substrate, or the like can be used. Alternatively, a plastic substrate having heat resistance to the processing temperature in this embodiment may be used. Examples of the glass substrate include barium borosilicate glass, aluminosilicate glass, aluminoborosilicate glass, and soda lime glass. Alternatively, crystallized glass or the like can be used.

Alternatively, a flexible substrate; an attachment film; paper or a base film including a fibrous material; or the like can be used as the substrate. As examples of the flexible substrate, the attachment film, the base film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, an aramid resin, an epoxy resin, an inorganic evaporated film, and paper. In particular, the use of a semiconductor substrate, a single crystal substrate, an SOI substrate, or the like for the manufacture of transistors enables the manufacture of small-sized transistors with a small variation in characteristics, size, shape, or the like and high current capability. A circuit using such transistors achieves lower power consumption or higher integration.

Alternatively, a flexible substrate may be used as the substrate, and a transistor, a resistor, a capacitor, and/or the like may be formed directly on the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance, a flexible substrate, or the like. Note that as the separation layer, a stacked-layer structure of a tungsten film and a silicon oxide film that are inorganic films, a structure in which an organic resin film of polyimide or the like is formed over a substrate, a silicon film including hydrogen, or the like can be used, for example.

That is, a semiconductor device may be formed over one substrate and then transferred to another substrate. Examples of a substrate to which a semiconductor device is transferred include, in addition to the above substrates over which transistors can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. With the use of these substrates, the manufacture of a flexible semiconductor device, the manufacture of a robust semiconductor device, provision of high heat resistance, a reduction in weight, or a reduction in thickness can be achieved.

Providing a semiconductor device over a flexible substrate can inhibit an increase in weight and makes the semiconductor device less likely to be damaged.

Note that the transistor 550 illustrated in FIG. 22 is just an example and is not limited to the structure illustrated therein, and an appropriate transistor can be used in accordance with a circuit structure, a driving method, or the like. For example, when the semiconductor device is a single-polarity circuit that is composed of only OS transistors (which means transistors having the same polarity, e.g., only n-channel transistors), the transistor 550 has a structure similar to that of the transistor 500.

The configuration, structure, method, and the like described in this embodiment can be used in combination as appropriate with the configurations, structures, methods, and the like described in the other embodiments, an example, and the like.

Embodiment 4

This embodiment will describe cross-sectional structure examples of the memory devices including OS transistor, which are described in the above embodiments, such as a DOSRAM and a NOSRAM.

Figure 25:
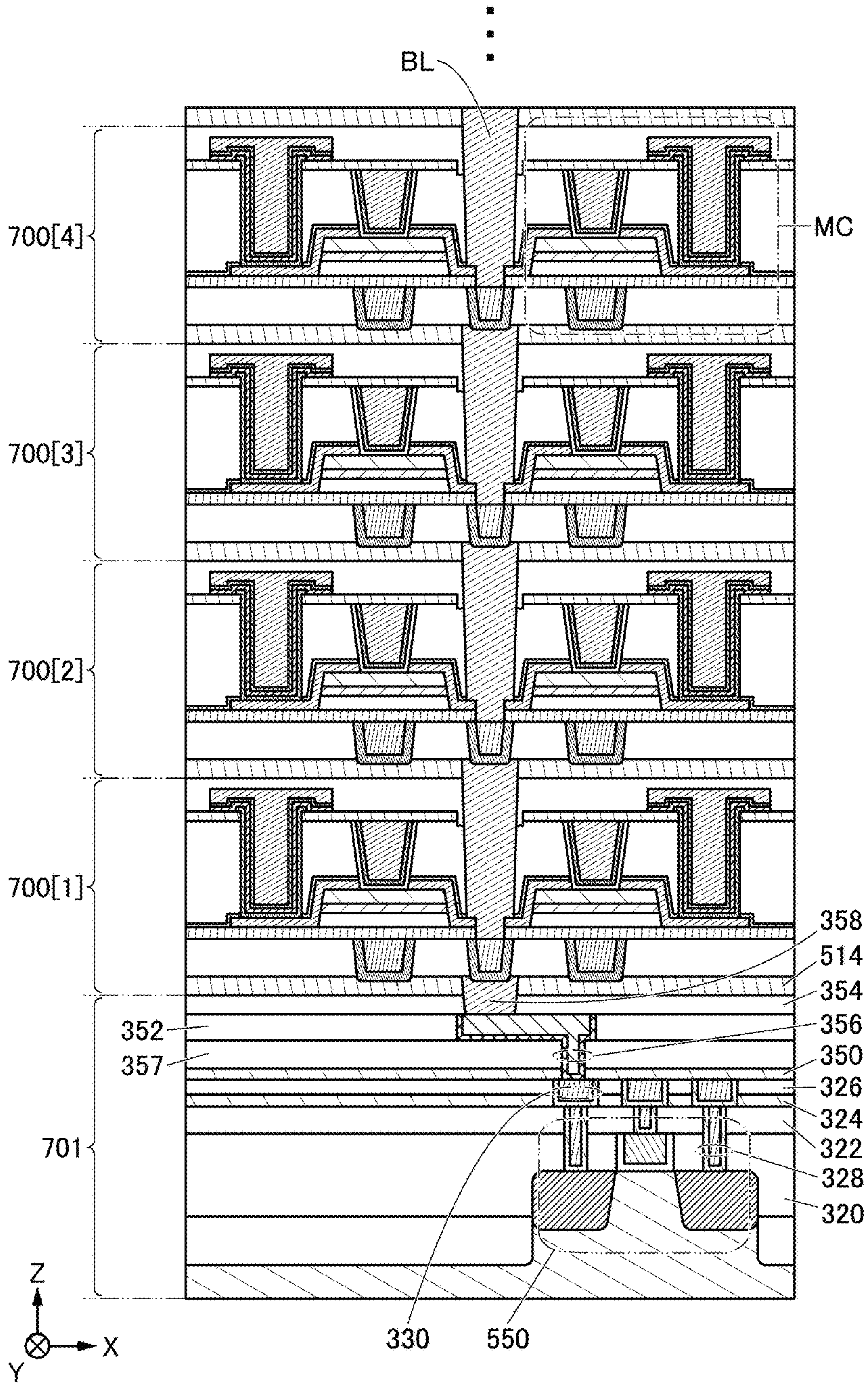
FIG. 25 is a diagram illustrating a structure example of a memory portion.

FIG. 25 illustrates a cross-sectional structure example of the case of using a DOSRAM circuit structure. In the example illustrated in FIG. 25, a memory layer 700[1] to a memory layer 700[4] are stacked over a driver circuit layer 701.

FIG. 25 also illustrates the transistor 550 included in the driver circuit layer 701 as an example. As the transistor 550, the transistor 550 described in the above embodiment can be used.

Note that the transistor 550 illustrated in FIG. 25 is an example and is not limited to the structure illustrated therein; an appropriate transistor can be used in accordance with a circuit structure or a driving method.

A wiring layer provided with an interlayer film, a wiring, a plug, and the like may be provided between the driver circuit layer 701 and the memory layers 700 or between a k-th memory layer 700 and a (k+1)th memory layer 700. Note that in this embodiment and the like, the k-th memory layer 700 is denoted as a memory layer 700[k] and the (k+1)th memory layer 700 is denoted as a memory layer 700[k+1] in some cases. Here, k is an integer greater than or equal to 1 and less than or equal to N. In addition, in this embodiment and the like, the solutions of "k+α (α is an integer greater than or equal to 1)" and "k−α" are each an integer greater than or equal to 1 and less than or equal to N.

A plurality of wiring layers can be provided in accordance with the design. Moreover, in this specification and the like, a wiring and a plug connected to the wiring may be a single component. That is, part of a conductor functions as a wiring in some cases and part of a conductor functions as a plug in other cases.

For example, the insulator 320, the insulator 322, the insulator 324, and the insulator 326 are sequentially stacked and provided over the transistor 550 as interlayer films. The conductor 328 and the like are embedded in the insulator 320 and the insulator 322. The conductor 330 and the like are embedded in the insulator 324 and the insulator 326. Note that the conductor 328 and the conductor 330 each function as a contact plug or a wiring.

The insulator functioning as an interlayer film may function as a planarization film that covers an uneven shape thereunder. For example, the top surface of the insulator 320 may be planarized through planarization treatment using a CMP method or the like to increase the level of planarity.

A wiring layer may be provided over the insulator 326 and the conductor 330. For example, in FIG. 25, the insulator 350, an insulator 357, the insulator 352, and the insulator 354 are sequentially stacked and provided over the insulator 326 and the conductor 330. The conductor 356 is formed in the insulator 350, the insulator 357, and the insulator 352. The conductor 356 functions as a contact plug or a wiring.

The insulator 514 included in the memory layer 700[1] is provided over the insulator 354. A conductor 358 is embedded in the insulator 514 and the insulator 354. The conductor 358 functions as a contact plug or a wiring. For example, the wiring BL and the transistor 550 are connected to each other through the conductor 358, the conductor 356, the conductor 330, and the like.

Figure 26A:
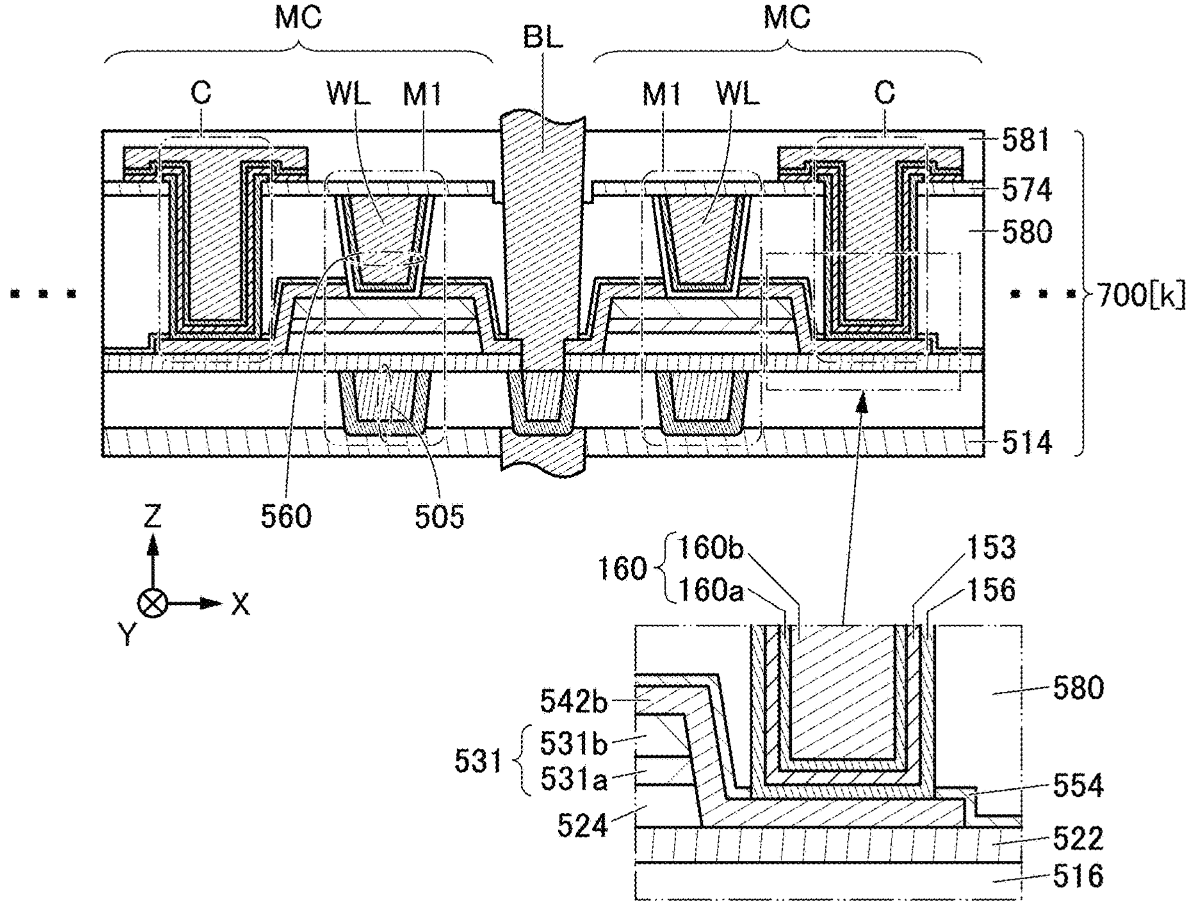
FIG. 26A is a diagram illustrating a structure example of a memory layer.
Figure 26B:
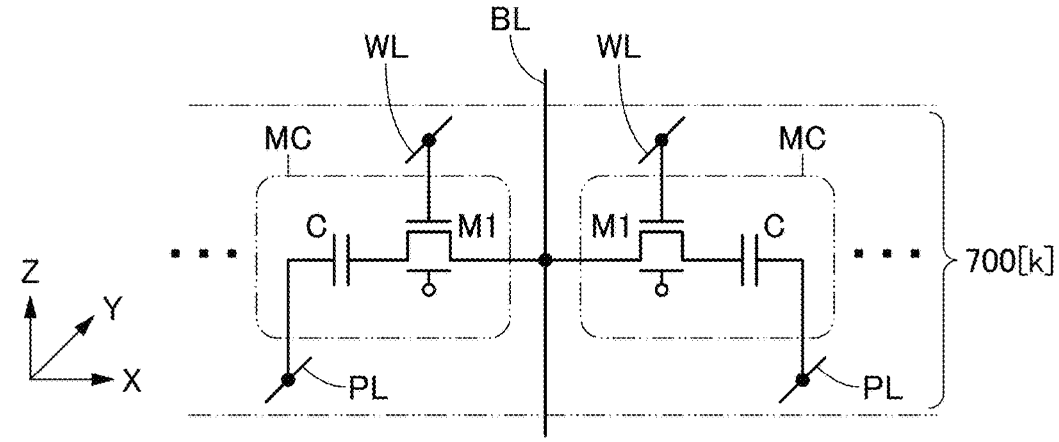
FIG. 26B is a diagram illustrating an equivalent circuit of the memory layer.

FIG. 26A illustrates a cross-sectional structure example of the memory layer 700[k]. FIG. 26B is an equivalent circuit diagram of FIG. 26A. FIG. 26A illustrates an example where two memory cells MC are connected to one wiring BL.

The memory cell MC illustrated in FIG. 25 and FIG. 26A includes a transistor M1 and a capacitor C. For example, the transistor 500 illustrated in the above embodiment can be used as the transistor M1.

Note that in this embodiment, a variation example of the transistor 500 is illustrated as the transistor M1. Specifically, the transistor M1 is different from the transistor 500 in that the conductor 542*a* and the conductor 542*b* extend beyond an edge of a metal oxide 531 (a metal oxide 531*a* and a metal oxide 531*b*).

The memory cell MC illustrated in FIG. 25 and FIG. 26A includes a conductor 156 that functions as one terminal of the capacitor C, an insulator 153 that functions as a dielectric, and a conductor 160 (a conductor 160*a* and a conductor 160*b*) that functions as the other terminal of the capacitor C. The conductor 156 is connected to part of the conductor 542*b*. The conductor 160 is connected to the wiring PL (not illustrated in FIG. 26A).

The capacitor C is formed in an opening portion that is provided by removal of part of the insulator 574, the insulator 580, and an insulator 554. Since the conductor 156, the insulator 580, and the insulator 554 are formed along a side surface of the opening portion, the conductor 156, the insulator 580, and the insulator 554 are preferably deposited by an ALD method, a CVD method, or the like.

A conductor that can be used for a conductor 505 or the conductor 560 is used for each of the conductor 156 and the conductor 160. For example, titanium nitride formed by an ALD method is used for the conductor 156. Furthermore, titanium nitride formed by an ALD method is used for the conductor 160*a*, and tungsten formed by a CVD method is used for the conductor 160*b*. Note that in the case where the adhesion of tungsten to the insulator 153 is sufficiently high, a single-layer film of tungsten formed by a CVD method may be used for the conductor 160.

An insulator of a high permittivity (high-k) material (a material with high relative permittivity) is preferably used for the insulator 153. As the insulator of a high permittivity material, an oxide, an oxynitride, a nitride oxide, or a nitride containing one or more kinds of metal element selected from aluminum, hafnium, zirconium, gallium, and the like can be used, for example. In addition, the oxide, the oxynitride, the nitride oxide, or the nitride may contain silicon. Furthermore, insulating layers each formed of the above material can be stacked to be used. The insulator 153 can employ, for example, a three-layer stacked structure of zirconium oxide, aluminum oxide, and zirconium oxide. Note that the three-layer stacked structure may be referred to as $ZrO_{xa}\backslash AlO_{xb}\backslash ZrO_{xc}$ (ZAZ). Note that xa, xb, and xc mentioned above each have an arbitrary unit.

As the insulator of a high permittivity material, it is possible to use, for example, aluminum oxide, hafnium oxide, zirconium oxide, an oxide containing aluminum and hafnium, an oxynitride containing aluminum and hafnium, an oxide containing silicon and hafnium, an oxynitride containing silicon and hafnium, an oxide containing silicon and zirconium, an oxynitride containing silicon and zirconium, an oxide containing hafnium and zirconium, or an oxynitride containing hafnium and zirconium. Using such a high permittivity material allows the insulator 153 to be thick enough to inhibit the off-state current and can ensure sufficient capacitance of the capacitor C.

In addition, it is preferable to use stacked insulating layers each formed of the above materials. It is preferable to use a stacked structure using a high permittivity material and a material having higher dielectric strength than the high permittivity material. An insulating film in which zirconium oxide, aluminum oxide, and zirconium oxide are stacked in this order can be used for the insulator 153, for example. Alternatively, an insulating film in which zirconium oxide, aluminum oxide, zirconium oxide, and aluminum oxide are stacked in this order can be used, for example. Alternatively, an insulating film in which hafnium zirconium oxide, aluminum oxide, hafnium zirconium oxide, and aluminum oxide are stacked in this order can be used, for example. The use of stacked insulators with comparatively high dielectric strength, such as aluminum oxide, can improve the dielectric strength and can inhibit electrostatic breakdown of the capacitor C.

Figure 27A:
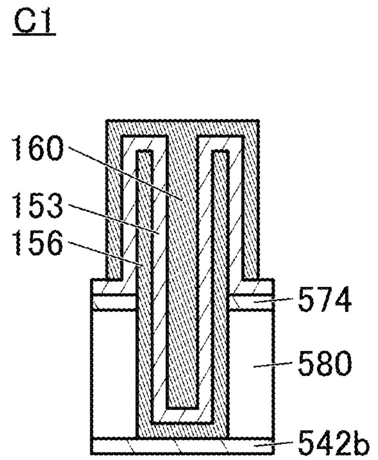
FIG. 27A to FIG. 27D are diagrams each illustrating a structure example of a semiconductor device.

The capacitor C1 illustrated in FIG. 27A is a variation example of the capacitor C illustrated in FIG. 26A.

The capacitor C1 illustrated in FIG. 27A is different from the capacitor C illustrated in FIG. 26A in the shapes of the conductor 156, the insulator 153, and the conductor 160. With the structure of the capacitor C1 illustrated in FIG. 27A, the area where the conductor 156, the insulator 153, and the conductor 160 overlap with each other can be increased, whereby the capacitance can be increased.

The insulator 153 is in contact with the inner side of a recess portion of the conductor 156 and the top surface of the conductor 156. The insulator 153 includes a region in contact with part of an outer side surface of the conductor 156. The insulator 153 includes a region in contact with the insulator 574.

The conductor 160 is provided to fill an opening in the conductor 156. The conductor 160 includes a region overlapping with the part of the outer side surface of the conductor 156 with the insulator 153 therebetween.

With the above structure, the capacitance per unit area can be further increased.

Figure 27B:
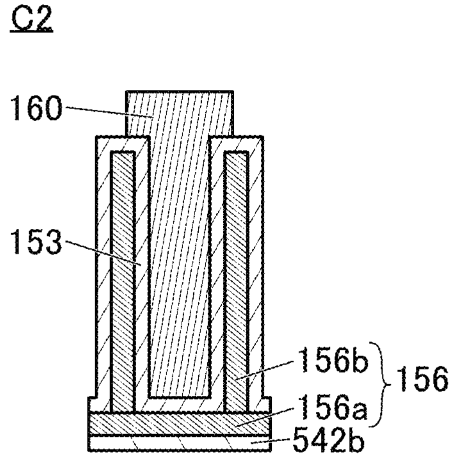

The capacitor C2 illustrated in FIG. 27B is a variation example of the capacitor C illustrated in FIG. 26A.

The capacitor C2 illustrated in FIG. 27B is different from the capacitor C illustrated in FIG. 26A in the shapes of the conductor 156, the insulator 153, and the conductor 160.

The conductor 156 includes a conductor 156*a* over the conductor 542*b* and a conductor 156*b* over the conductor 156*a*. The conductor 156*b* has a cylindrical shape with a hollow portion.

The insulator 153 is provided to be in contact with a side surface and the top surface of the conductor 156*b* and the top surface of the conductor 156*a*.

The conductor 160 is provided to fill the hollow portion of the conductor 156*b* with the insulator 153 therebetween.

With the above structure, the capacitance per unit area can be further increased.

Figure 27C:
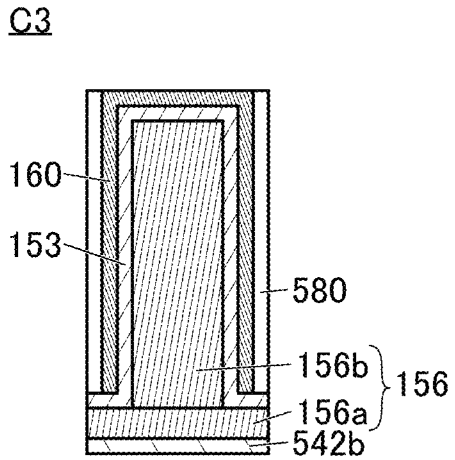

A capacitor C3 illustrated in FIG. 27C is a variation example of the capacitor C illustrated in FIG. 26A.

The capacitor C3 illustrated in FIG. 27C is different from the capacitor C illustrated in FIG. 26A in the shapes of the conductor 156, the insulator 153, and the conductor 160.

The conductor 156 includes the conductor 156*a* over the conductor 542*b* and the conductor 156*b* over the conductor 156*a*. The conductor 156*b* has a cylindrical shape.

The insulator 153 is provided to be in contact with the side surface and the top surface of the conductor 156*b* and the top surface of the conductor 156*a*.

The conductor 160 is provided to cover the side surface and the top surface of the conductor 156*b* with the insulator 153 therebetween.

With the above structure, the capacitance per unit area can be further increased.

Figure 27D:
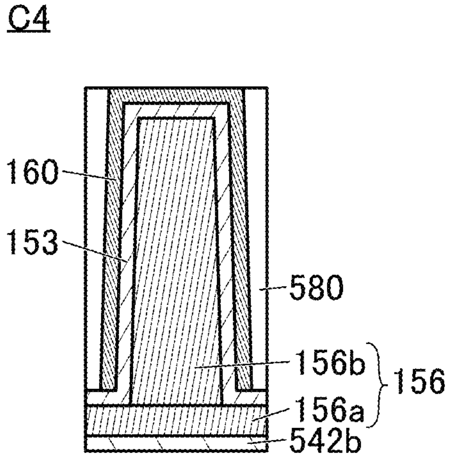

Although FIG. 27C illustrates a structure in which the side surface of the conductor 156*b* is perpendicular to the conductor 542*b*, the present invention is not limited thereto. For example, as illustrated in FIG. 27D, the side surface of the conductor 156*b* may be tapered. With the opening whose side surface is tapered, the coverage with the insulator 153 and the conductor 160 can be improved in a later step, so that defects such as a void can be reduced.

Figure 28:
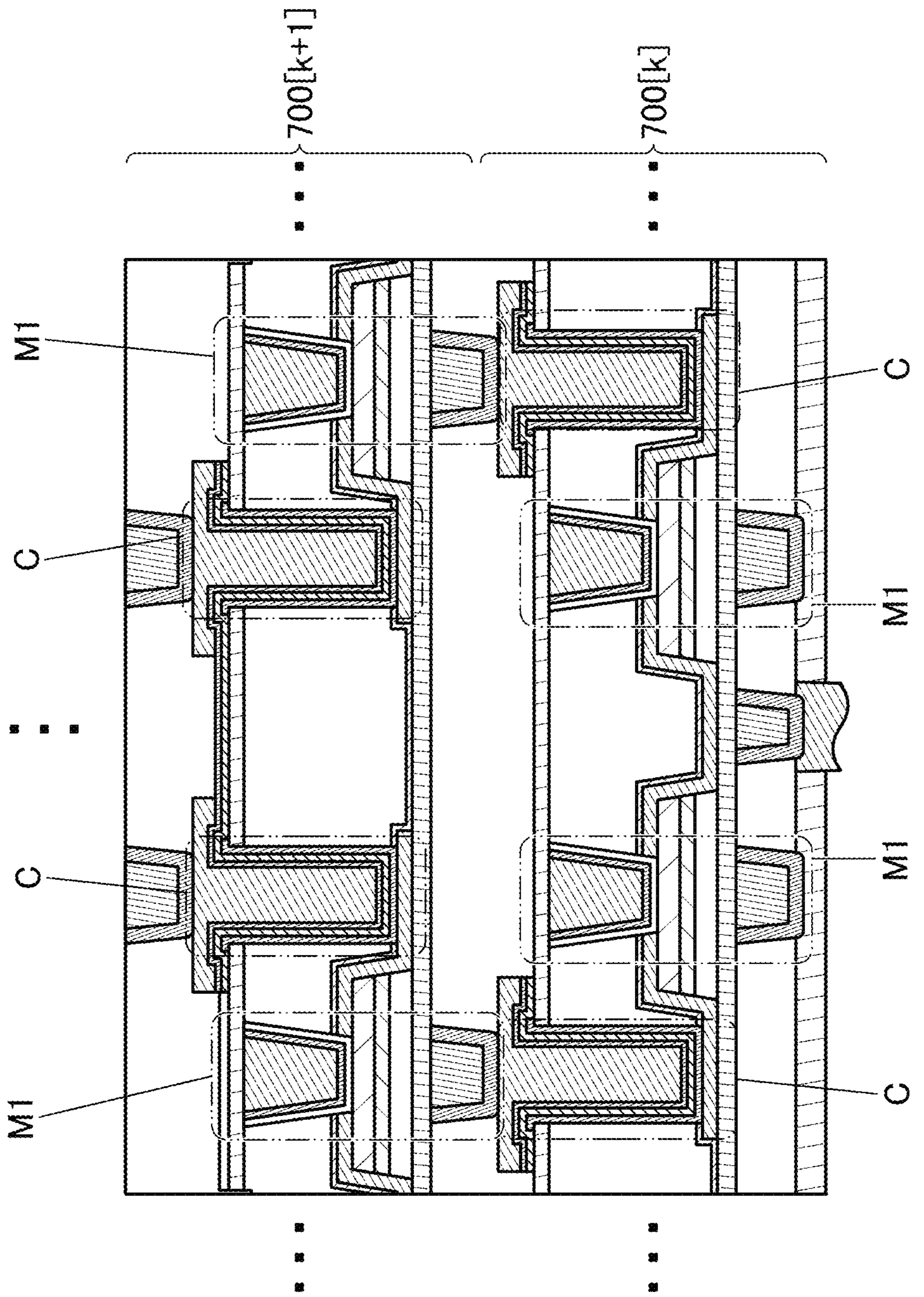
FIG. 28 is a diagram illustrating a structure example of a semiconductor device.

Although FIG. 25 illustrates a structure in which the transistors M1 and the capacitors C in the stacked memory layers 700 overlap with each other, that is, the transistors M1 overlap with each other and the capacitors C overlap with each other, another structure may be employed. For example, as illustrated in FIG. 28, the electrodes of the capacitors C in the stacked memory layers 700 may be positioned to overlap with the conductors functioning as the back gates of the transistors M1. With the structure illustrated in FIG. 28, the step of forming the conductor functioning as the back gate of the transistor M1 can be simplified.

Figure 29:
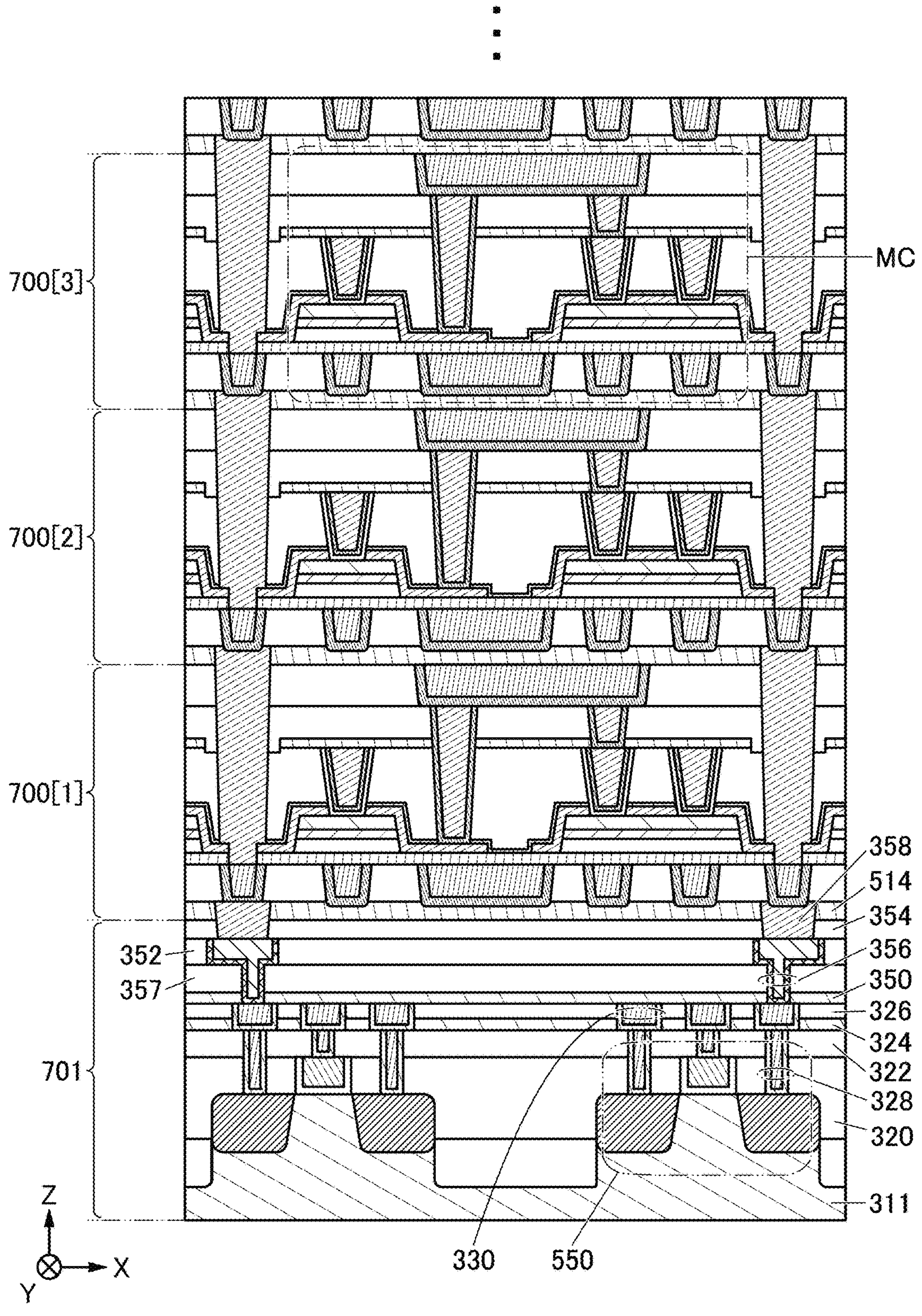
FIG. 29 is a diagram illustrating a structure example of a memory portion.
Figure 30A:
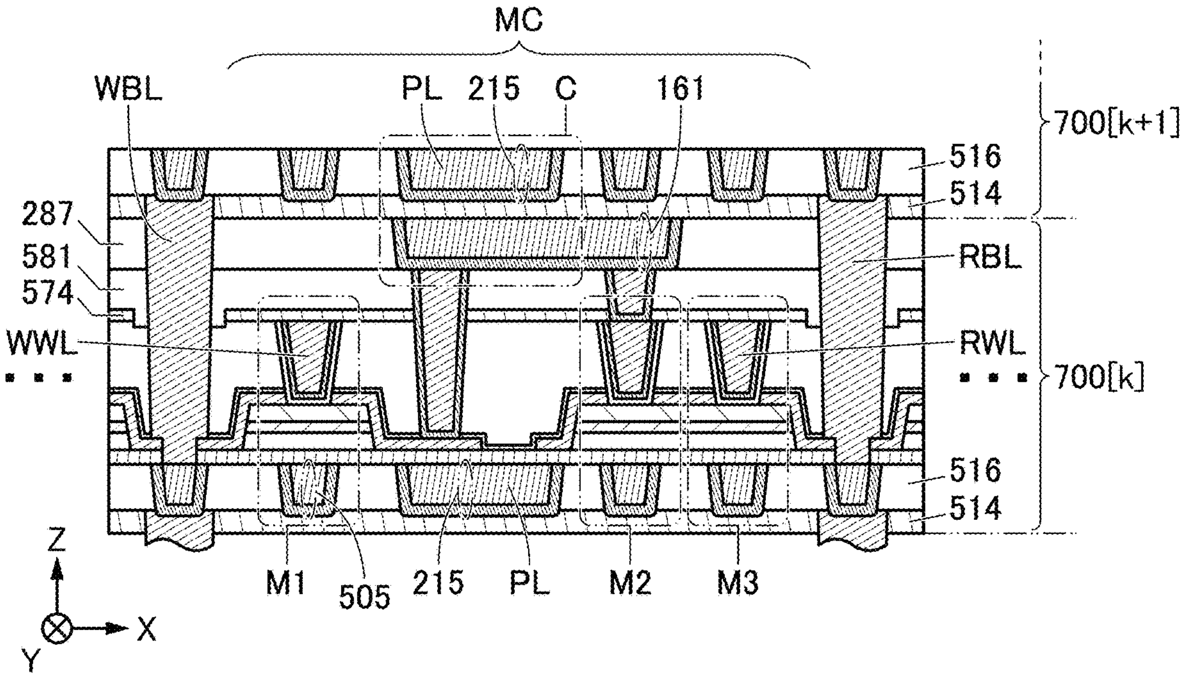
FIG. 30A is a diagram illustrating a structure example of a memory layer.
Figure 30B:
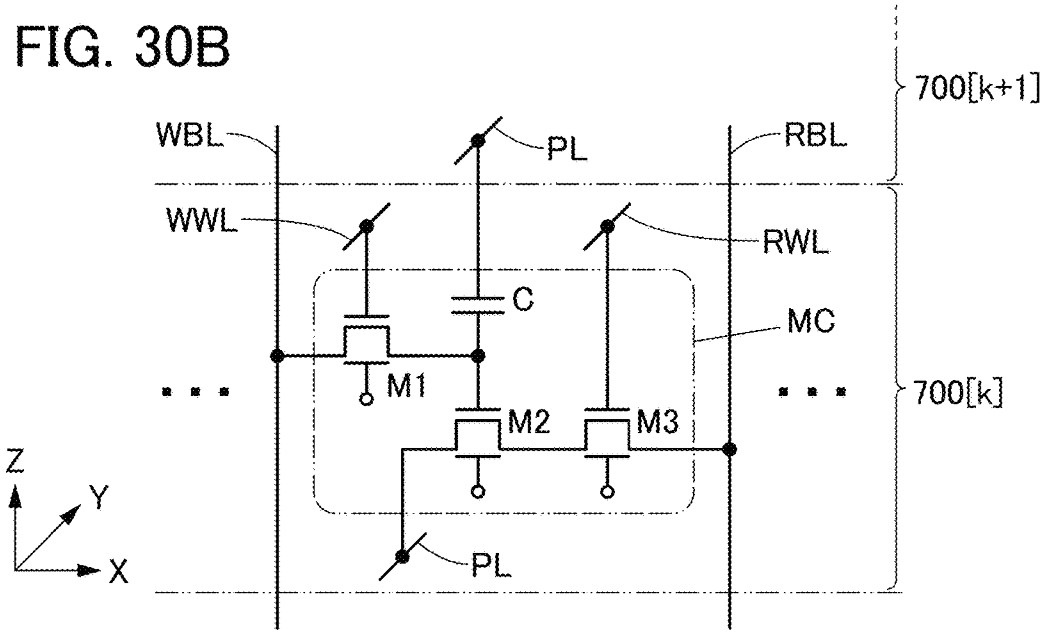
FIG. 30B is a diagram illustrating an equivalent circuit of the memory layer.

FIG. 29 illustrates a cross-sectional structure example of the case of using a NOSRAM memory cell circuit structure. FIG. 29 is also a variation example of FIG. 25. FIG. 30A illustrates a cross-sectional structure example of the memory layer 700[k]. FIG. 30B is an equivalent circuit diagram of FIG. 30A.

The memory cell MC illustrated in FIG. 29 and FIG. 30A includes the transistor M1, a transistor M2, and a transistor M3 over the insulator 514. A conductor 215 is provided over the insulator 514. The conductor 215 and the conductor 505 can be concurrently formed using the same material in the same step.

The transistor M2 and the transistor M3 illustrated in FIG. 29 and FIG. 30A share one island-shaped metal oxide 531. In other words, part of the one island-shaped metal oxide 531 functions as a channel formation region of the transistor M2, and another part thereof functions as a channel formation region of the transistor M3. Furthermore, a source of the transistor M2 serves also as a drain of the transistor M3, or a drain of the transistor M2 serves also as a source of the transistor M3. Thus, the area occupied by the transistor M2 and the transistor M3 is smaller than that of the case where the transistor M2 and the transistor M3 are independently provided.

In the memory cell MC illustrated in FIG. 29 and FIG. 30A, an insulator 287 is provided over the insulator 581, and a conductor 161 is embedded in the insulator 287. The insulator 514 of the memory layer 700[k+1] is provided over the insulator 287 and the conductor 161.

In FIG. 29 and FIG. 30A, the conductor 215 of the memory layer 700[k+1] functions as one terminal of the capacitor C, the insulator 514 of the memory layer 700[k+1] functions as the dielectric of the capacitor C, and the conductor 161 functions as the other terminal of the capacitor C. The other of a source and a drain of the transistor M1 is connected to the conductor 161 through a contact plug, and a gate of the transistor M2 is connected to the conductor 161 through another contact plug.

Figure 31:
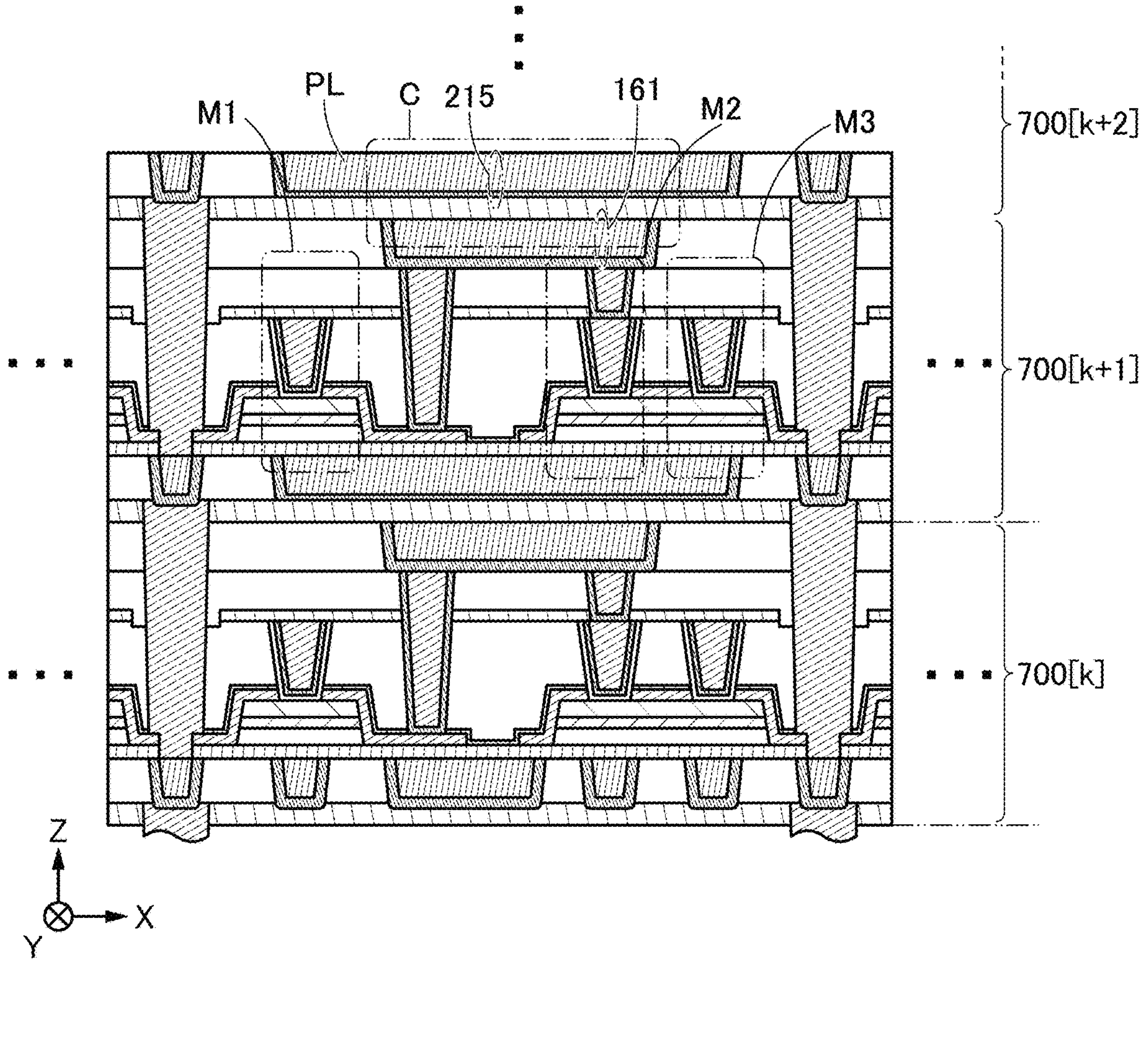
FIG. 31 is a diagram illustrating a structure example of a semiconductor device.

Although FIG. 29 illustrates an example in which the conductor functioning as the back gates of the transistors M1 to M3 and the conductor functioning as the terminal of the capacitor C have different structures in the stacked memory layers 700, another structure may be employed. For example, in the stacked memory layers 700 as illustrated in FIG. 31, the conductor 215 corresponding to the one terminal of the capacitor C may be connected to the conductor functioning as the back gates of the conductors M1 to M3 so as to have the same potential. With the structure illustrated in FIG. 28, the conductor 215 of the capacitor C can be enlarged, whereby the capacitance of the capacitor C can be increased.

This embodiment can be implemented in combination with the other embodiments described in this specification as appropriate.

Embodiment 5

In this embodiment, a transistor whose channel formation region includes an oxide semiconductor (OS transistor) will be described. In the description of the OS transistor, comparison with a transistor whose channel formation region includes silicon (also referred to as a Si transistor) will also be briefly described.

[OS Transistor]

An oxide semiconductor having a low carrier concentration is preferably used for the OS transistor. For example, the carrier concentration in a channel formation region of an oxide semiconductor is lower than or equal to $1\times10^{18}$ $cm^{-3}$, preferably lower than $1\times10^{17}$ $cm^{-3}$, further preferably lower than $1\times10^{16}$ $cm^{-3}$, still further preferably lower than $1\times10^{13}$ $cm^{-3}$, yet still further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor has a low density of defect states and accordingly has a low density of trap states in some cases. Charge trapped by the trap states in the oxide semiconductor takes a long time to disappear and might behave like fixed charge. Thus, a transistor whose channel formation region is formed in an oxide semiconductor having a high density of trap states has unstable electrical characteristics in some cases.

Accordingly, in order to obtain stable electrical characteristics of the transistor, reducing the impurity concentration in the oxide semiconductor is effective. In order to reduce the impurity concentration in the oxide semiconductor, it is preferable that the impurity concentration in an adjacent film be also reduced. Examples of the impurity include hydrogen and nitrogen. Note that an impurity in an oxide semiconductor refers to, for example, elements other than the main components of the oxide semiconductor. For example, an element with a concentration lower than 0.1 atomic % is regarded as an impurity.

When impurities and oxygen vacancies are in a channel formation region of an oxide semiconductor in an OS transistor, electrical characteristics of the OS transistor easily vary and the reliability thereof might worsen. In the OS transistor, a defect that is an oxygen vacancy in the oxide semiconductor into which hydrogen enters (hereinafter sometimes referred to as $V_OH$) may be formed and may generate an electron serving as a carrier. When $V_OH$ is formed in the channel formation region, the donor concentration in the channel formation region increases in some cases. As the donor concentration in the channel formation region increases, the threshold voltage might vary. Therefore, when the channel formation region in the oxide semiconductor includes oxygen vacancies, the transistor is likely to have normally-on characteristics (characteristics with which, even when no voltage is applied to a gate electrode, a channel exists and current flows through the transistor). Accordingly, impurities, oxygen vacancies, and $V_OH$ are preferably reduced as much as possible in the channel formation region in the oxide semiconductor.

The band gap of the oxide semiconductor is preferably larger than the band gap of silicon (typically 1.1 eV), further preferably larger than or equal to 2 eV, still further preferably larger than or equal to 2.5 eV, yet still further preferably larger than or equal to 3.0 eV. With the use of an oxide semiconductor having a larger band gap than silicon, the off-state current (also referred to as Ioff) of the transistor can be reduced.

In a Si transistor, a short-channel effect (also referred to as SCE) appears as miniaturization of the transistor proceeds. Thus, it is difficult to miniaturize the Si transistor. One factor that causes the short-channel effect is a small band gap of silicon. By contrast, the OS transistor includes an oxide semiconductor that is a semiconductor material having a wide band gap, and thus can suppress the short-channel effect. In other words, the OS transistor is a transistor where the short-channel effect does not appear or hardly appears.

The short-channel effect refers to degradation of electrical characteristics which becomes obvious along with miniaturization of a transistor (a decrease in channel length). Specific examples of the short-channel effect include a decrease in threshold voltage, an increase in subthreshold swing value (sometimes also referred to as S value), and an increase in leakage current. Here, the S value means the amount of change in gate voltage in the subthreshold region when the drain voltage keeps constant and the drain current changes by one order of magnitude.

The characteristic length is widely used as an indicator of resistance to a short-channel effect. The characteristic length is an indicator of curving of potential in a channel formation region. When the characteristic length is shorter, the potential rises more sharply, which means that the resistance to a short-channel effect is high.

The OS transistor is an accumulation-type transistor, and the Si transistor is an inversion-type transistor. Accordingly, an OS transistor has a shorter characteristic length between a source region and a channel formation region and a shorter characteristic length between a drain region and the channel formation region than a Si transistor. Therefore, an OS transistor has higher resistance to a short-channel effect than a Si transistor. That is, in the case where a transistor with a short channel length is to be manufactured, an OS transistor is more suitable than a Si transistor.

Even in the case where the carrier concentration in the oxide semiconductor is reduced until the channel formation region becomes an i-type or substantially i-type region, the conduction band minimum of the channel formation region in a short-channel transistor decreases because of the Conduction-Band-Lowering (CBL) effect; thus, a difference in energy of the conduction band minimum between the channel formation region and the source region or the drain region might decrease to higher than or equal to 0.1 eV and lower than or equal to 0.2 eV. Accordingly, the OS transistor can be regarded as having an $n^+/n^-/n^+$ accumulation-type junction-less transistor structure or an $n^+/n^-/n^+$ accumulation-type non-junction transistor structure in which the channel formation region becomes an $n^-$-type region and the source region and the drain region become $n^+$-type regions.

The OS transistor with the above structure can have favorable electrical characteristics even when a semiconductor device is miniaturized or highly integrated. For example, the OS transistor can have favorable electrical characteristics even when the gate length of the OS transistor is less than or equal to 20 nm, less than or equal to 15 nm, less than or equal to 10 nm, less than or equal to 7 nm, or less than or equal to 6 nm and greater than or equal to 1 nm, greater than or equal to 3 nm, or greater than or equal to 5 nm. In contrast, it is sometimes difficult for the Si transistor to have a gate length less than or equal to 20 nm or less than or equal to 15 nm due to appearance of the short-channel effect. Thus, an OS transistor can be used as a transistor with a short channel length more suitably than a Si transistor. Note that the gate length refers to the length of a gate electrode in a direction in which carriers move inside a channel formation region during operation of a transistor, and corresponds to the width of a bottom surface of the gate electrode in a plan view of the transistor.

Miniaturization of an OS transistor can improve the high frequency characteristics of the transistor. Specifically, the cutoff frequency of the transistor can be increased. When the gate length of the OS transistor is within any of the above ranges, the cutoff frequency of the transistor can be greater than or equal to 50 GHz, preferably greater than or equal to 100 GHz, further preferably greater than or equal to 150 GHz at room temperature, for example.

As described above, the OS transistor has advantageous effects over the Si transistor, such as lower off-state current and the capability of being manufactured with a shorter channel length.

The configuration, structure, method, and the like described in this embodiment can be used in combination as appropriate with the configurations, structures, methods, and the like described in the other embodiments and the like.

Embodiment 6

This embodiment will describe an electronic component, an electronic device, a large computer, space equipment, and a data center (also referred to as a DC) that can use the semiconductor device described in the above embodiment. An electronic component, an electronic device, a large computer, space equipment, and a data center each using the semiconductor device of one embodiment of the present invention are effective in achieving high performance, e.g., reducing power consumption.

[Electronic Component]

Figure 32A:
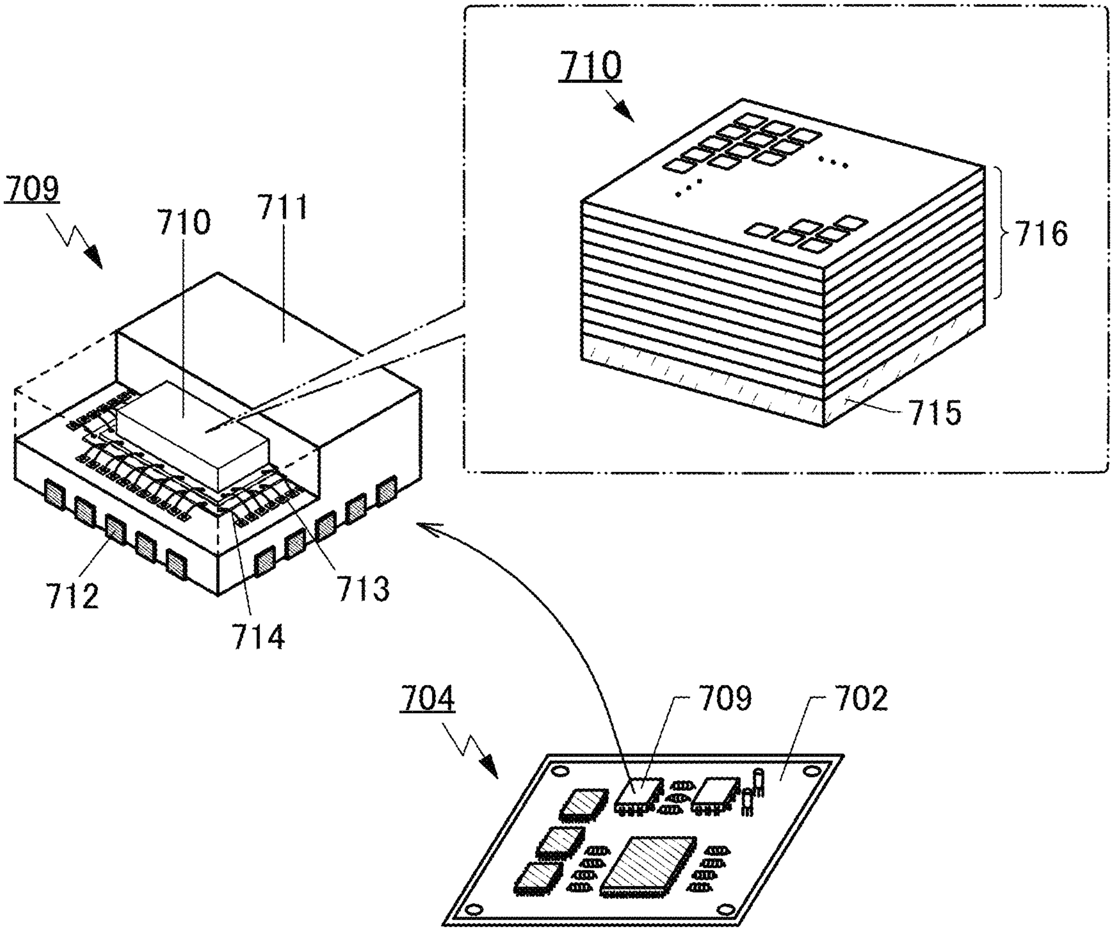
FIG. 32A and FIG. 32B are diagrams illustrating examples of electronic components.

FIG. 32A is a perspective view of a substrate (a circuit board 704) on which an electronic component 709 is mounted. The electronic component 709 illustrated in FIG. 32A includes a semiconductor device 710 in a mold 711. Some components are omitted in FIG. 32A to show the inside of the electronic component 709. The electronic component 709 includes a land 712 outside the mold 711. The land 712 is connected to an electrode pad 713, and the electrode pad 713 is connected to the semiconductor device 710 through a wire 714. The electronic component 709 is mounted on a printed circuit board 702, for example. A plurality of such electronic components are combined and connected to each other on the printed circuit board 702, which forms the circuit board 704.

The semiconductor device 710 includes a driver circuit layer 715 and a memory layer 716. The memory layer 716 has a structure in which a plurality of memory cell arrays are stacked. A stacked-layer structure of the driver circuit layer 715 and the memory layer 716 can be a monolithic stacked-layer structure. In the monolithic stacked-layer structure, layers can be connected without using a through electrode technique such as a TSV (Through Silicon Via) and a bonding technique such as Cu—Cu direct bonding. The monolithic stacked-layer structure of the driver circuit layer 715 and the memory layer 716 enables, for example, what is called an on-chip memory structure in which a memory is directly formed on a processor. The on-chip memory structure allows an interface portion between the processor and the memory to operate at high speed.

With the on-chip memory structure, the sizes of a connection wiring and the like can be smaller than those in the case where the through electrode technique such as TSV is employed; thus, the number of connection pins can be increased. An increase in the number of connection pins enables parallel operations, which can increase the bandwidth of the memory (also referred to as a memory bandwidth).

It is preferable that the plurality of memory cell arrays included in the memory layer 716 be formed using OS transistors and be monolithically stacked. The monolithic stacked-layer structure of a plurality of memory cell arrays can improve one or both of the bandwidth of the memory and the access latency of the memory. Note that a bandwidth refers to a data transfer volume per unit time, and access latency refers to time from access to start of data transmission. In the case where the memory layer 716 is formed using Si transistors, it is difficult to obtain the monolithic stacked-layer structure as compared with the case where the memory layer 716 is formed using OS transistors. Thus, an OS transistor is superior to a Si transistor in the monolithic stacked-layer structure.

The semiconductor device 710 may be referred to as a die. In this specification and the like, a die refers to each of chip pieces obtained by dividing a circuit pattern formed on a circular substrate (also referred to as a wafer) or the like into dice in the manufacturing process of a semiconductor chip, for example. Note that examples of semiconductor materials that can be used for the die include silicon (Si), silicon carbide (SiC), and gallium nitride (GaN). A die obtained from a silicon substrate (also referred to as a silicon wafer) may be referred to as a silicon die, for example.

Figure 32B:
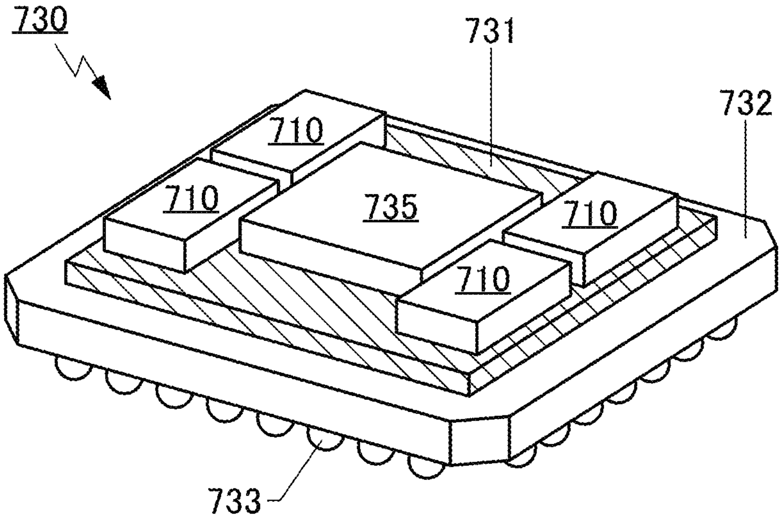

FIG. 32B is a perspective view of an electronic component 730. The electronic component 730 is an example of a SiP (System in Package) or an MCM (Multi Chip Module).

In the electronic component 730, an interposer 731 is provided over a package substrate 732 (printed circuit board), and a semiconductor device 735 and a plurality of the semiconductor devices 710 are provided over the interposer 731.

The electronic component 730 that includes the semiconductor device 710 as a high bandwidth memory (HBM) is illustrated as an example. The semiconductor device 735 can be used for an integrated circuit such as a CPU (Central Processing Unit), a GPU (Graphics Processing Unit), or an FPGA (Field Programmable Gate Array).

As the package substrate 732, a ceramic substrate, a plastic substrate, or a glass epoxy substrate can be used, for example. As the interposer 731, a silicon interposer or a resin interposer can be used, for example.

The interposer 731 includes a plurality of wirings and has a function of connecting a plurality of integrated circuits with different terminal pitches. The plurality of wirings are provided in a single layer or multiple layers. The interposer 731 has a function of connecting an integrated circuit provided on the interposer 731 to an electrode provided on the package substrate 732. Accordingly, the interposer is sometimes referred to as a "redistribution substrate" or an "intermediate substrate." In some cases, a through electrode is provided in the interposer 731, and the through electrode is used to connect an integrated circuit and the package substrate 732. Moreover, in the case of using a silicon interposer, a TSV can also be used as the through electrode.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, and the like each using a silicon interposer, a decrease in reliability due to a difference in expansion coefficient between an integrated circuit and the interposer is less likely to occur. Furthermore, a surface of a silicon interposer has high planarity; thus, poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

Meanwhile, in the case where a plurality of integrated circuits with different terminal pitches are connected using a silicon interposer, a TSV, and the like, a space for the width of the terminal pitch and the like is needed. Thus, in the case where the size of the electronic component 730 is to be reduced, the width of the terminal pitches causes a problem, which sometimes makes it difficult to provide a large number of wirings for a wide memory bandwidth. For this reason, the above-described monolithic stacked-layer structure using OS transistors is suitable. A composite structure combining memory cell arrays stacked using TSV and monolithically stacked memory cell arrays may be employed.

In addition, a heat sink (radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the semiconductor devices 710 and the semiconductor device 735 are preferably equal to each other.

To mount the electronic component 730 on another substrate, an electrode 733 may be provided on a bottom portion of the package substrate 732. FIG. 32B illustrates an example in which the electrode 733 is formed of a solder ball. Solder balls are provided in a matrix on the bottom portion of the package substrate 732, so that BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by any of various mounting methods not limited to BGA and PGA. Examples of a mounting method include an SPGA (Staggered Pin Grid Array), an LGA (Land Grid Array), a QFP (Quad Flat Package), a QFJ (Quad Flat J-leaded package), and a QFN (Quad Flat Non-leaded package).

[Electronic Device]

Figure 33A:
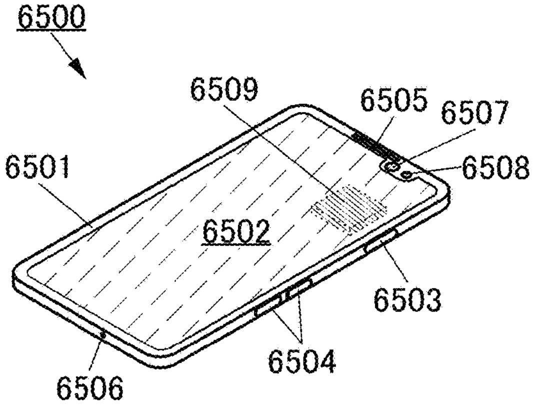
FIG. 33A and FIG. 33B are diagrams illustrating examples of electronic devices.

FIG. 33A is a perspective view of an electronic device 6500. The electronic device 6500 illustrated in FIG. 33A is a portable information terminal that can be used as a smartphone. The electronic device 6500 includes a housing 6501, a display portion 6502, a power button 6503, buttons 6504, a speaker 6505, a microphone 6506, a camera 6507, a light source 6508, a control device 6509, and the like. Note that the control device 6509 includes one or more selected from a CPU, a GPU, and a memory device, for example. The semiconductor device of one embodiment of the present invention can be used for the display portion 6502, the control device 6509, and the like.

Figure 33B:
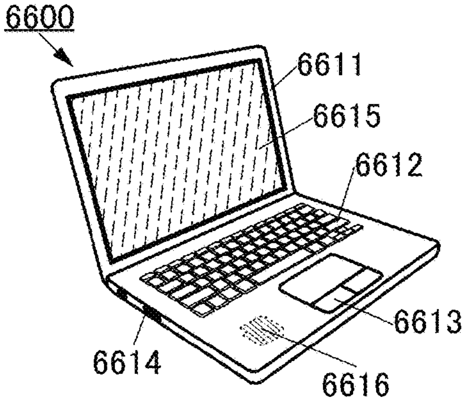

An electronic device 6600 illustrated in FIG. 33B is an information terminal that can be used as a notebook personal computer. The electronic device 6600 includes a housing 6611, a keyboard 6612, a pointing device 6613, an external connection port 6614, a display portion 6615, a control device 6616, and the like. Note that the control device 6616 includes one or more selected from a CPU, a GPU, and a memory device, for example. The semiconductor device of one embodiment of the present invention can be used for the display portion 6615, the control device 6616, and the like. Note that the semiconductor device of one embodiment of the present invention is suitably used for the control device 6509 and the control device 6616, in which case power consumption can be reduced.

[Large Computer]

Figure 33C:
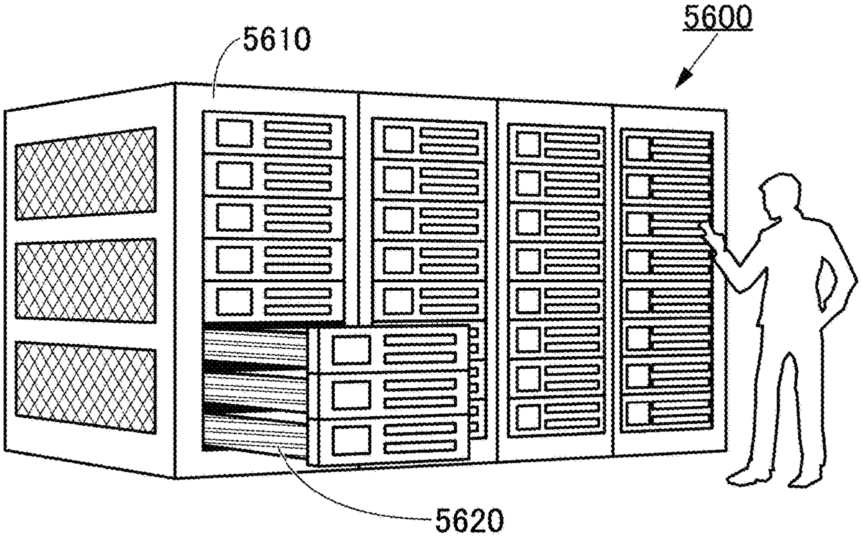
FIG. 33C to FIG. 33E are diagrams illustrating an example of a large computer.

FIG. 33C is a perspective view of a large computer 5600. In the large computer 5600 illustrated in FIG. 33C, a plurality of rack mount computers 5620 are stored in a rack 5610. Note that the large computer 5600 may be referred to as a supercomputer.

Figure 33D:
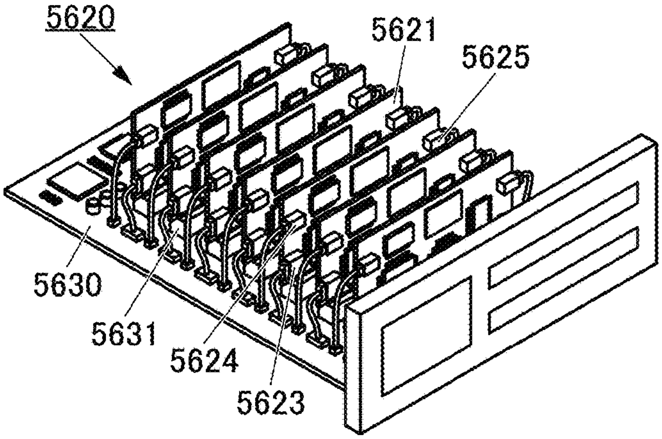

The computer 5620 can have a structure in a perspective view illustrated in FIG. 33D, for example. In FIG. 33D, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 33E:
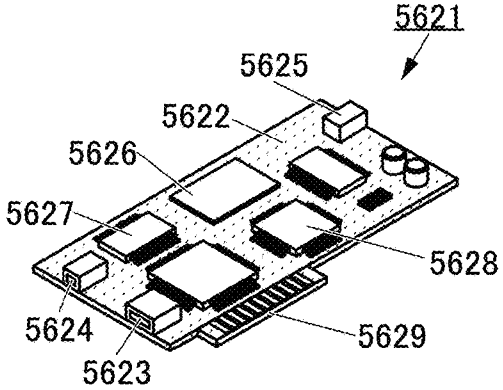

The PC card 5621 illustrated in FIG. 33E is an example of a processing board provided with a CPU, a GPU, a memory device, and the like. The PC card 5621 includes a board 5622. The board 5622 includes the connection terminal 5623, the connection terminal 5624, the connection terminal 5625, a semiconductor device 5626, a semiconductor device 5627, a semiconductor device 5628, and a connection terminal 5629. FIG. 33E also illustrates semiconductor devices other than the semiconductor device 5626, the semiconductor device 5627, and the semiconductor device 5628; the following description of the semiconductor device 5626, the semiconductor device 5627, and the semiconductor device 5628 can be referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminal 5623, the connection terminal 5624, and the connection terminal 5625 can serve as, for example, an interface for performing power supply, signal input, or the like to the PC card 5621. For another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), and SCSI (Small Computer System Interface). In the case where video signals are output from the connection terminal 5623, the connection terminal 5624, and the connection terminal 5625, an example of the standard therefor is HDMI (registered trademark).

The semiconductor device 5626 includes a terminal (not illustrated) for inputting and outputting signals, and when the terminal is inserted in a socket (not illustrated) of the board 5622, the semiconductor device 5626 and the board 5622 can be connected to each other.

The semiconductor device 5627 includes a plurality of terminals, and when the terminals are reflow-soldered, for example, to wirings of the board 5622, the semiconductor device 5627 and the board 5622 can be connected to each other. Examples of the semiconductor device 5627 include an FPGA, a GPU, and a CPU. As the semiconductor device 5627, the electronic component 730 can be used, for example.

The semiconductor device 5628 includes a plurality of terminals, and when the terminals are reflow-soldered, for example, to wirings of the board 5622, the semiconductor device 5628 and the board 5622 can be connected to each other. An example of the semiconductor device 5628 is a memory device. As the semiconductor device 5628, the electronic component 709 can be used, for example.

The large computer 5600 can also function as a parallel computer. When the large computer 5600 is used as a parallel computer, large-scale computation necessary for artificial intelligence learning and inference can be performed, for example.

[Space Equipment]

The semiconductor device of one embodiment of the present invention can be suitably used for space equipment such as equipment that processes and stores information.

The semiconductor device of one embodiment of the present invention can include an OS transistor. A change in electrical characteristics of the OS transistor due to exposure to radiation is small. That is, the OS transistor is highly resistant to radiation and thus can be suitably used in an environment where radiation can enter. For example, the OS transistor can be suitably used in outer space.

Figure 34:
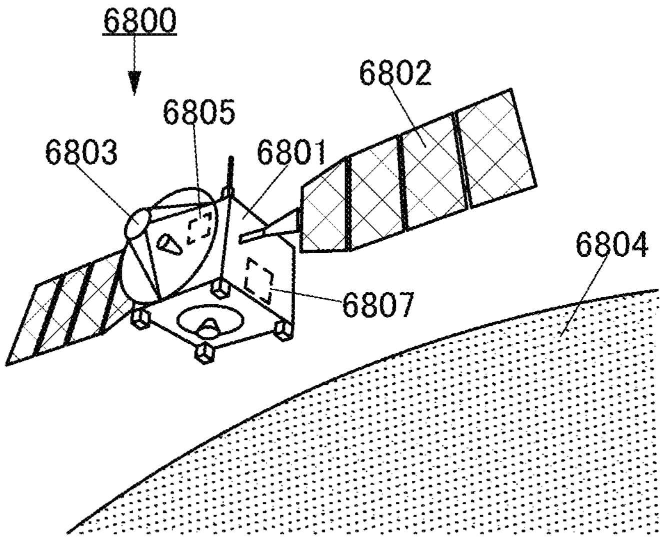
FIG. 34 is a diagram illustrating an example of space equipment.

FIG. 34 illustrates an artificial satellite 6800 as an example of space equipment. The artificial satellite 6800 includes a body 6801, a solar panel 6802, an antenna 6803, a secondary battery 6805, and a control device 6807. Note that in FIG. 34, a planet 6804 in outer space is illustrated as an example. Note that outer space refers to, for example, space at an altitude greater than or equal to 100 km, and outer space in this specification may also include the thermosphere, mesosphere, and stratosphere.

Although not illustrated in FIG. 34, the secondary battery 6805 may be provided with a battery management system (also referred to as a BMS) or a battery control circuit. An OS transistor is suitably used in the battery management system or the battery control circuit because low power consumption and high reliability even in outer space are achieved.

The amount of radiation in outer space is 100 or more times that on the ground. Examples of radiation include electromagnetic waves (electromagnetic radiation) typified by X-rays and gamma rays and particle radiation typified by alpha rays, beta rays, neutron beams, proton beams, heavy-ion beams, and meson beams.

When the solar panel 6802 is irradiated with sunlight, electric power required for operation of the artificial satellite 6800 is generated. However, for example, in a situation where the solar panel is not irradiated with sunlight or in a situation where the amount of sunlight with which the solar panel is irradiated is small, the amount of generated electric power is small. Accordingly, electric power required for operation of the artificial satellite 6800 might not be generated. In order to operate the artificial satellite 6800 even with a small amount of generated electric power, the artificial satellite 6800 is preferably provided with the secondary battery 6805. Note that a solar panel is referred to as a solar cell module in some cases.

The artificial satellite 6800 can generate a signal. The signal is transmitted through the antenna 6803, and the signal can be received by a ground-based receiver or another artificial satellite, for example. When the signal transmitted by the artificial satellite 6800 is received, the position of a receiver that receives the signal can be measured. Thus, the artificial satellite 6800 can constitute a satellite positioning system.

The control device 6807 has a function of controlling the artificial satellite 6800. The control device 6807 is formed using one or more selected from a CPU, a GPU, and a memory device, for example. Note that the semiconductor device of one embodiment of the present invention is suitably used for the control device 6807. A change in electrical characteristics due to exposure to radiation is smaller in an OS transistor than in a Si transistor. That is, the OS transistor has high reliability and thus can be suitably used even in an environment where radiation can enter.

The artificial satellite 6800 can include a sensor. For example, with a structure including a visible light sensor, the artificial satellite 6800 can have a function of sensing sunlight reflected by a ground-based object. Alternatively, with a structure including a thermal infrared sensor, the artificial satellite 6800 can have a function of detecting thermal infrared rays emitted from the surface of the earth. Thus, the artificial satellite 6800 can function as an earth observing satellite, for example.

Although the artificial satellite is described as an example of space equipment in this embodiment, one embodiment of the present invention is not limited thereto. The semiconductor device of one embodiment of the present invention can be suitably used for space equipment such as a spacecraft, a space capsule, or a space probe, for example.

As described above, the OS transistor has excellent effects of achieving wide memory bandwidth and being highly resistant to radiation as compared with the Si transistor.

[Data Center]

The semiconductor device of one embodiment of the present invention can be suitably used for a storage system in a data center, for example. Long-term management of data, such as guarantee of data immutability, is required for the data center. The long-term management of data needs an increase in building size for, for example, setting a storage and a server for storing an enormous amount of data, ensuring stable power supply for data retention, and ensuring cooling equipment for data retention.

With the use of the semiconductor device of one embodiment of the present invention for the storage system used in the data center, electric power required for data retention can be reduced and a semiconductor device retaining data can be downsized. Thus, downsizing of the storage system, downsizing of the power supply for data retention, downscaling of the cooling equipment, and the like can be achieved. This can reduce the space of the data center.

Since the semiconductor device of one embodiment of the present invention has low power consumption, heat generation from a circuit can be reduced. Accordingly, it is possible to reduce adverse effects of the heat generation on the circuit itself, a peripheral circuit, and a module. Furthermore, the use of the semiconductor device of one embodiment of the present invention enables a data center that operates stably even in a high-temperature environment. Thus, the reliability of the data center can be increased.

Figure 35:
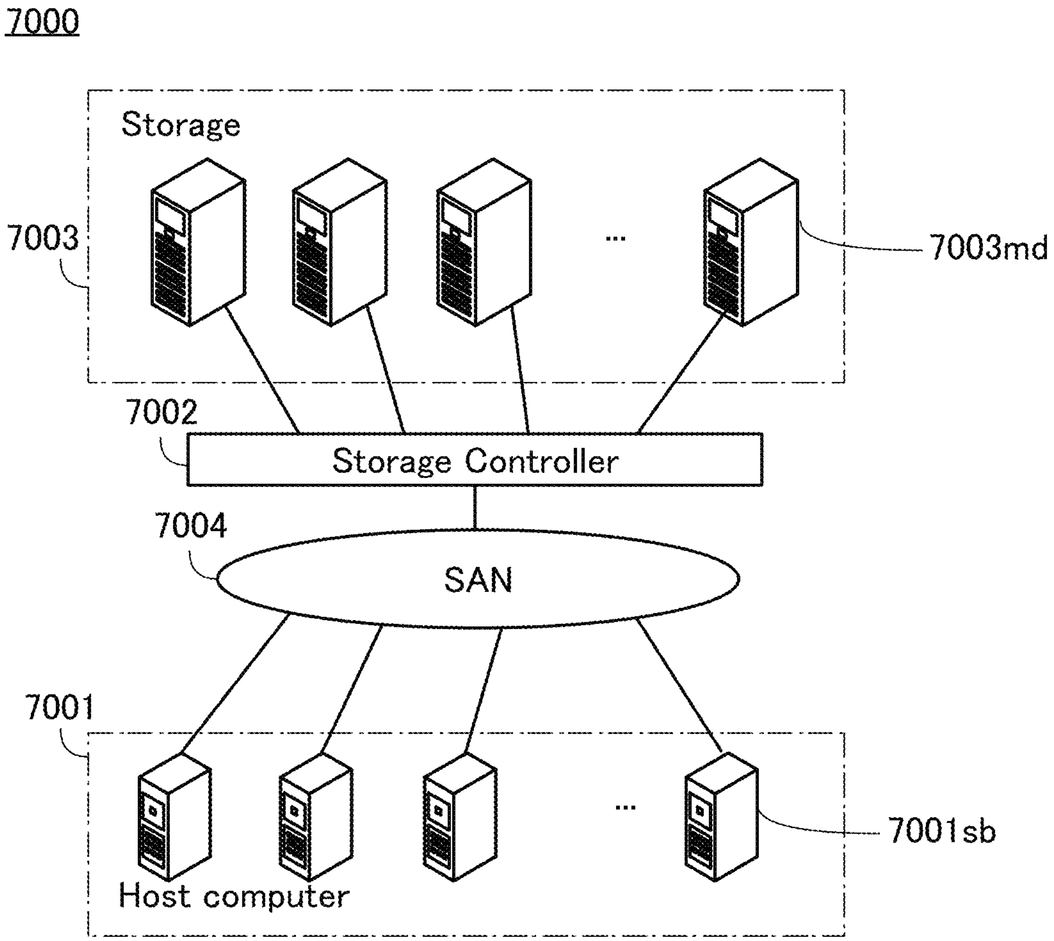
FIG. 35 is a diagram illustrating an example of a storage system applicable to a data center.

FIG. 35 illustrates a storage system that can be used in a data center. A storage system 7000 illustrated in FIG. 35 includes a plurality of servers 7001*sb* as a host 7001 (indicated as "Host Computer" in the diagram). The storage system 7000 includes a plurality of memory devices 7003*md* as a storage 7003 (indicated as "Storage" in the diagram). In the illustrated example, the host 7001 and the storage 7003 are connected through a storage area network 7004 (indicated as "SAN" in the diagram) and a storage control circuit 7002 (indicated as "Storage Controller" in the diagram).

The host 7001 corresponds to a computer that accesses data stored in the storage 7003. The host 7001 may be connected to another host 7001 through a network.

The data access speed, i.e., the time taken for storing and outputting data, of the storage 7003 is shortened by using a flash memory, but is considerably longer than the data access speed of a DRAM that can be used as a cache memory in the storage. In the storage system, in order to solve the problem of low access speed of the storage 7003, a cache memory is normally provided in the storage to shorten the time for data storage and output.

The cache memories are used in the storage control circuit 7002 and the storage 7003. Data transmitted between the host 7001 and the storage 7003 are stored in the cache memories in the storage control circuit 7002 and the storage 7003 and then output to the host 7001 or the storage 7003.

The use of an OS transistor as a transistor for storing data in the cache memory to retain a potential based on data can reduce the frequency of refreshing, so that power consumption can be reduced. Furthermore, downsizing is possible by stacking memory cell arrays.

Note that the use of the semiconductor device of one embodiment of the present invention for one or more selected from an electronic component, an electronic device, a large computer, space equipment, and a data center is expected to produce an effect of reducing power consumption. While the demand for energy is expected to increase with higher performance or higher integration of semiconductor devices, the emission amount of greenhouse effect gases typified by carbon dioxide ($CO_2$) can be reduced with the use of the semiconductor device of one embodiment of the present invention. The semiconductor device of one embodiment of the present invention can be effectively used as one of the global warming countermeasures because of its low power consumption.

The configuration, structure, method, and the like described in this embodiment can be used in combination as appropriate with the configurations, structures, methods, and the like described in the other embodiments and the like.

<Supplementary Notes on Description in this Specification and the Like>

The following are notes on the description of the above embodiments and the structures in the embodiments.

One embodiment of the present invention can be constituted by combining, as appropriate, the structure described in each embodiment with the structures described in the other embodiments. In the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In this specification and the like, components are classified on the basis of the functions, and shown as blocks independent of one another in block diagrams. However, in an actual circuit or the like, it is difficult to separate components on the basis of the functions, and there is such a case where one circuit is associated with a plurality of functions or a case where a plurality of circuits are associated with one function. Therefore, blocks in the block diagrams are not limited by the components described in this specification, and the description can be changed appropriately depending on the situation.

In the drawings, the size, the layer thickness, or the region is shown with given magnitude for description convenience. Therefore, they are not limited to the illustrated scale. Note that the drawings are schematically shown for clarity, and embodiments of the present invention are not limited to shapes, values or the like shown in the drawings. For example, variations in signal, voltage, or current due to noise, variations in signal, voltage, or current due to difference in timing, or the like can be included.

In this specification and the like, expressions "one of a source and a drain" (or a first electrode or a first terminal) and "the other of the source and the drain" (or a second electrode or a second terminal) are used in the description of the connection relation of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In this specification and the like, the term "electrode" or "wiring" does not limit the function of the component. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, "voltage" and "potential" can be interchanged with each other as appropriate. Voltage refers to a potential difference from a reference potential, and when the reference potential is a ground voltage, for example, voltage can be replaced with potential. The ground potential does not necessarily mean 0 V. Note that potentials are relative values, and a potential applied to a wiring or the like is sometimes changed depending on the reference potential.

Note that in this specification and the like, the terms such as "film" and "layer" can be interchanged with each other depending on the case or according to circumstances. For example, the term "conductive layer" can be replaced with the term "conductive film" in some cases. As another example, the term "insulating film" can be replaced with the term "insulating layer" in some cases.

In this specification and the like, a switch has a function of controlling whether current flows or not by being in a conducting state (on state) or a non-conducting state (off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap each other or a region where a channel is formed.

In this specification and the like, a node can be referred to as a terminal, a wiring, an electrode, a conductive layer, a conductor, an impurity region, or the like depending on a circuit structure, a device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electrical signal transmission between A and B in the case where an object (which refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when represented by an equivalent circuit.

Example

In this example, a semiconductor device in which a plurality of layers including OS transistors were provided to overlap with each other was fabricated. After that, cross-sectional observation was performed on the semiconductor device. In addition, simulation of writing operation and reading operation based on a designed semiconductor device was performed.

<Structure of Fabricated Semiconductor Device>

Figure 36:
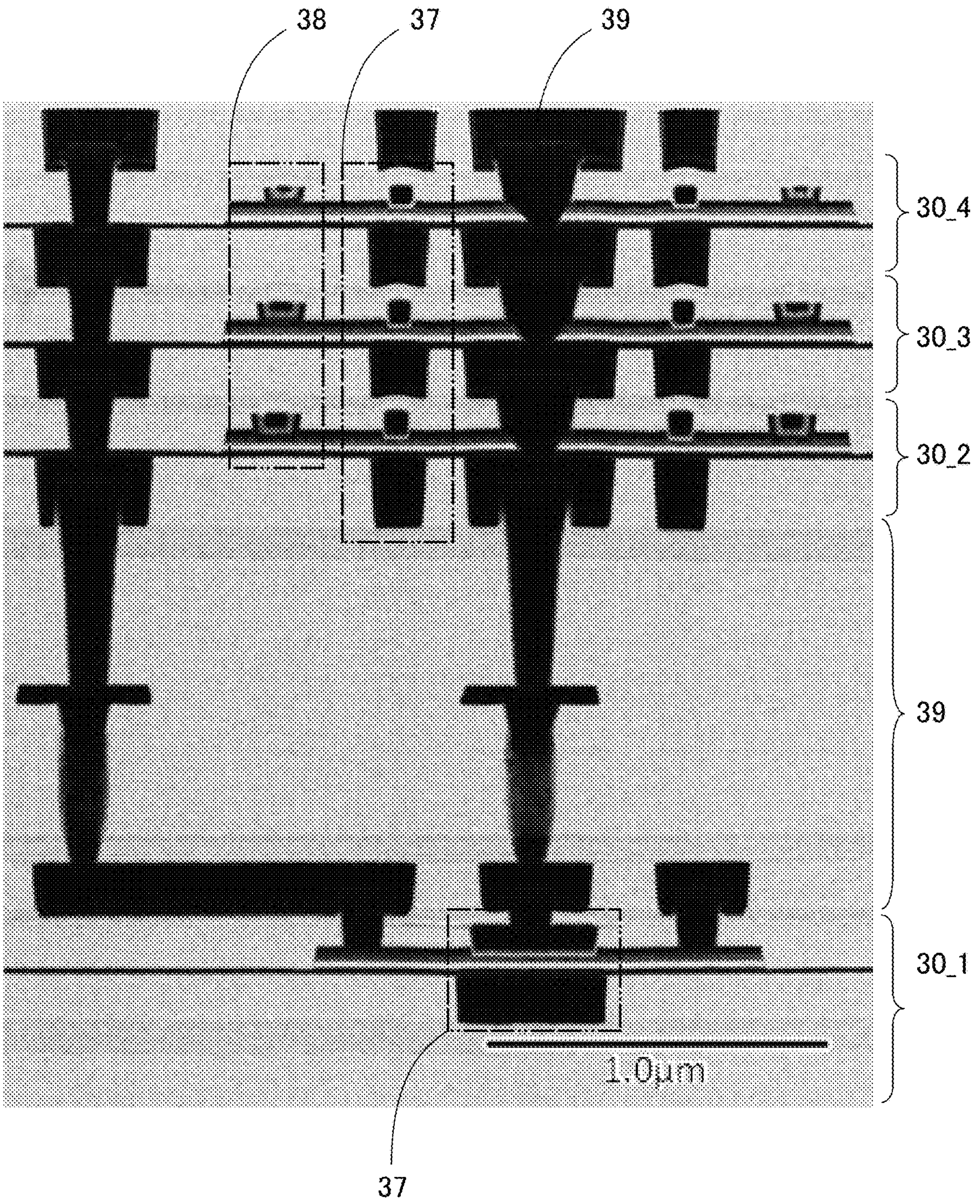
FIG. 36 is an image showing a cross-sectional structure of a semiconductor device.

In the fabricated semiconductor device, four element layers including OS transistors were stacked, and an intermediate layer (wiring layer) was provided between the first element layer and the second element layer. FIG. 36 shows results of cross-sectional STEM (Scanning Transmission Electron Microscope) observation of the semiconductor device.

Cross sections of the fabricated OS transistors (transistors 37) were observed in the element layers 30_1 to 30_4 shown in FIG. 36. Cross sections of the capacitors 38 were observed in the element layers 30_2 to 30_4 shown in FIG. 36. A cross section where the OS transistors (transistors 37) and the capacitors 38 are monolithically stacked using the electrodes 39 functioning as wirings was observed in the element layers 30_1 to 30_4 and the intermediate layer between the element layers 30_1 and 30_2.

<Results of Comparing OS Memory Formed Using Stacked OS Transistors with DRAM and SRAM>

Results of comparing an OS memory including OS transistors formed in stacked element layers with a DRAM including Si transistors will be described. Table 1 shows the results of comparing the write time, read time, density, and retention of a DOSRAM, which is an OS memory, and a DRAM including Si transistors.

TABLE 1

| | DOSRAM (20-nm design rule) | | |
|---|---|---|---|
| | Initial | Temperature correction | DRAM (14-nm design rule) |
| Write time | 6 to 7 ns | 6 ns | ~20 ns |
| Read time | 23 to 44 ns | 22 ns | |
| Density | 181 cells/μm$^2$ (per layer) | | 383 cells/μm$^2$ |
| Retention | Refresh every 6.4 s or more frequently | | Refresh data in all memory cells every 64 ms |

For the DOSRAM including OS transistors, a state without temperature correction (initial state) and a state with temperature correction are separately shown as in Table 1. The temperature correction in the DOSRAM can be performed by control of the back gate voltage of the OS transistor, which is described in Embodiment 1 or the like. The DOSRAM was estimated to include OS transistors fabricated with the 20-nm design rule and have the structure illustrated in FIG. 25 (the structure in which four element layers including OS transistors are stacked over the element layer including Si transistors). In the DOSRAM, a cell capacitance of 1.5 fF was estimated. As shown in Table 1, for the DRAM including Si transistors, the Si transistors were estimated to follow the 14-nm design rule.

The results showed that, while the DRAM had a write time and a read time of 20 ns as shown in Table 1, the DOSRAM had a shorter write period and the temperature correction made the read time of the DOSRAM substantially comparable to that of the DRAM. In other words, the DOSRAM subjected to the temperature correction demonstrated a possibility of having performance equivalent to or higher than that of the DRAM.

Regarding "Density" for comparing the memory density, in comparison with 383 cells/μm$^2$ of the DRAM, the DOSRAM had a density of 181 cells/μm$^2$ per layer, demonstrating that in the case of employing a multilayer structure, a three-layer structure would achieve 540 cells/μm$^2$ and a 10-layer structure would achieve a density exceeding 5000 cells/μm$^2$. As a result, the DOSRAM demonstrated a possibility of exceeding the performance of the existing DRAM.

Regarding "Retention" for comparing the data retention time, data in all the memory cells is refreshed once every 64 ms in the DRAM, whereas refreshing once every 6.4 s or more frequently is estimated in the DOSRAM. The results demonstrated a possibility that power for refreshing in the DOSRAM can be 1/100 of that in the DRAM.

Table 2 shows comparison results of the write time, read time, density, and retention of a NOSRAM, which is another example of an OS memory including OS transistors formed in stacked element layers, and an SRAM including Si transistors.

TABLE 2

| | NOSRAM (20-nm design rule) | | SRAM |
|---|---|---|---|
| | Initial | Temperature correction | (5-nm design rule) |
| Write time | 10 to 17 ns | 11 ns | 1 ns or shorter (L1 cache) |
| Read time | 17 to 23 ns | 12 ns | ~10 ns: (Last level cache) |
| Density | 45 cells/μm$^2$ (per layer) | | 47.6 cells/μm$^2$ |
| Retention | 6.4 s or longer | | Data is invariant during power-on |

For the NOSRAM including OS transistors, a state without temperature correction (initial state) and a state with temperature correction are separately shown as in Table 2. The temperature correction in the NOSRAM can be performed by control of the back gate voltage of the OS transistor, which is described in Embodiment 1 or the like. The NOSRAM was estimated to include OS transistors fabricated with the 20-nm design rule and have the structure illustrated in FIG. 29 (the structure in which four element layers including OS transistors are stacked over the element layer including Si transistors). In the NOSRAM, a cell capacitance of 0.4 fF was estimated. As shown in Table 2, for the SRAM including Si transistors, the Si transistors were estimated to follow the 5-nm design rule.

The results showed that, as in Table 2, the write time and read time of the SRAM were 1 ns for the L1 cache and 10 ns for the last level cache (large-capacity on-chip memory), whereas in the NOSRAM, the write time and read time were longer than those of the L1 cache but were made substantially the same as those of the last level cache by temperature correction.

Regarding "Density" for comparing the memory density, in comparison with 47.6 cells/μm$^2$ of the SRAM, the NOSRAM had a density of 45 cells/μm$^2$ per layer, demonstrating that even without a multilayer structure, the density was substantially the same as that of the SRAM. As a result, the NOSRAM demonstrated a possibility of exceeding the performance of the existing SRAM by employing a multilayer structure.

Regarding "Retention" for comparing the data retention time, data is invariant when power is on but data is lost when power is off in the SRAM, whereas refreshing once every 6.4 s or more frequently is estimated in the NOSRAM. The results demonstrated a possibility that power for refreshing in the NOSRAM can be 1/100 of that in the DRAM.

<Results of Simulation Based on OS Transistor Characteristics>

To evaluate the performance of an OS memory that can be used in the fabricated semiconductor device, a semiconductor chip was designed on the basis of the structure of the DOSRAM described in Embodiment 2 and was subjected to simulation.

Figure 37:
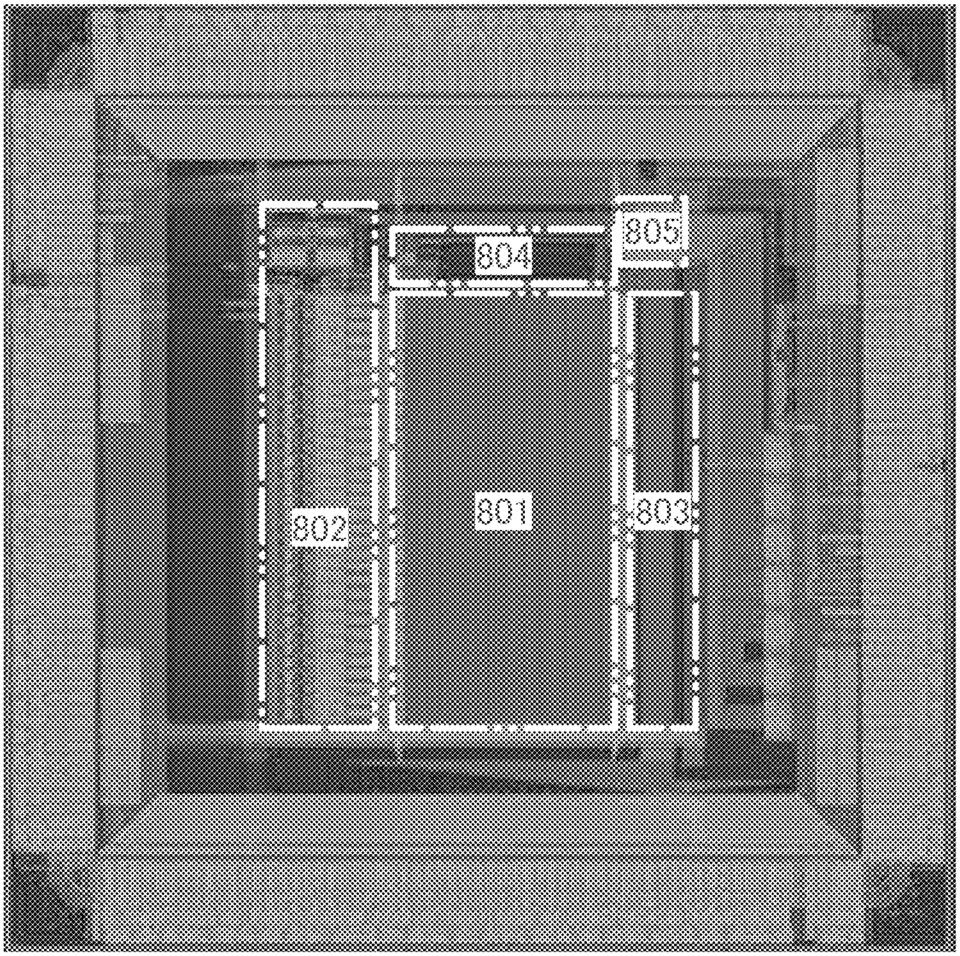
FIG. 37 is an image showing a layout of a semiconductor chip.

FIG. 37 shows a planar layout of the designed semiconductor chip. In the semiconductor chip shown in FIG. 37, OS transistors were designed with the 60-nm rule, Si transistors were designed with the 130-nm rule, and the chip size was 4 mm square.

In FIG. 37, three layers of memory cells, one layer of amplifier circuits, and one layer of a sense amplifier including Si transistors are provided in a region 801. Driver circuits such as a word line driver and an OS circuit driver are provided in a region 802. A sense amplifier including Si transistors is provided in a region 803. A column driver is provided in a region 804. A controller is provided in a region 805.

Figure 38A:
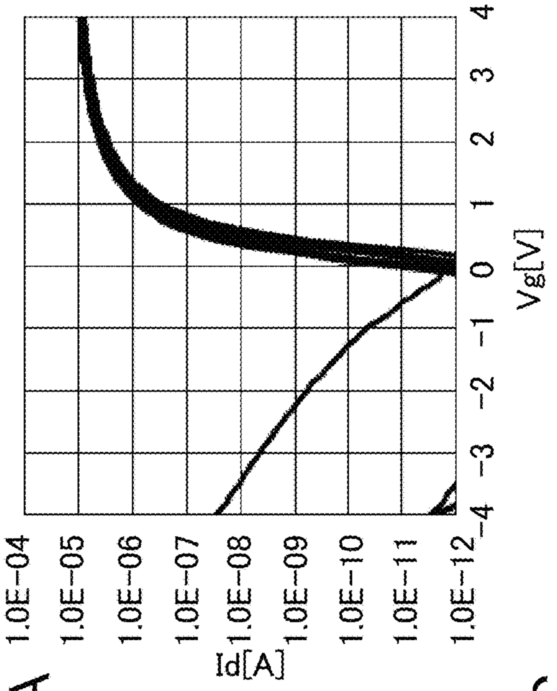
FIG. 38A to FIG. 38D are diagrams for describing operation simulation of a semiconductor chip.
Figure 38B:
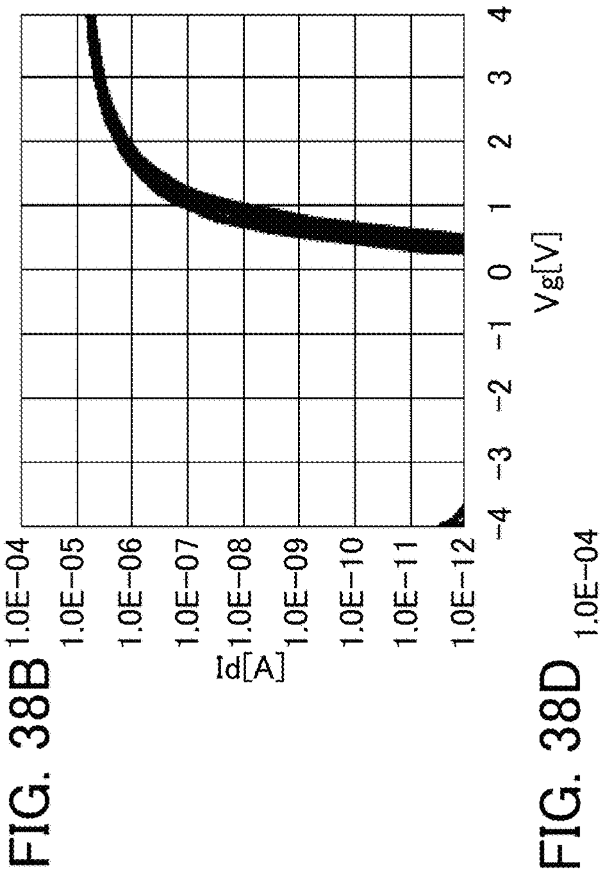
Figure 38C:
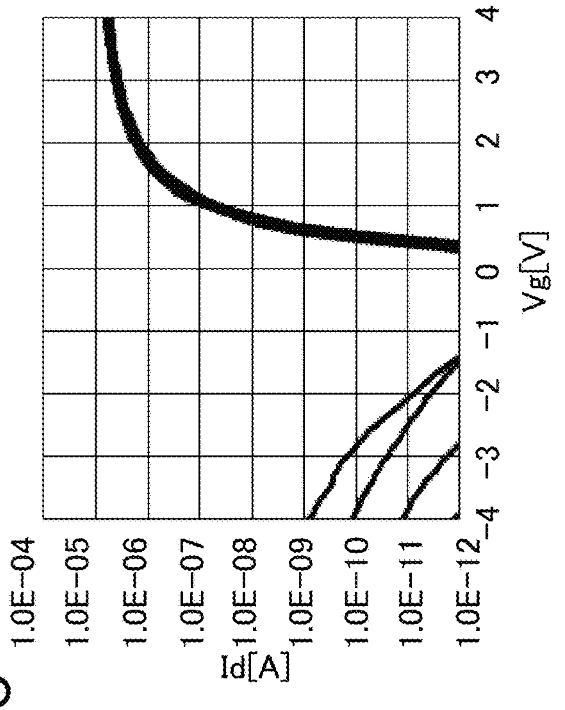
Figure 38D:
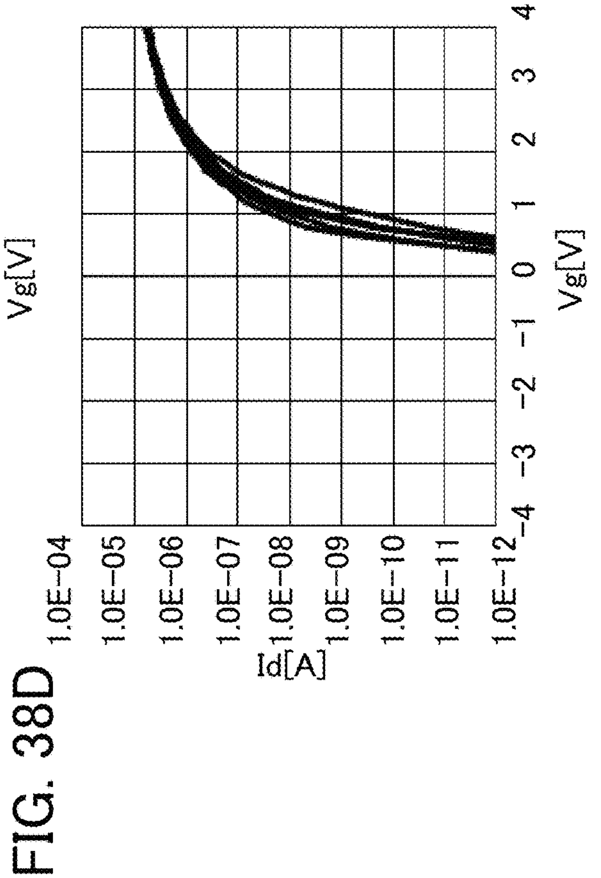

FIG. 38A to FIG. 38D show the $I_d$-$V_g$ characteristics of OS transistors used for the simulation. FIG. 38A shows the $I_d$-$V_g$ characteristics of OS transistors in the element layer that includes OS transistors and is provided with the amplifier circuits (the first layer). FIG. 38B to FIG. 38D show the $I_d$-$V_g$ measurement results of OS transistors included in the element layers that include OS transistors and are provided with the memory cells (the second layer to the fourth layer). Note that the channel length (L) and the channel width (W) of the OS transistors were estimated to be 60 nm and 60 nm, respectively.

In addition, the write time and read time of the DOSRAM memory cells provided in the second layer to the fourth layer were estimated by simulation. Table 3 shows the write time and read time of memories using OS transistors (OSFETs) in the second layer to the fourth layer. Note that the write time and read time in the first layer were not estimated because OS transistors in the first layer were OS transistors of the amplifier circuits.

TABLE 3

| | Write time | Read time |
|---|---|---|
| Memory using OSFET in second layer | 39 ns | 41 ns |
| Memory using OSFET in third layer | 38 ns | 41 ns |
| Memory using OSFET in fourth layer | 40 ns | 45 ns |

As shown in Table 3, both the write time and the read time were favorable in the memories using the stacked OSFETs.

Figure 39A:
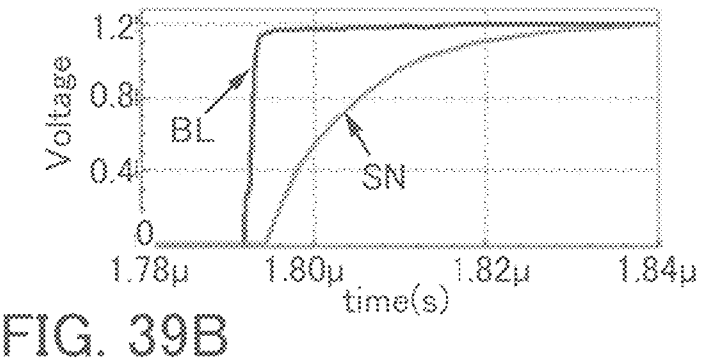
FIG. 39A to FIG. 39D are diagrams illustrating operation simulation of a semiconductor chip.
Figure 39B:
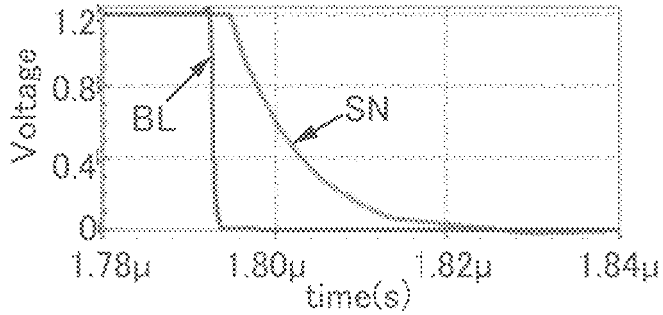

FIG. 39A and FIG. 39B are diagrams showing simulated waveforms of signals of a bit line (BL) and a storage node (SN) (a node to which a capacitor is connected) included in the memory cell in writing operation. FIG. 39A is a diagram showing a change in the voltage of the storage node when the bit line is charged. FIG. 39A is a diagram showing a change in the voltage of the storage node when the bit line is discharged. As shown in FIG. 39A and FIG. 39B, it was demonstrated that the storage node was charged and discharged during charge and discharge of the bit line.

Figure 39C:
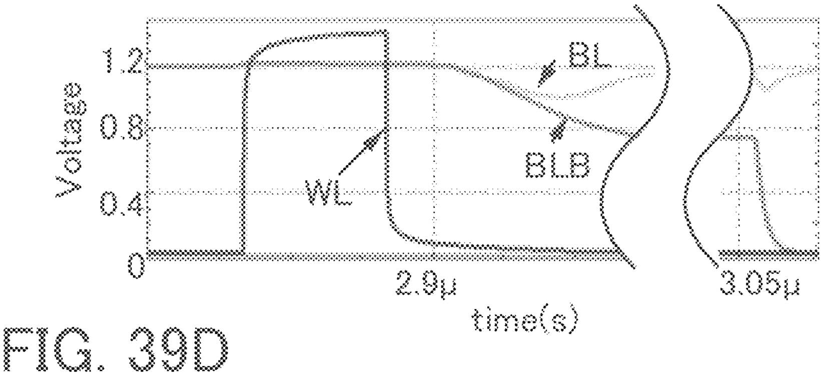
Figure 39D:
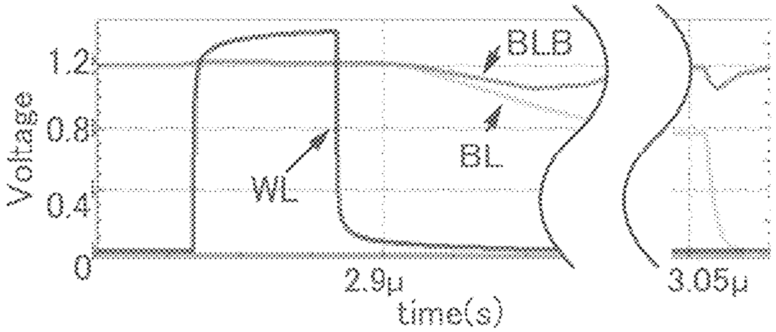

FIG. 39C and FIG. 39D are diagrams showing simulated waveforms of signals of a word line (WL), the bit line (BL), and an inverted bit line (BLB) in reading operation. The bit line (BL) and the inverted bit line (BLB) correspond to the wirings GBL and GBLB in Embodiment 2. FIG. 39C is a diagram showing changes in the voltages of the bit line (BL) and the inverted bit line (BLB) due to charge sharing of charged data retained in the storage node (SN) when the word line is set to H level to turn on the OS transistor. FIG. 39D is a diagram showing changes in the voltages of the bit line (BL) and the inverted bit line (BLB) due to charge sharing of charged inverted data retained in the storage node (SN) when the word line is set to H level to turn on the OS transistor. As shown in FIG. 39C and FIG. 39D, changes in the potentials were observed in the bit line (BL) and the inverted bit line (BLB).

At least part of this example can be implemented in combination with the other embodiments described in this specification as appropriate.

REFERENCE NUMERALS

10: semiconductor device, 15: temperature sensing circuit, 16: voltage generation circuit, 20: element layer, 21: voltage control circuit, 22: peripheral circuit, 23: arithmetic circuit, 30: element layer, 31: memory cell array, 32: memory cell, 37: transistor

The invention claimed is:

1. A semiconductor device comprising:
a first element layer comprising a temperature sensing circuit and a voltage generation circuit;
a second element layer over the first element layer; and
a third element layer over the second element layer,
wherein the second element layer and the third element layer each comprises a memory cell,
wherein the memory cell comprises a transistor in which a semiconductor layer comprising a channel formation region comprises an oxide semiconductor,
wherein the transistor comprises a back gate,
wherein the voltage generation circuit is configured to generate a back gate voltage supplied to the back gate,
wherein the temperature sensing circuit is configured to control the back gate voltage in accordance with a sensed temperature, and
wherein the back gate voltage supplied to the second element layer and the back gate voltage supplied to the third element layer are different from each other.

2. The semiconductor device according to claim 1,
wherein the back gate voltage supplied to the transistor included in the third element layer is higher than the back gate voltage supplied to the transistor included in the second element layer.

3. The semiconductor device according to claim 1,
wherein the first element layer comprises an arithmetic circuit, and
wherein the second element layer and the third element layer overlap with the arithmetic circuit.

4. The semiconductor device according to claim 1,
wherein the oxide semiconductor comprises In, Ga, and Zn.

5. A semiconductor device comprising:
a first element layer;
a second element layer over the first element layer; and
a third element layer over the second element layer,
wherein the second element layer and the third element layer each comprises a temperature sensing circuit, a voltage generation circuit, and a memory cell,
wherein the memory cell comprises a transistor in which a semiconductor layer comprising a channel formation region comprises an oxide semiconductor,
wherein the transistor comprises a back gate,
wherein the voltage generation circuit in the second element layer is configured to generate a back gate voltage supplied to the back gate of the transistor included in the memory cell in the second element layer, and
wherein the temperature sensing circuit is configured to control the back gate voltage in accordance with a sensed temperature.

6. The semiconductor device according to claim 5,
wherein the back gate voltage supplied to the transistor included in the third element layer is higher than the back gate voltage supplied to the transistor included in the second element layer.

7. The semiconductor device according to claim 5,
wherein the first element layer comprises an arithmetic circuit, and
wherein the second element layer and the third element layer overlap with the arithmetic circuit.

8. The semiconductor device according to claim 5,
wherein the oxide semiconductor comprises In, Ga, and Zn.

9. The semiconductor device according to claim 5,
wherein the temperature sensing circuit comprises a transistor in which a semiconductor layer comprising a channel formation region comprises an oxide semiconductor.

10. A semiconductor device comprising:
a first element layer comprising a temperature sensing circuit and a voltage generation circuit;
a second element layer over the first element layer;
a third element layer over the second element layer; and
a fourth element layer over the third element layer,
wherein the second element layer comprises an amplifier circuit,
wherein the third element layer and the fourth element layer each comprises a memory cell,
wherein the amplifier circuit is configured to amplify a signal of the memory cell,
wherein the amplifier circuit and the memory cell each comprise a transistor in which a semiconductor layer comprising a channel formation region comprises an oxide semiconductor,
wherein the transistor comprises a back gate,
wherein the voltage generation circuit is configured to generate a back gate voltage supplied to the back gate,
wherein the temperature sensing circuit is configured to control the back gate voltage in accordance with a sensed temperature, and
wherein the back gate voltage supplied to the third element layer and the back gate voltage supplied to the fourth element layer are different from each other.

11. The semiconductor device according to claim 10,
wherein the back gate voltage supplied to the transistor included in the fourth element layer is higher than the back gate voltage supplied to the transistor included in the third element layer.

12. The semiconductor device according to claim 10,
wherein the oxide semiconductor comprises In, Ga, and Zn.

13. The semiconductor device according to claim 10,
wherein the first element layer comprises an arithmetic circuit comprising a scan flip-flop,
wherein the scan flip-flop is electrically connected to a backup circuit configured to retain data of the scan flip-flop, and
wherein the backup circuit in the second element layer overlaps with the scan flip-flop.

* * * * *